(12) United States Patent
Manabe et al.

(10) Patent No.: US 6,546,543 B1
(45) Date of Patent: Apr. 8, 2003

(54) METHOD OF DISPLAYING, INSPECTING AND MODIFYING PATTERN FOR EXPOSURE

(75) Inventors: Yasuo Manabe, Kawasaki (JP); Hiromi Hoshino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/392,725

(22) Filed: Sep. 9, 1999

(30) Foreign Application Priority Data

Sep. 11, 1998 (JP) .......................................... 10-258976

(51) Int. Cl.⁷ .............................................. G06F 17/50
(52) U.S. Cl. ....................................................... 716/21
(58) Field of Search ........................................... 716/21

(56) References Cited

U.S. PATENT DOCUMENTS

| | | | | |
|---|---|---|---|---|
| 5,347,592 A | * | 9/1994 | Yasuda et al. .............. | 382/144 |
| 5,364,718 A | * | 11/1994 | Oae et al. .................... | 430/5 |
| 5,376,802 A | * | 12/1994 | Sakamoto et al. ..... | 250/492.23 |
| 5,393,988 A | * | 2/1995 | Sakamoto ............... | 250/492.22 |
| 5,905,267 A | * | 5/1999 | Muraki ................... | 250/492.22 |
| 5,917,579 A | * | 6/1999 | Miyajima ..................... | 355/53 |
| 6,042,257 A | * | 3/2000 | Tsudaka ...................... | 700/121 |
| 6,121,625 A | * | 9/2000 | Ito et al. .................. | 250/492.22 |
| 6,214,498 B1 | * | 4/2001 | Choi ............................ | 430/5 |
| 6,316,289 B1 | * | 11/2001 | Chung ........................ | 438/118 |

* cited by examiner

*Primary Examiner*—Matthew Smith
*Assistant Examiner*—Andrea Liu
(74) *Attorney, Agent, or Firm*—Staas & Halsely LLP

(57) ABSTRACT

According to a menu item selected in step S12 (a pressed command button), for a wafer exposing pattern, program goes to steps S13 and S14, and further, display in step S15, inspection in step S16 or modification in step 17 is performed; for a block pattern on a stencil mask, program goes to steps 13 and 24, and further display in step S25, inspection in step S26 or modification in step S27 is performed. In step S16 exposure simulation is performed, in step S15 a result thereof is displayed and in step S17 wafer exposing pattern data are modified based on the result. When a block pattern on a stencil mask is modified, the instances of the block pattern in the wafer exposing pattern data is simultaneously modified as well.

22 Claims, 56 Drawing Sheets

FIG.6

| | |
|---|---|
| VARIABLE-SHAPED SHOTS /BLOCK | EXPOSURE / SHAPE CODE |
| ORIGIN COORDINATE XS | |
| ORIGIN COORDINATE YS | |
| PAT WIDTH W(BPC) | |
| PAT LENGTH H(0) | |
| PAT LOWER LEFT CORNER VERTEX COORDINATE XL | |
| PAT LOWER LEFT CORNER VERTEX COORDINATE YL | |
| PAT UPPER RIGHT CORNER VERTEX COORDINATE XR | |
| PAT UPPER RIGHT CORNER VERTEX COORDINATE YR | |
| RIGHT SIDE CONTACT PAT NUMBER NR | |
| LEFT SIDE CONTACT NUMBER NL | |
| UPPER SIDE CONTACT NUMBER NU | |
| LOWER SIDE CONTACT NUMBER ND | |
| RIGHT SIDE CONTACT PAT ADDRESS AR1 | |
| LEFT SIDE CONTACT PAT ADDRESS AL1 | |
| UPPER SIDE CONTACT PAT ADDRESS AU1 | |
| LOWER SIDE CONTACT PAT ADDRESS AD1 | |

- BASIC PART
- FIRST EXTENDED PART
- SECOND EXTENDED PART

AL1 → PAL1/AL2 → AL2 → PAL2/0

AD1 → PAD1/0

CG — CALCULATION GRID

| PAT DATA NO. | PAT SIZE PRECISION | KIND | SHAPE | ORIGIN X | ORIGIN Y | WIDTH | LENGTH |
|---|---|---|---|---|---|---|---|
| 1 | +0.20 | VARIABLE RECTANGLE | 1 | -5000 | -5000 | 100 | 10000 |
| 2 | +0.15 | BLOCK | 1 | -5000 | -5000 | 100 | 100 |

PATTERN DATA INFORMATION

| PATTERN DATA INFORMATION | | | | | | | |
|---|---|---|---|---|---|---|---|
| PAT DATA NO. | PAT SIZE PRECISION | KIND | SHAPE | ORIGIN X | ORIGIN Y | WIDTH | LENGTH |
| 1 | +0.10 | VARIABLE RECTANGLE | 1 | -5000 | -5000 | 100 | 10000 |
| 2 | +0.10 | BLOCK | 1 | -5000 | -5000 | 100 | 100 |

FIG.36

| 42.6 | 47.5 | 37.9 | 34.6 | 36.3 | 38.5 | 38.1 | 38.1 | 38.1 | 38.7 |
|---|---|---|---|---|---|---|---|---|---|
| 40.8 | 46.8 | 35.7 | 35.3 | 34.7 | 39.8 | 39.4 | 39.4 | 39.4 | 40.0 |
| 40.6 | 46.6 | 36.1 | 33.7 | 36.7 | 39.9 | 39.5 | 39.5 | 39.5 | 40.2 |
| 41.9 | 47.5 | 36.7 | 33.9 | 36.5 | 38.9 | 38.4 | 38.4 | 38.4 | 39.0 |
| 40.6 | 47.0 | 35.8 | 35.6 | 35.1 | 38.4 | 38.0 | 38.0 | 38.0 | 38.7 |
| 36.5 | 42.8 | 33.0 | 29.5 | 36.6 | 39.8 | 39.5 | 39.5 | 39.5 | 40.1 |
| 35.2 | 43.8 | 21.6 | 5.9 | 9.0 | 20.7 | 7.2 | 7.2 | 7.2 | 7.3 |
| 41.4 | 47.7 | 35.8 | 33.8 | 37.3 | 40.1 | 39.7 | 39.7 | 39.7 | 40.3 |
| 41.4 | 47.6 | 37.4 | 35.9 | 34.2 | 39.2 | 38.9 | 38.9 | 38.9 | 39.6 |
| 41.0 | 46.6 | 36.1 | 34.0 | 38.0 | 38.1 | 37.5 | 37.5 | 37.5 | 38.2 |

FIG.46

| | | |
|---|---|---|
| ADDITIONAL PAT WIDTH | ☐ | FREE |
| ADDITIONAL PAT LENGTH | ☐ | |
| ☐ ADDITIONAL PAT SHIFT | ☐ | |
| ADDITIONAL PAT EXPOSURE | ☐ | |

OK    CANCEL    END

```
BLOCKING VARIABLE-SHAPED PAT GROUP (STENCIL MASK)
    [ OK 1 ]  [ CANCEL1 ]  [ SET1 ]  [ CREATE1 ]  [ END1 ]

SEARCH BLOCK IN WAFER EXPOSING PATTERN
  ☐ ONLY SELECTED AREA
  ☐ SELECT SAME SHAPE IN X DIRECTION
  ☐ SELECT SAME SHAPE IN Y DIRECTION
  ☐ SELECT SAME SHAPE IN X & Y DIRECTIONS

[ OK 2 ]  [ CANCEL2 ]  [ SET2 ]  [ CREATE2 ]  [ END2 ]
```

| | |
|---|---|
| PATTERN TYPE | BLOCK(FULL) |
| ARRANGEMENT | MATRIX |
| X, Y | 128.880, 2640.172 (micron) |
| WIDTH, HEIGHT | 4.860, 4.650 (micron) |
| PDC | 0c00 |
| FIELD NO. | 5 |
| SUBFIELD NO. | 338 |
| CLOCK CODE | 33 |
| DOSE VALUE | |

OK

METHOD OF DISPLAYING, INSPECTING AND MODIFYING PATTERN FOR EXPOSURE

BACKGROUND OF THE INVENTION

1. Field of the Invention

The present invention relates to a method of displaying, inspecting and modifying pattern data for exposing with a charged particle beam.

2. Description of the Related Art

Exposure data are processed for correction in order to obtain a drawing pattern with high precision by irradiating an exposure object such as a resist-coated wafer, resist-coated mask or the like with a charged particle beam, for example, an electron beam on. In a large scale memory or a logic LSI, since a calculation time for correction of a proximity effect on exposure data is very long, approximate calculation has been adopted. In order to obtain a drawing pattern within error tolerance, exposure simulation has been performed prior to an actual exposure, and in the simulation, a drawing pattern is evaluated after exposure and based on the evaluation result, exposure simulation conditions are changed or CAD pattern data of a polygonal type are modified. Since such procedure is repeated, an LSI development period is long.

Accordingly, it has been required that exposure data before or after correction are inspected and modified in a shIrt time and the inspection and modification are not repeated or are repeated in a reduced number of times.

To be more concrete, there are following problems in the past:

(1) When exposure simulation is performed all over a chip, a calculation grid (points for calculating exposure intensity) is generated all over the chip and a result is displayed on a screen, while pattern data is read. Hence, there are a necessity for tremendous processing time and resources such as an immense memory capacity, which makes it almost impossible to verify all patterns by a delivery date.

Further, when exposure simulation is performed in a designated area on a chip, a calculation grid, as shown in FIG. 52, is generated in an edge region along a side of a pattern in the designated area and therefore, there is a case where it consumes several hours for the processing.

(2) Since no display function for a pattern area density is available, there is no way to quickly find out a site where correction is required.

(3) A result of exposure simulation in the designated area is displayed only in an exposure image as shown in FIG. 53. The exposure image is displayed with exposure intensities, for example, in 20 colors in the calculation grid regions.

Exposure images can be displayed only in designated areas since a calculation time is tremendously long and for this reason, judgment on whether or not all chip area is good in patterning is solely dependent on evaluation of an exposure result.

Further, in order to attain a predictive value of a pattern width and an error thereof, an operator has to sense both edges and computes them, and especially, there is difficulty measuring a comparatively large pattern width which extends from one end to the other end on a screen.

(4) When a stencil mask is used, a block pattern arrangement on a chip is recognized in the following manner in the prior art. That is, a wafer exposing pattern, as shown in FIG. 54, in which a block pattern data on a stencil mask are expanded is displayed on a screen and when a position in a screen is designated by a mouse, only a block pattern available at the designated position, if any, is displayed in a different color in such a way as shown in FIG. 55. Further, since block pattern data are expanded, only information on a designated block pattern as shown in FIG. 56 is displayed. In FIG. 56, X and Y are coordinates of the origin and PDC is a code to identify a block pattern on a stencil mask.

It is accordingly not easy to quickly grasp how block patterns are arranged on a chip.

Further, in order to display block patterns on a chip in a corresponding manner to block patterns on a stencil mask, the stencil mask has to be displayed on another graphic display apparatus and thereby correspondence between both cannot quickly be investigated with ease.

(5) No apparatus for pre-exposure inspection dedicated to block pattern data on a stencil mask is available in the prior art.

For example, since exposure of a block pattern is effected by one shot, a coulomb effect cannot be neglected when a current of one shot is much. However, in a prior art, wafer exposing data including a block pattern is all expanded and exposure simulation is performed while neglecting the coulomb effect. Hence, the precision in exposure simulation is lowered, which is a cause for the above-described repetition of processing.

Further, since, in the prior art, blanking of a block pattern, a proximity effect and a coulomb effect in a block pattern cannot be inspected prior to exposure, there is no means but to inspect them in evaluation of an exposure result.

(6) Since a drawing precision of a block pattern is higher at a position closer to the center of a stencil mask, it is necessary to change (move) a layout of a block pattern according to a drawing precision requirement.

Further, since a group of fine patterns can be subjected to exposure by one shot with use of a stencil mask, the stencil mask can enjoy a high throughput. However, since a stencil mask can be used only on a basis of one mask for one batch operation, there arises a necessity of that a block pattern on a stencil mask is restored to a group of variable-shaped patterns or, on the contrary, a group of variable-shaped patterns is changed to a block pattern, in consideration of drawing precision and throughput.

In such a case, since, in a prior art, block pattern extracting criteria given to a computer are changed and block extracting process is again performed on a CAD pattern of a polygonal type, the above described changes cannot be performed under deliberate judgment of an experienced designer with ease.

(7) While a calculation equation used in exposure simulation can be changed only before each processing in repetition based on the evaluation of a previous exposure result, this is a cause for repetition of processing of this kind.

SUMMARY OF THE INVENTION

Accordingly, an object of the present invention is to provide a method of displaying, inspecting and modifying a pattern for exposure, in which exposure data before and after correction can effectively be inspected and modified, and by which an integrated circuit development period can be shortened.

In the first aspect of the present invention, as shown in FIGS. 5, 14 and 15 for example, there is provided a method of inspecting object exposing pattern decomposed into basic patterns, displaying a result of the inspection, and modifying the exposure pattern based on the displayed result of the inspection, the inspecting comprising the steps of: creating a first calculation candidate point between end points of a first non-contact part of a side of one of the basic patterns, the non-contact part being defined as not in contact to a side of any of the basic patterns; creating a second calculation candidate point between end points of a second non-contact part of an opposite side with the first non-contact part, the second calculation candidate point corresponding to the first calculation candidate point; creating a plurality of calculation points on a straight line passing through the first and second calculation candidate points, the calculation points being located in each traversing part of the first and second non-contact parts; calculating an exposure intensity at each calculation point; obtaining a predictive value of a drawing pattern width based on the calculation result: and calculating an error of the predictive value from a target value as the inspection result.

With the first aspect of the present invention, sufficient information on an estimated error of a drawing pattern on an object can be obtained in a shorter time.

Further, because of the shorter time, for example, exposure simulation can be performed over all chip area, which contributes to reduction in integrated circuit development period.

In the second aspect of the present invention, as shown in FIG. 17 for example, there is provided the method as defined in the 1st aspect, wherein, in a case where a group of rectangular patterns with the same shape and size are arranged side by side in one direction with a shift by a distance between adjacent patterns like a flight of stairs, the group of rectangular patterns are regarded as one pattern constructed from a pair of opposite straight sides and a pair of opposite stair sides, and wherein the first and second calculation candidate points are created at intersections of a first straight line, which passes through the middle points of opposite imaginary straight sides corresponding to the opposite stair sides, and the opposite stair sides.

With the second aspect of the present invention, it can be avoided that calculation candidate points are increased in unnecessary number, thereby increasing a processing speed.

In the 3rd aspect of the present invention, there is provided a method of inspecting object exposing pattern decomposed into basic patterns, displaying a result of the inspection, and modifying the exposure pattern based on the displayed result of the inspection, the inspecting comprising the steps of: performing exposure simulation to calculate an exposure intensity distribution in a traversing part along a line which traverses the exposing pattern; and obtaining an error of a predictive drawing pattern width from a target value on the traversing line, and wherein the result to be displayed includes a histogram of the errors, as shown in FIG. 20(A) for example.

With the third aspect of the present invention, outline information on whether or not an exposing pattern for an object is good can quickly be obtained with ease.

In the 4th aspect of the present invention, there is provided a method of inspecting object exposing pattern or block patterns, the object exposing pattern including instances of the block patterns, the object exposing pattern being decomposed into basic patterns, the block patterns being arranged on a stencil mask, each block pattern being created by transforming a group of basic patterns into a block, displaying patterns or a result of the inspection, and modifying the exposure pattern or the block pattern based on the displayed result of the inspection, wherein the inspection comprises the steps of: inputting a set value or a set range by an operator (FIG. 42); and detecting a pattern with a width less than the set value, or within the set range on the stencil mask or in the object exposing pattern, wherein the displaying displays the detected pattern in a different way from the other patterns.

With the fourth aspect of the present invention, parts which are to be subjected to change in pattern division can quickly be found out with ease.

In the 5th aspect of the present invention, there is provided a method of inspecting object exposing pattern or block patterns, the object exposing pattern including instances of the block patterns, the object exposing pattern being decomposed into basic patterns, the block patterns being arranged on a stencil mask, each block pattern being created by transforming a group of basic patterns into a block, displaying patterns or a result of the inspection, and modifying the exposure pattern or the block pattern based on the displayed result of the inspection, wherein the inspection comprises the steps of: inputting a set value by an operator (FIG. 48); and detecting a block pattern with a through hole area more than the set value on the stencil mask, wherein the displaying displays the detected block pattern in a different way form the other block patterns.

With the fifth aspect of the present invention, parts which are to be corrected about a coulomb effect and a proximity effect can be searched out with ease.

Other aspects, objects, and the advantages of the present invention will become apparent from the following detailed description taken in connection with the accompanying drawings.

BRIEF DESCRIPTION OF THE DRAWINGS

FIG. 6 is an illustration of pattern data used in the processing of FIG. 5;

FIG. 21(A) is a bar graph showing maximums of positive and negative errors for respective line widths obtained in exposure simulation;

FIG. 36 is an illustration showing an area density display as example;

FIG. 46 is an illustration showing a dialog box which is displayed when pressing the GENERATE ADDITIONAL PATTERN button in FIG. 43(A);

FIG. 56 is an illustration showing a prior art display of information on a designated block pattern.

DESCRIPTION OF THE PREFERRED EMBODIMENT

Table of Contents

Figure 1:
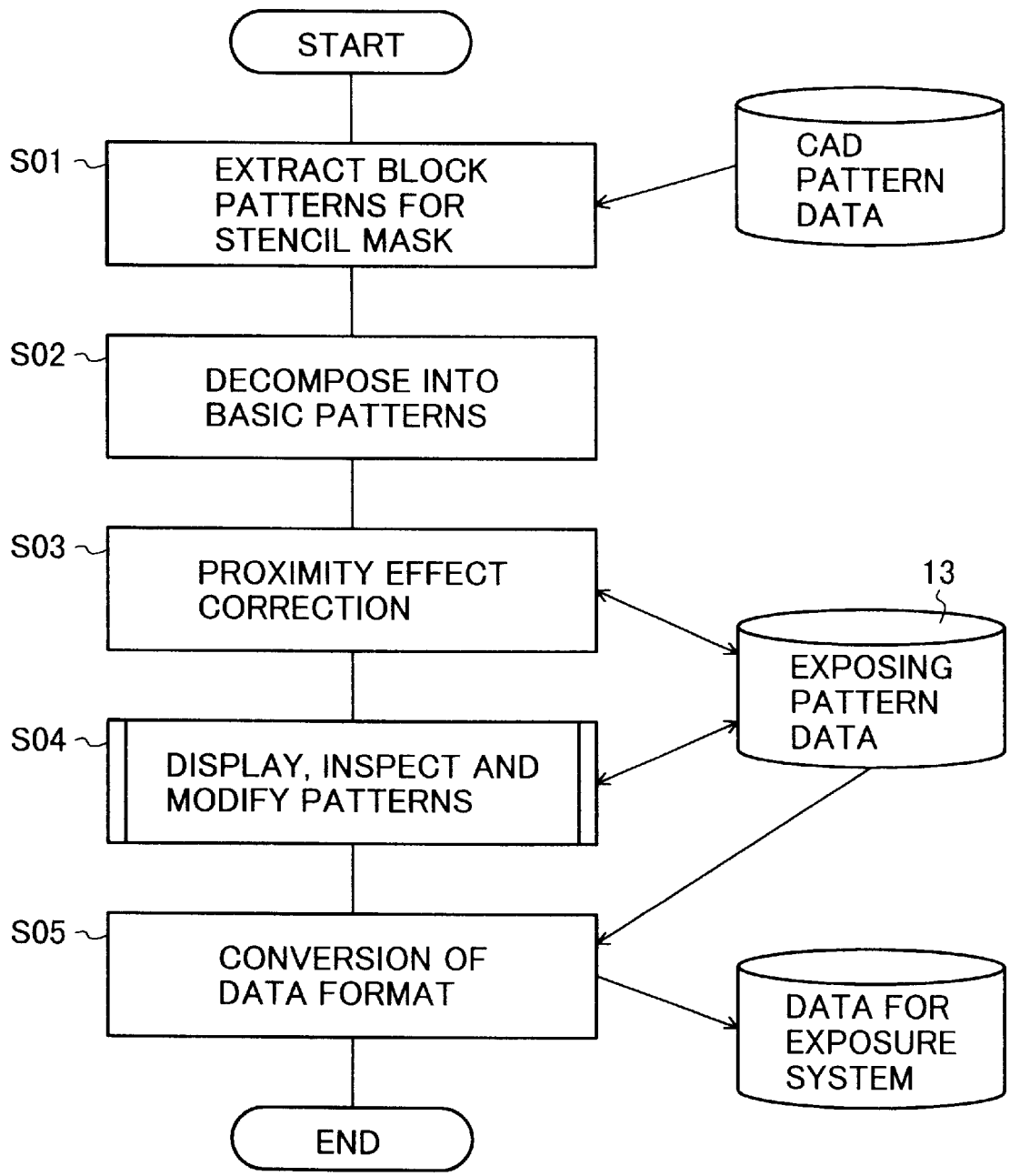
FIG. 1 is a general flow chart showing a preparation procedure for exposing pattern data.

1. Outlines
2. Display, Inspection and Modification of Wafer Exposure Pattern Data
  2-1. Exposure Simulation
  2-2. Display of Exposure Simulation Result
  2-3. Exposure Data Modification Based on Exposure Simulation Result
    (1) Change in Exposure
    (2) Pattern Shift
    (3) Auxiliary Exposure
    (4) Additional Pattern
    (5) Change in Pattern Division
  2-4. Automatic Width Measurement
  2-5. Area Density
3. Display, Inspection and Modification of Block Pattern on Stencil Mask
  3-1. Detection of Block Pattern in Wafer Exposure Pattern
  3-2. Detection of Blanked-out Pattern in Block Pattern
  3-3. Detection of Fine Pattern
  3-4. Inspection of Coulomb Effect
  3-5. Pattern Data Modification Based on Inspection Result of Coulomb Effect
    (1) Change in Exposure
    (2) Pattern Shift
    (3) Additional Pattern
    (4) Change in Pattern Division
  3-6. Inspection of Through Hole Area
  3-7. Inspection of Proximity Effect
  3-8. Pattern Data Modification Based on Inspection Result of Proximity Effect
4. Layout Change of Block Patterns on Stencil Mask
  (1) Layout Change of Block Patterns on Stencil Mask
  (2) Deletion of All Block Patterns on Stencil Mask and Transformation of Each Block Pattern into Variable-shaped Patterns
  (3) Deletion of Selected Block Patterns on Stencil Mask and Transformation of the Block Patterns Each into Variable-shaped Patterns
  (4) Transformation of Variable-shaped Patterns into Block Pattern and its Arrangement on Stencil Mask Referring now to the drawings, wherein like reference characters designate like or corresponding parts throughout several views, preferred embodiments of the present invention are described below.

1. Outlines

An exposure area on a wafer is divided into fields each of which is a scanning area of the main deflector and a field is further divided into subfields each of which is a scanning area of the auxiliary deflector. Designed exposure CAD pattern data are hierarchized, available in subfields as unit and have information on whether a subfield resides in an isolated state or as one in a repetition arrangement, the number of subfields in repetition arrangement, an arrangement number, a spatial extent of arrangement of subfields. Data which reside in a subfield include information on whether a pattern are a variable-shaped pattern or as a block pattern on a stencil mask, the number of patterns in repetition arrangement, a pattern data number, a pattern position.

FIG. 1 is a general flow chart showing a creating procedure for exposing pattern data.

(S01) Block patterns for a stencil mask are extracted from CAD pattern data of a polygonal type according to predetermined criteria. For example, the maximum number of block patterns which can be accommodated in a single stencil mask are extracted in the decreasing order of the number of block pattern repetition.

Figure 7:
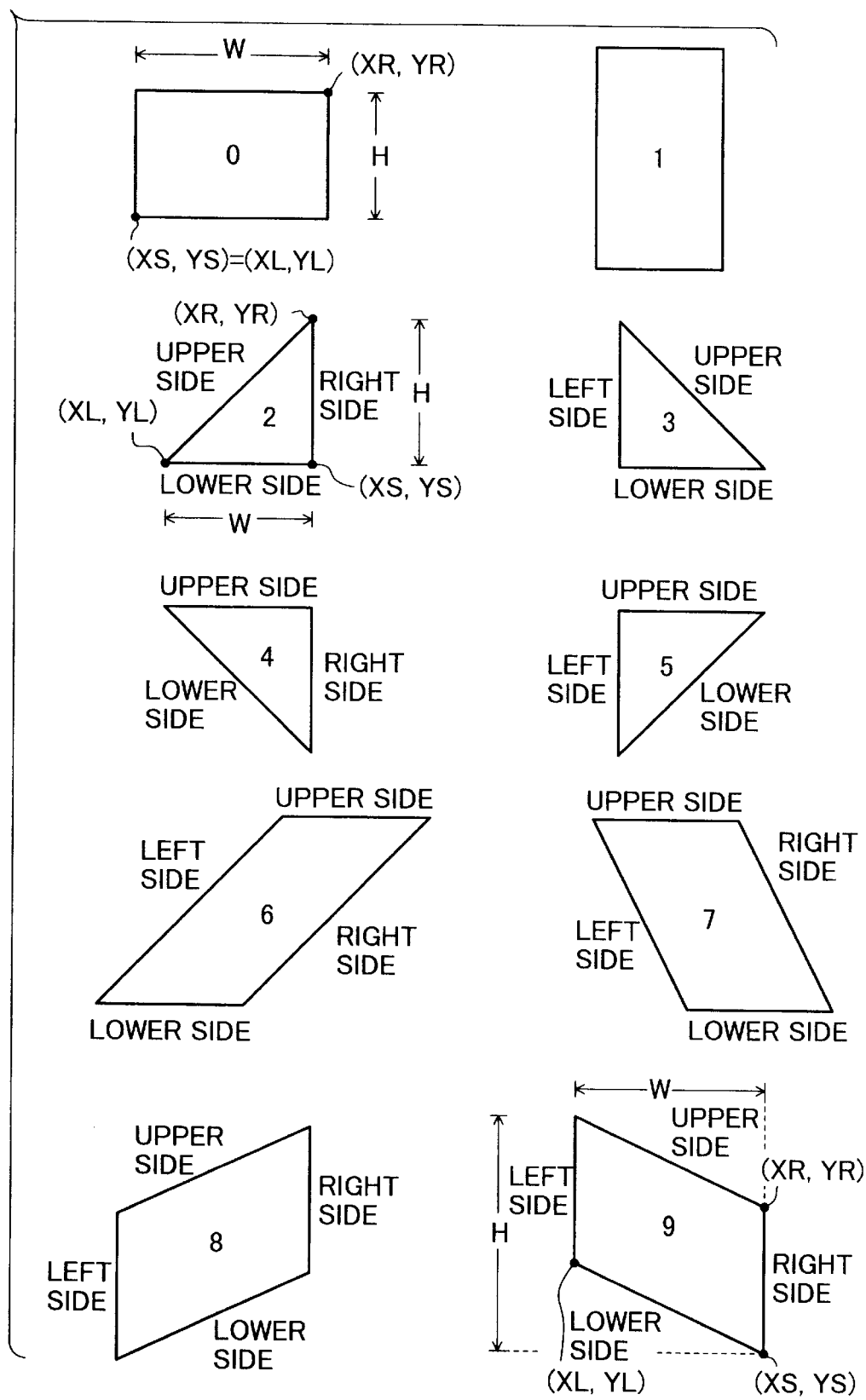
FIG. 7 are illustrations showing basic patterns.

(S02) A CAD pattern is decomposed into basic patterns as shown in FIG. 7. Since a block pattern is extracted from the CAD pattern, by the decomposition the block pattern is also decomposed into basic patterns.

(S03) Proximity effect correction is performed. Since a calculation volume is tremendous, the correction is performed in approximation.

(S04) Display, inspection and modification of a pattern is performed, which will be described later.

(S05) Format conversion is performed from modified pattern data to data for an exposure system. By the conversion, a basic pattern is further decomposed into shot patterns.

Since, in step S04 as well, extraction of block patterns and proximity effect correction can be performed, steps S01 and/or S03 is not indispensable.

Figure 2:
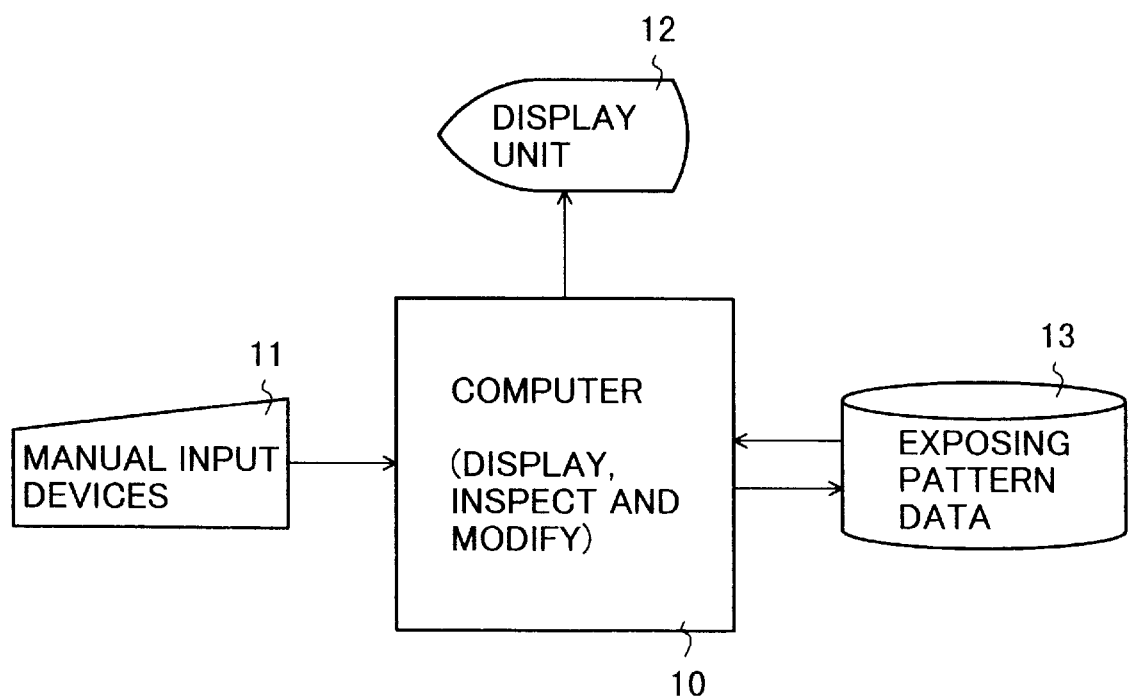
FIG. 2 is a schematic block diagram of an exposing pattern displaying, inspecting, modifying apparatus for performing process of step S04 of FIG. 1.

FIG. 2 is a schematic block diagram of an exposing pattern displaying, inspecting, modifying apparatus for performing process of the step S04 which is a characteristic part of the present invention.

The apparatus is a general purpose computer system which comprises a computer 10 and its peripheral devices including manual input devices 11, a display unit 12 and an external storage unit 13 connected to the computer 10, and an interactive processing of exposing pattern data stored in the external storage unit 13 is performed in the system.

Figure 3:
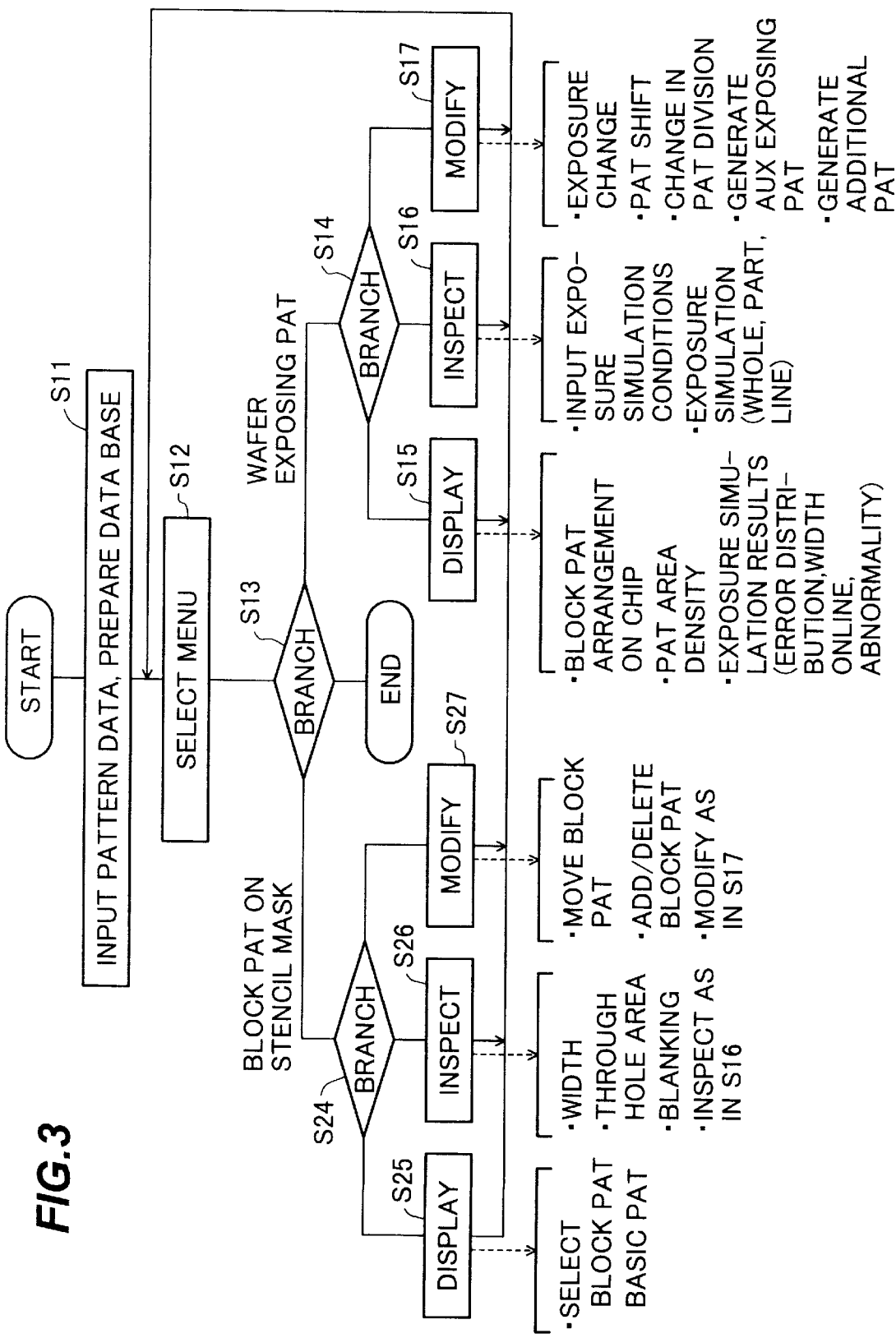
FIG. 3 is a schematic flow chart showing a procedure of an exposing pattern displaying, inspecting and modifying process performed using the apparatus of FIG. 2.

FIG. 3 is a schematic flow chart showing a procedure of displaying, inspecting and modifying process for exposing pattern which is performed using the apparatus shown in FIG. 2.

(S11) When pattern data is input, a database in which the pattern data and null data of display, inspection and modification are combined is created.

(S12) An operator selects a hierarchical menu of a command button arrangement format.

Figure 4A:
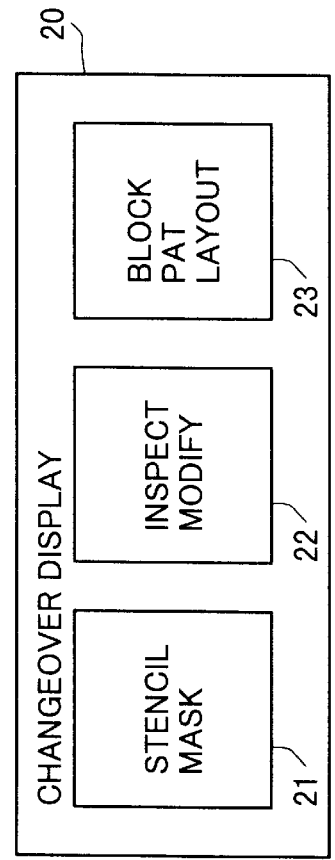
FIG. 4(A) is an illustration showing command buttons arranged on an initial menu box.

FIG. 4(A) shows a CHANGEOVER DISPLAY button 21, an INSPECT/MODIFY button 22 and a BLOCK PATTERN LAYOUT button 23 which are arranged in the initial menu box 20 on a screen.

Each time when the CHANGEOVER DISPLAY button 21 is pressed, that is when the CHANGEOVER DISPLAY button 21 is pointed at by a mouse and the mouse is clicked, block patterns on a stencil mask and a wafer exposing pattern, as a display pattern on a screen, is alternately changed over to each other. According to the changeover, a caption on the CHANGEOVER DISPLAY button 21 is changed over to "Stencil Mask" or "Wafer Exposure Pattern".

When the INSPECT/MODIFY button 22 is pressed, the inspection/modification dialog box 221 is displayed on the screen as a menu of the lower level in hierarchy. The menu is classified into a command button train for performing inspection and modification of a wafer-exposing pattern including instances of block patterns and a command button train for performing inspection and modification of a block pattern.

The former command button train includes the DISPLAY AREA DENSITY button 30, the AUTO-MEASURE WIDTH button 31, the EXPOSURE SIMULATION button 32, the DISPLAY PRECISION DISTRIBUTION button 33, the DISPLAY WIDTH DISPERSION button 34 and the MODIFY PATTERN DATA button 35. The latter command train includes the DETECT ON-CHIP BLOCK PATTERN ARRANGEMENT button 40, the DETECT FINE PATTERN button 41, the INSPECT/MODIFY COULOMB EFFECT button 42, the INSPECT/MODIFY THROUGH HOLE AREA button 43, the INSPECT/MODIFY BLANKED-OUT PATTERN button 44 and the INSPECT/MODIFY PROXIMITY EFFECT button 45.

According to a menu item (a pressed command button) selected in step S12, in the flow chart in FIG. 3, with respect to a wafer exposing pattern, program flow goes to steps S13 and S14 and there are performed display in step S15, inspection in step S16 or modification in step S17. With respect to block patterns on a stencil mask, program flow goes to steps S13 and S24 and there are performed display in step S25, inspection in step S26 or modification in step S27.

For example, in step S16 exposure simulation is performed, in step S15 the result is displayed, and in step S17, the wafer exposing pattern data is modified based on the result.

In step S05 of FIG. 1, since the wafer exposing pattern data including instances of block patterns is used, when a block pattern on the stencil mask is modified, the instances of block patterns are also simultaneously modified in an automatic manner under authorization of an operator as will be described later.

Below, the processing of FIG. 3 will be detailed. First, display, inspection and modification of wafer exposing pattern data will be described.

Figure 5:
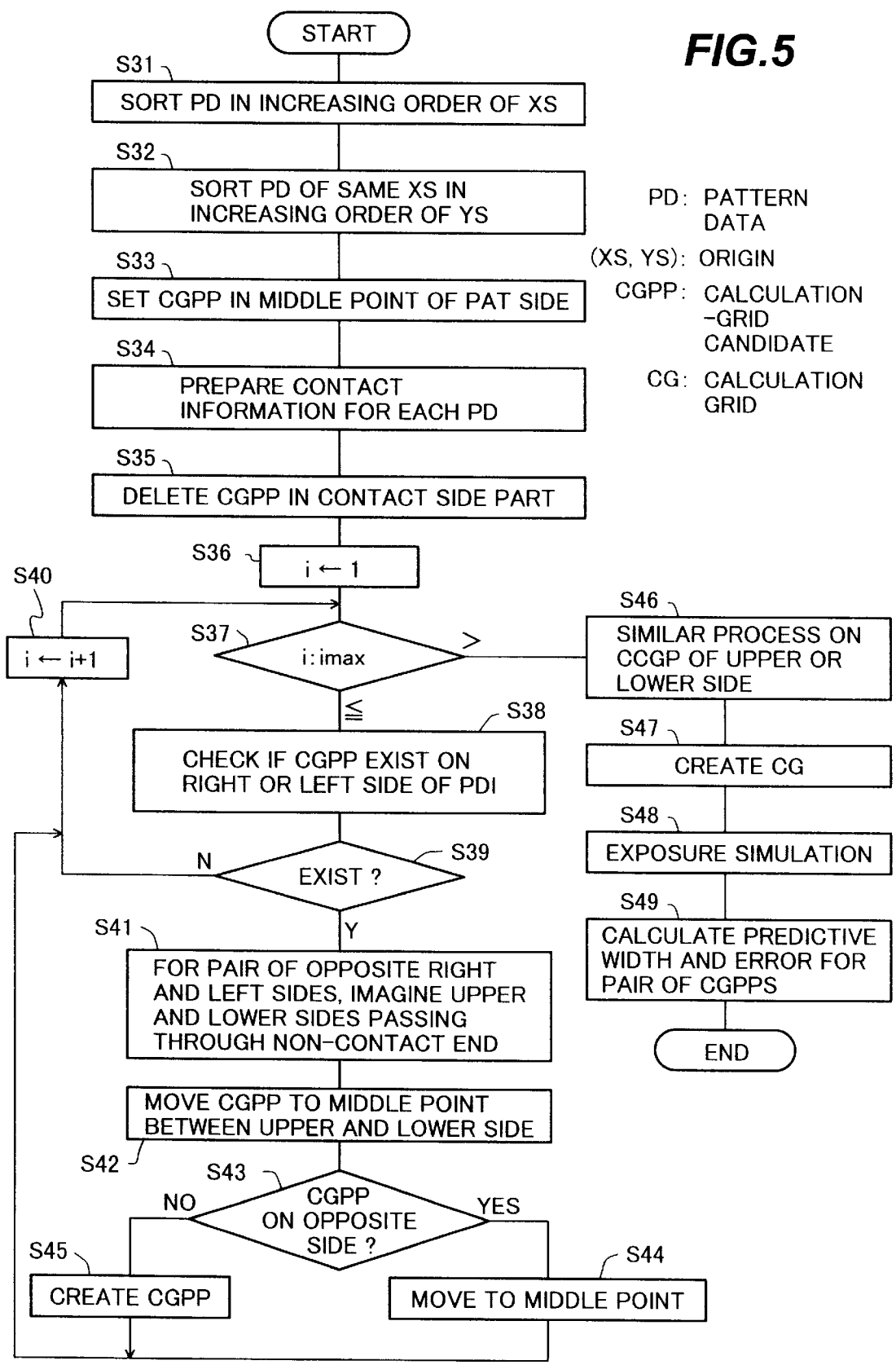
FIG. 5 is a flow chart showing a procedure of exposure simulation.

2. Display, Inspection and Modification of Wafer Exposure Pattern Data 2-1. Exposure Simulation FIG. 5 is a flow chart showing a procedure of exposure simulation of a wafer-exposing pattern.

Figure 4B:
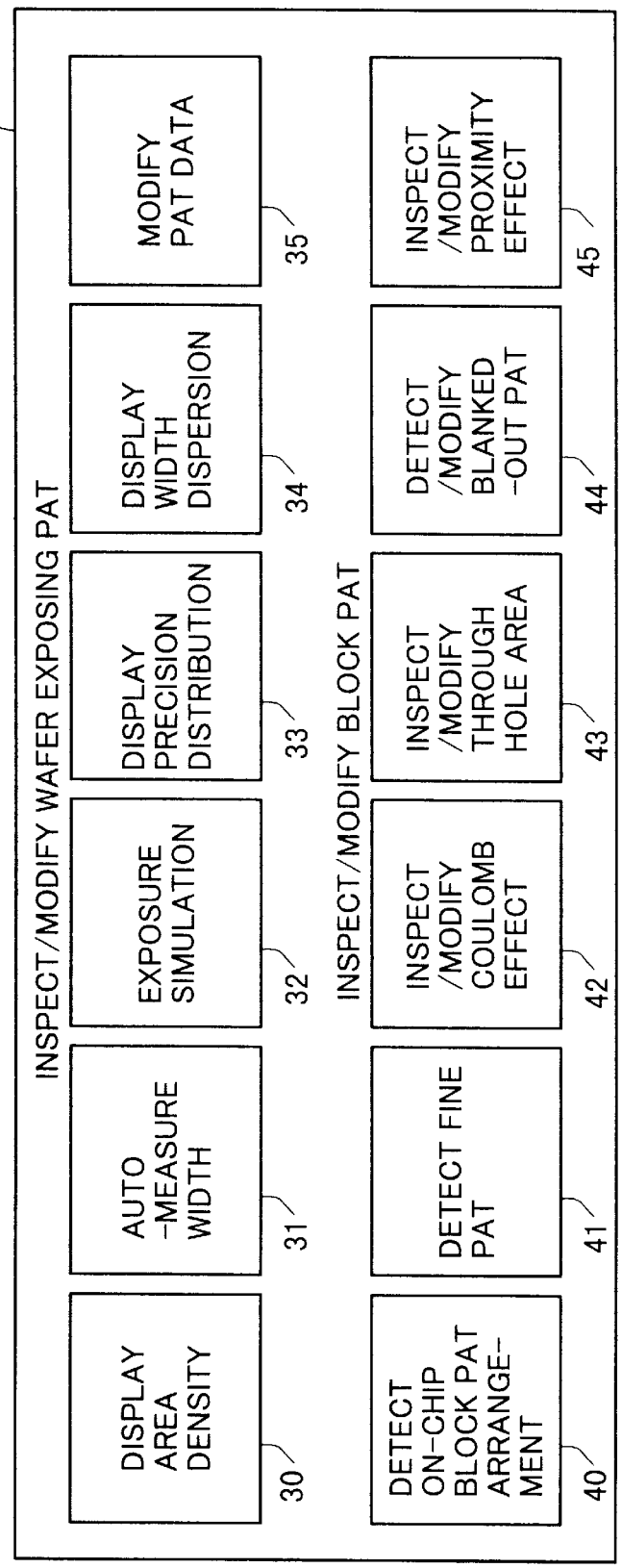
FIG. 4(B) is an illustration showing command buttons arranged on a menu box displayed when pressing the INSPECT/MODIFY button in FIG. 4(A)

The simulation is processing which is performed in step S16 of FIG. 3 in a such a manner that the INSPECT/MODIFY button 22 is pressed in FIG. 4(A) to display the inspection/modification dialog box 221 of FIG. 4(B) and then the EXPOSURE SIMULATION button 32 is pressed and the EXECUTE button, not shown, is pressed.

Before the EXECUTE button is pressed, a display is changed-over to a wafer exposing pattern by pressing the CHANGEOVER DISPLAY button 21 and a frame 50 indicating an area in which exposure simulation is performed is set. Patterns 51 and 52 on the frame are not patterns for processing of FIG. 5 since the pattern widths are of no sense.

The S pattern is one polygonal pattern in the stage of a CAD pattern, while in step S02 of FIG. 1, the polygonal pattern is decomposed into basic patterns. In such a decomposed state, an exposure for each of the patterns can be determined, and an exposure and a size of each pattern can be modified according to a simulation result.

However, if exposure simulation is performed by creating a calculation grid along the outline of the S letter shape in a continuous manner as in a prior art, a calculation time is tremendous.

Therefore, the problem is solved by the processing of FIG. 5.

(S31) The data of the basic patterns in the frame 50 except the patterns 51 and 52 are sorted in the increasing order of the coordinates XS of origins thereof.

The basic pattern data are organized as shown in FIG. 6. The data are constructed from the basic part and the first and second extended parts.

The organization of the basic part is as follows:

Variable-shaping/block: a flag which indicates whether a pattern is constructed from variable-shaped patterns or from block patterns on a stencil mask is included. In the case of a repetition pattern, information on repetition is stored here.

Exposure: a value proportional to a product of a current of a charged particle beam emitted from a charged particle gun times an exposure time.

A shape code: shape codes 0 to 9 for the basic patterns as shown in FIG. 7.

Coordinate of origin: coordinate of the origin (XS, YS) of basic patterns with shape codes 0, 2 and 9 in FIG. 7.

The width and length of a pattern: the widths W and lengths H of the basic patterns with shape codes 0, 2 and 9 in FIG. 7, while in the case of a block pattern, a block pattern code BPC for identifying a block pattern on a stencil mask is used instead of a pattern width and H=0 is applied.

While the shape of each of patterns with shape codes 0 to 2 in FIG. 7 is determined only by the basic part, in the case of one with shape code 9 in FIG. 7 the shape is not determined only by the basic part. The first extended part is used for the determination and high speed calculation, and constructed from pattern lower left corner vertex coordinates (XL, YL) and pattern upper right corner vertex coordinates (XR, YR).

(S32) The basic pattern data with the same coordinate XS of origins are sorted in the increasing order of the coordinates YS of the origins.

Figure 8:
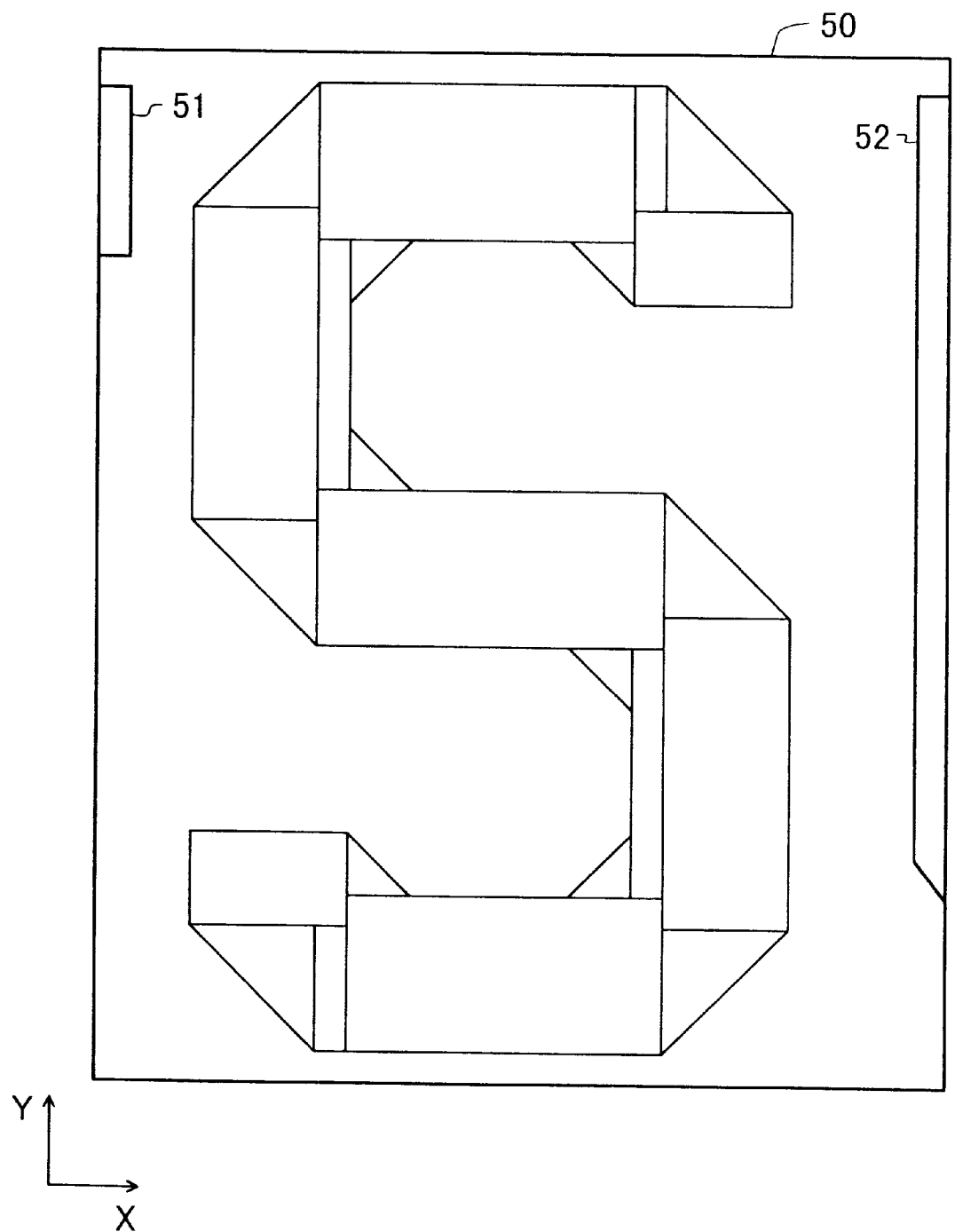
FIG. 8 is an illustration showing an example of an exposure simulation area.
Figure 9:
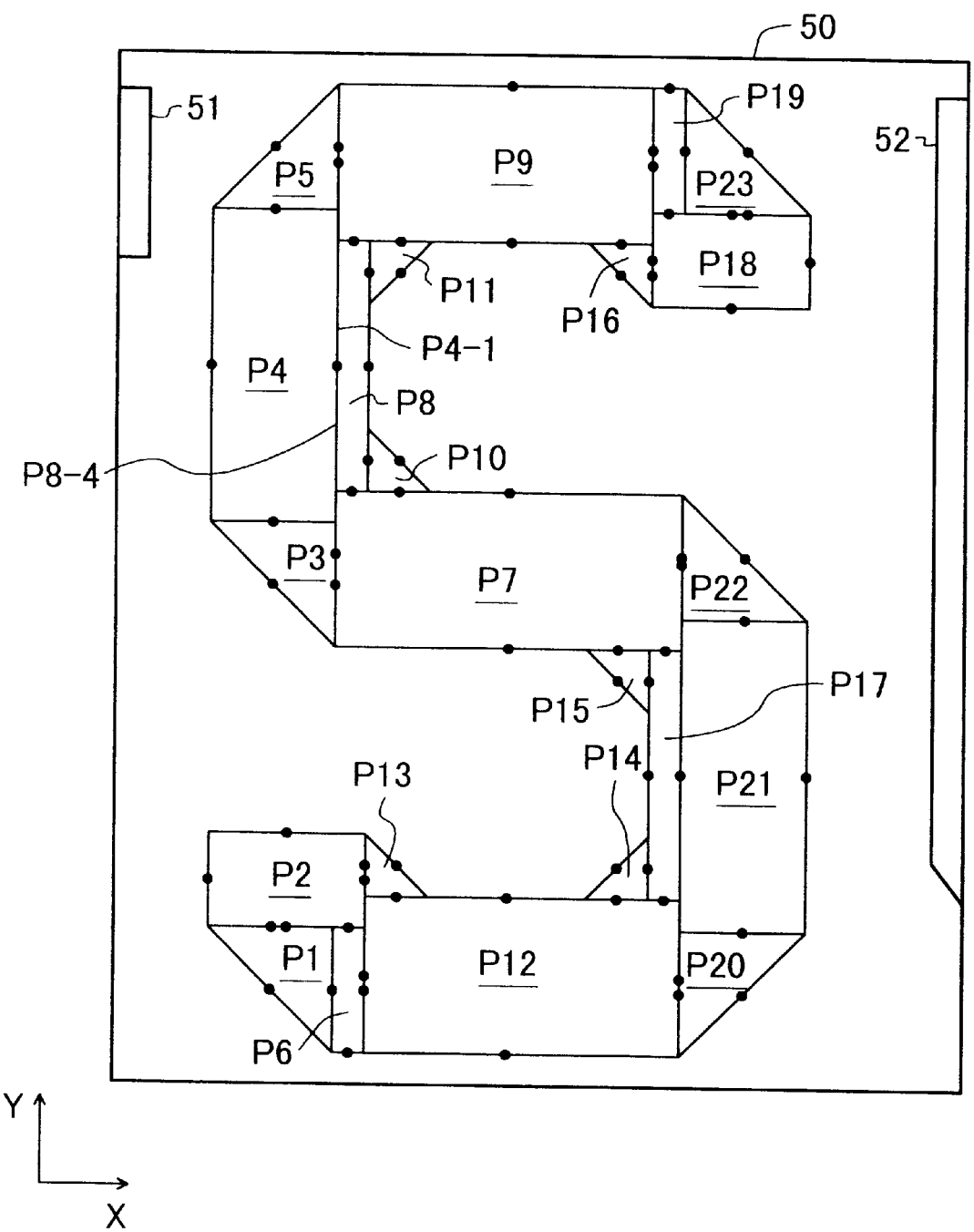
FIG. 9 is an illustration for steps S31 to S33 of FIG. 5.

In steps S31 and S32, the basic patterns of FIG. 8 are sorted in the order of the basic patterns P1 to P23 shown in FIG. 9.

(S33) Computation grid candidate points CGPP indicated by dots in FIG. 9 are set to middle points of respective sides of respective patterns.

While exposure intensity calculation is required to be performed on a pattern which is obtained in an imaginative way by demagnified projection of a wafer exposing pattern on an object of exposure, since, in an ideal case, both are of a similar shape, the calculation is performed using the wafer exposing pattern as the demagnified projection pattern, then multiplying the calculation result of a pattern width by a reduction ratio. Thereby, an exposure intensity can be obtained so as to be substantially same as when an exposure intensity is calculated on a demagnified projection pattern.

The meaning of a calculation-grid candidate point will be outlined in connection with calculation in exposure simulation and a result thereof.

Figure 18:
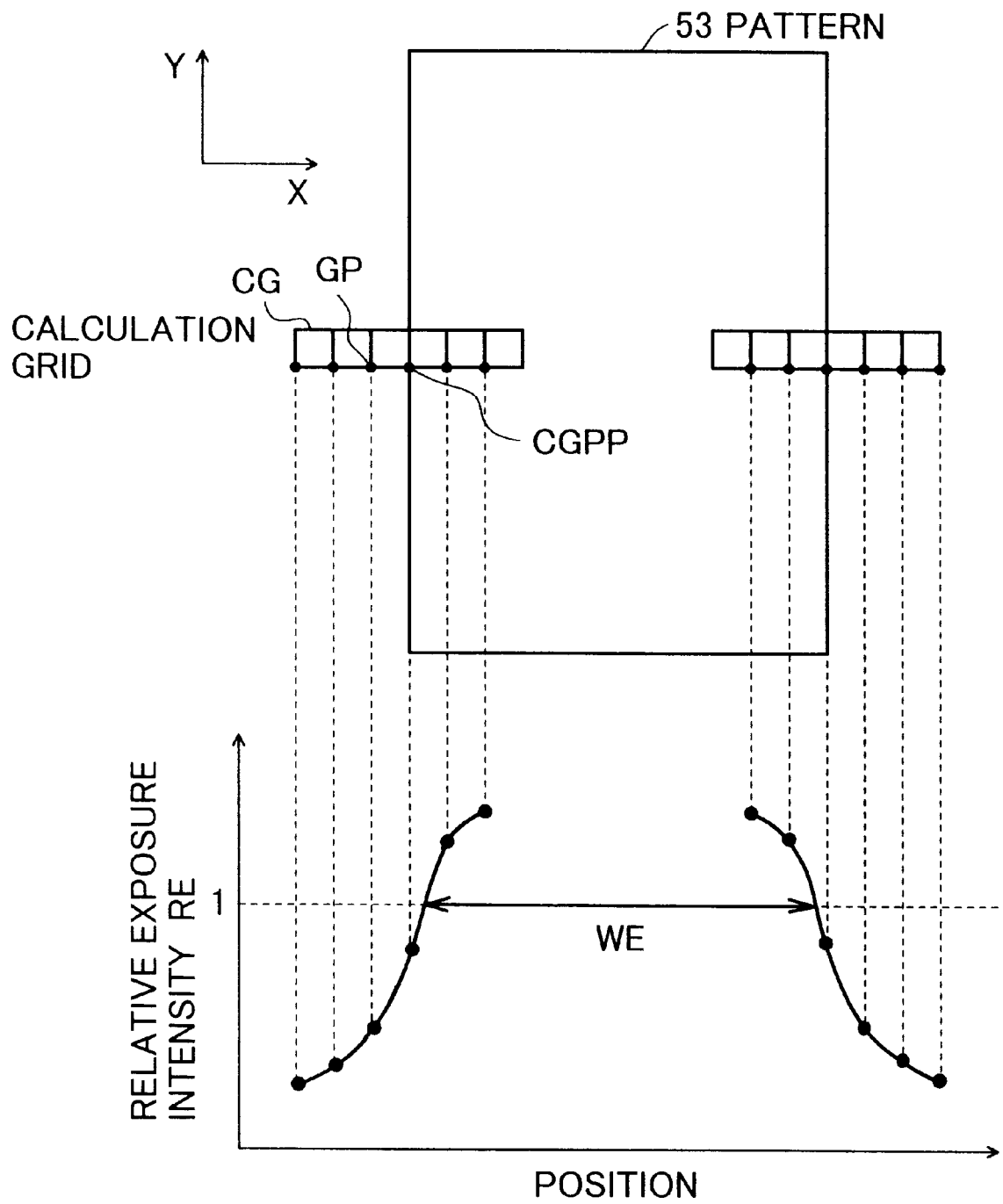
FIG. 18 are an illustration showing a relation between calculation-grid candidate points and a calculation grid on sides of a pattern and a diagram showing an exposure intensity distribution which is calculated on the calculation grid points.
Figure 19:
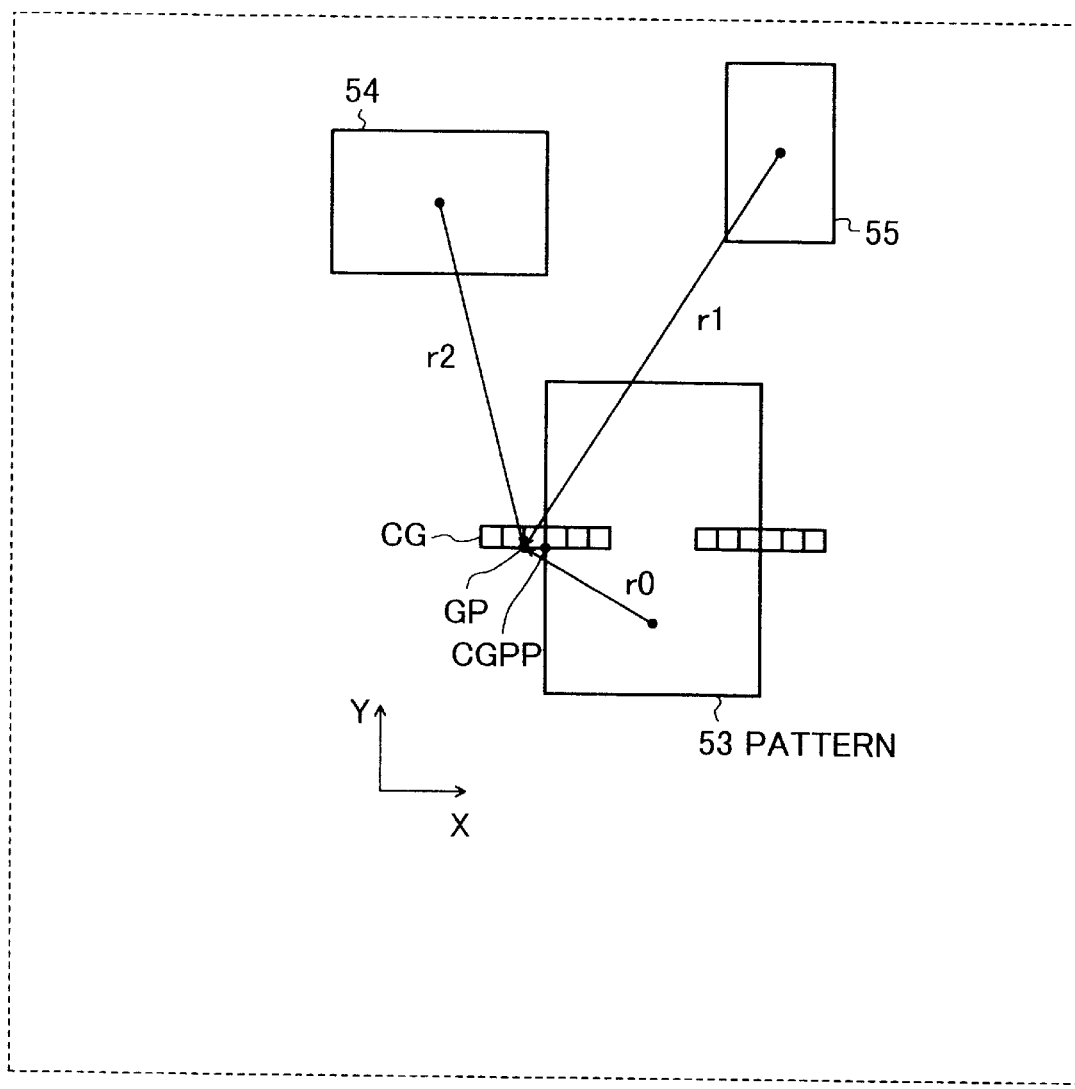
FIG. 19 is an illustration of an exposure intensity calculation.

Computation grid candidate points CGPP are dedicated for determination of a calculation grid as shown in FIG. 18.

When a calculation-grid candidate point CGPP is determined on the left side of a pattern 53, a calculation grid CG of one row is determined so as to extend along an X direction passing through the CGPP point with the point CGPP as a center. Computation values of a relative exposure intensity RE are regarded as same in an approximate manner within a square of a calculation grid CG. For example, the relative exposure intensity RE is calculated at a position GP (grid point) indicated by a dot on the calculation grid CG. The relative exposure intensity RE is normalized so that a threshold in development of a latent image formed on a resist by exposure assumes 1. A calculation grid CG is determined for the right side of the pattern 53 in the same way as for the left side thereof, thereby calculating a relative exposure intensity RE.

With the calculation of the relative exposure intensities, the width (a predictive value) WE of a drawing pattern which would be obtained if a wafer was subjected to exposure with the pattern 53 is attained and thus an error ΔWE from the target value is also determined.

(S34) Contact information for each pattern data is prepared in the second extended part of FIG. 6. The contact information is composed of the numbers of contact patterns NR, NL, NU and ND respectively on the right side, left side, upper side and lower side of a basic pattern and the first addresses AR1, AL1, AU1 and AD1 for showing, in a list structure, the data addresses of the patterns which are respectively in contact to the right side, left side, upper side and lower side. The right side, left side, upper side and lower side of a pattern are defined as shown in FIG. 7.

For example, in the case of NL=2, the head address PAL1 of data of another pattern which is in contact to the left side and a second address AL2 are stored in an address AL1, and a head address PAL2 of still another contact pattern and 0 which shows that there is no more contact pattern are stored in the second address AL2. In the case of NR=0, an address of a contact pattern on the right side is not effective.

(S35) Data of FIG. 6 are referred to with respect to each side of all the patterns for inspection and if there is a side of another pattern which is in contact to a side of all the patterns for inspection, a calculation-grid candidate point in the contact part is deleted.

For example, since, in FIG. 9, a side P4-1 of a pattern P4 is in contact to a side P8-4 of a pattern P8, a calculation-grid candidate point resides on the sides P8-4 and P4-1, the grid point is deleted. By such deletion processing, the calculation-grid candidate points reside only on the outline of an S letter shape as shown in FIG. 10.

While positions of calculation-grid candidate points are roughly determined, there still arises the following problem.

Figure 10:
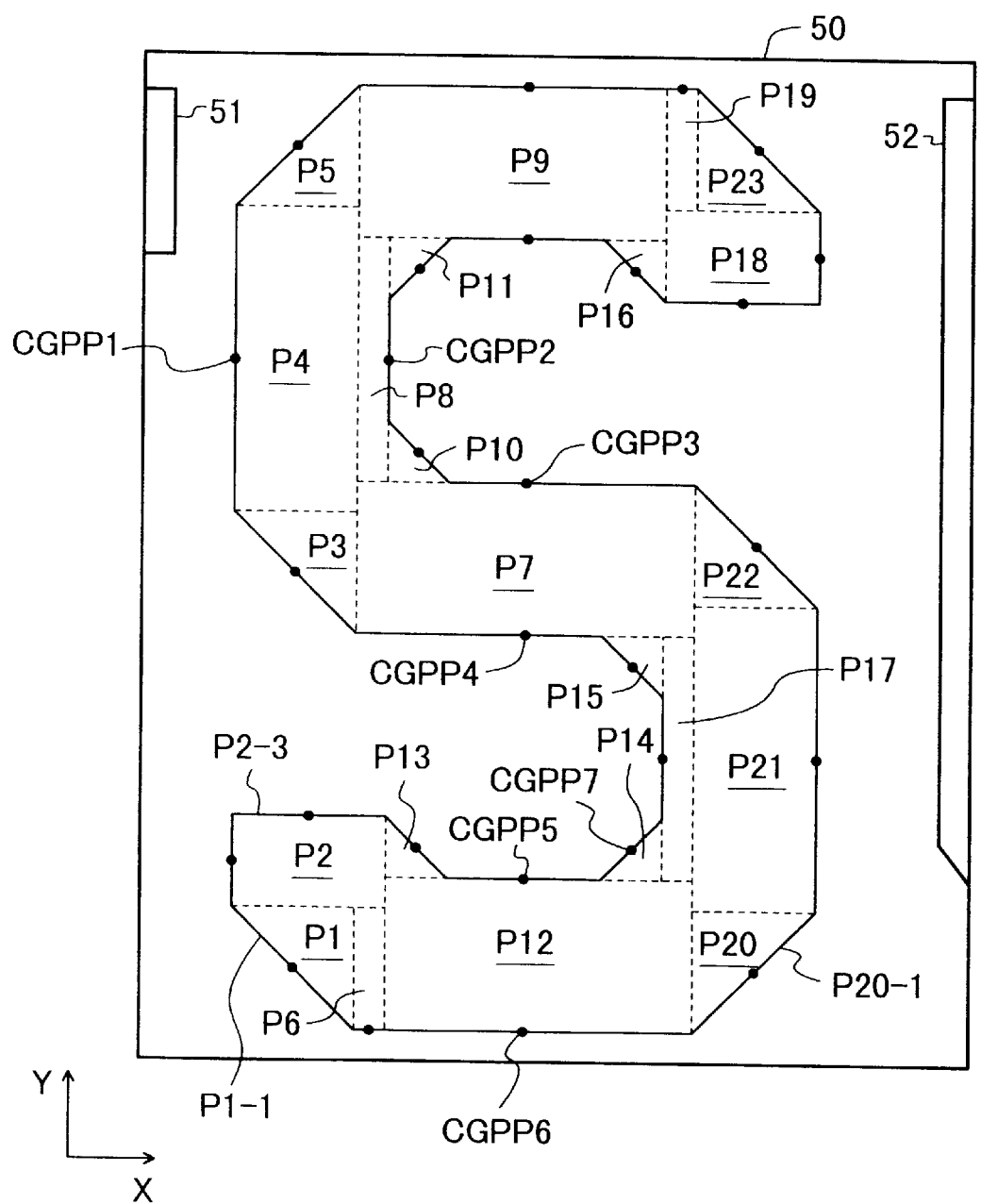
FIG. 10 is an illustration for step S35 of FIG. 5.

For example, in the case where sizes of patterns P11 and P10 are different in FIG. 10, a calculation-grid candidate point CGPP2 as a representative point is preferably the middle point between the lower left corner vertex of the pattern P11 and the upper left corner vertex of the pattern P10. When a calculation-grid candidate point CGPP2 is moved to the middle point, there is a need for the calculation-grid candidate point CGPP1 is also moved in a corresponding manner in order to compute the pattern width in an X direction. Such a procedure applies to the calculation-grid candidate points CGPP5 and CGPP6.

Further, when the calculation-grid candidate point CGPP3 of the pattern P7 is moved in the direction so as to be farther away from the pattern P10, since the calculation-grid candidate point CGPP4 is required to be moved in company with the movement of the calculation-grid candidate point CGPP3, the calculation-grid candidate point CGPP4 is moved closer to the pattern P15 side, which makes the calculation-grid candidate point CGPP4 not suitable as a representative point.

With respect of the calculation-grid candidate point CGPP7 of the pattern 14, since there is no calculation-grid candidate point which corresponds to the calculation-grid candidate point CGPP7 on the opposite side in the S letter pattern, the corresponding calculation-grid candidate point is required to be created on the opposite side.

Therefore, the problems are solved in steps S36 to S46 which will be described below.

(S36) The identification variable i of a pattern data PDi is assigned with an initial value 1.

(S37) If i is equal to or less than the maximum imax of the variable i, program flow goes to step S38, or else program flow goes to step S46.

(S38) It is checked whether or not a calculation-grid candidate point CGPP resides on the right side or left side of a pattern of a pattern data PDi.

(S39) If there is none of the calculation-grid candidate point CGPP on either side, program flow goes to step S40, while if there is, program flow goes to step S41.

(S40) i is incremented by 1 and program flow returns to step S37.

(S41), For a first side which includes the calculation-grid candidate point CGPP and a second side which resides opposite with the first side in an X direction, two sides, upper and lower, along an X direction respectively passing through non-contact end points are imagined.

For example, a side which is opposite with the side on which the point CGPP2 of FIG. 10 resides is the side on which the point CGPP1 resides. For the calculation-grid candidate point CGPP2, there are imagined, as shown in FIG. 12(A), a lower side A1.D1 of a dotted line which passes through a non-contact end point A1 and an upper side B1.C1 of a dotted line which passes through a non-contact end point B1.

Note that a side which is opposite with the side P1-1 and in X-direction is the side P20-1.

(S42) The calculation-grid candidate CGPP is moved to the middle point of the imaginary upper a nd lower sides.

Figure 12A:
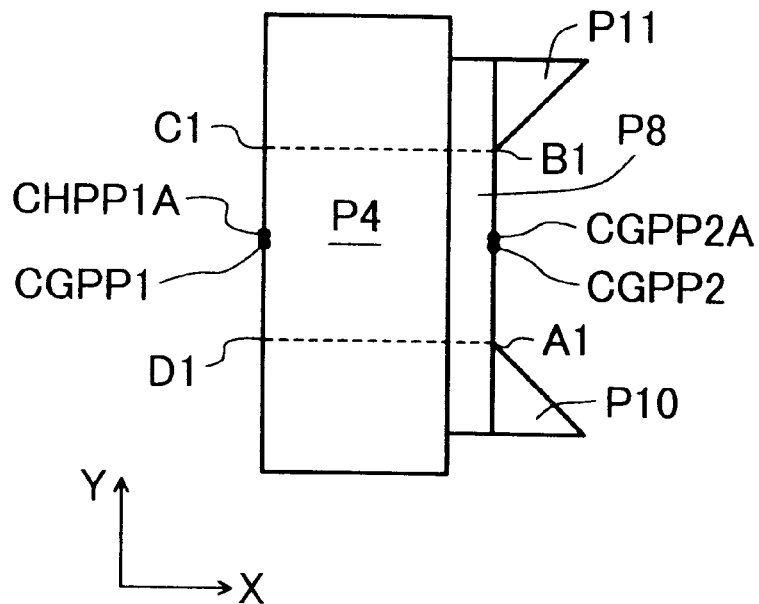
FIG. 12(A) is an illustration for steps S41 to S45 of FIG. 5.

For example, the calculation-grid can did ate point CGPP2 of FIG. 12(A) is moved to the middle point CGPP2A between the points A1 and B1.

(S43 to S45) If a calculation-grid candidate point resides on the opposite side of step S41, the point is moved to the middle point between the upper and lower imaginary sides as mentioned above, while if a calculation-grid candidate point is not on the opposite side of step S41 between the both imaginary sides, a calculation-grid candidate point is created at the middle point between both sides.

In FIG. 12(A), in step S44 the calculation-grid candidate point CGPP is moved to the middle point CGPP1A between the points C1 and D1.

Then, program flow returns to step S40.

(S46) For calculation-grid candidate points on upper and lower sides as well, a similar processing to that in steps S36 to S45 is performed. In the processing, "a first side which includes the calculation-grid candidate point and a second side which resides opposite with the first side in an X direction" of step S41 is read as "a first side which includes the calculation-grid candidate point and a second side which resides opposite with the first side in an Y direction".

Figure 12B:
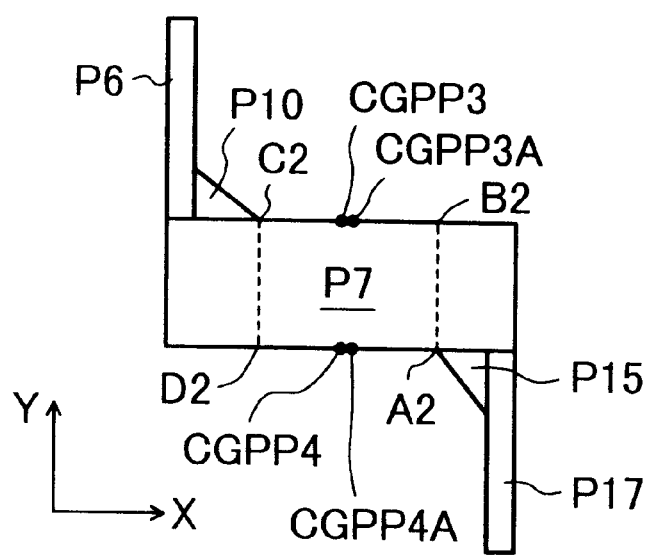
FIG. 12(B) is an illustration for step S46 of FIG. 5.

For example, for the calculation-grid candidate point CGPP3, there are imagined, as shown in FIG. 12(B), a left side C2.D2 of a dotted line which passes through a non-contact end point C2 and a right side A2.B2 of a dot line which passes through a non-contact end point A2, and the calculation-grid candidate point CGPP3 is moved to the middle point CGPP3A between the points B2 and C2. The calculation-grid candidate point CGPP4 is, in a similar manner, moved to the middle point CGPP4A between the points D2 and A2.

Figure 13A:
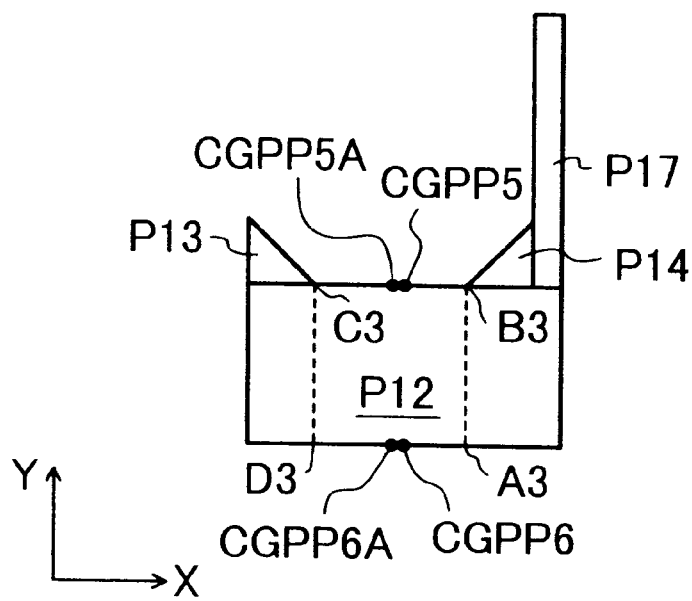
FIGS. 13(A) and 13(B) are illustrations of step S46 of FIG. 5.

For the calculation-grid candidate point CGPP5 of the pattern 14 of FIG. 10, there are imagined, as shown in FIG. 13(A), a left side C3.D3 of a dotted line which passes through a non-contact end point C3 and a right side B3.A3 of a dotted line which passes through a non-contact end point B3, and the calculation-grid candidate point CGPP5 is moved to the middle point CGPP5A between the points B3 and C3. The calculation-grid candidate point CGPP6 is in a similar manner moved to the middle point CGPP6A between the points D3 and A3.

Figure 13B:
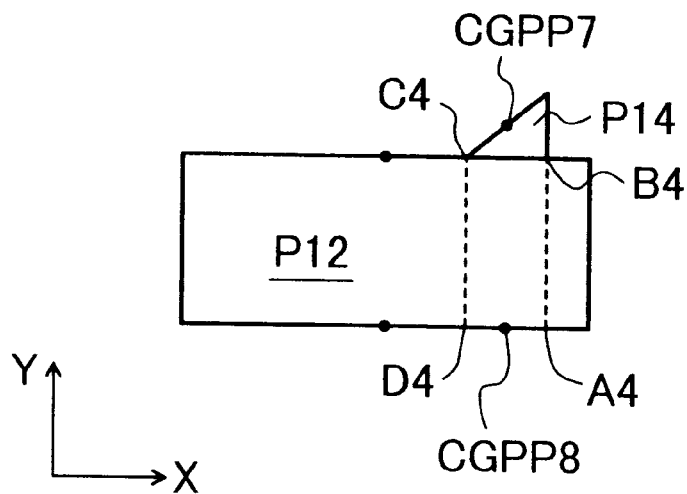

For the calculation-grid candidate point CGPP7 of the pattern 12 of FIG. 10, there are imagined, as in FIG. 13(B), a left side C4.D4 of a dotted line which passes through a non-contact end point C4 and a right side B4.A4 of a dotted line which passes through a non-contact end point B4, and the calculation-grid candidate point CGPP8 is created at the middle point between the points D4 and A4.

Figure 11:
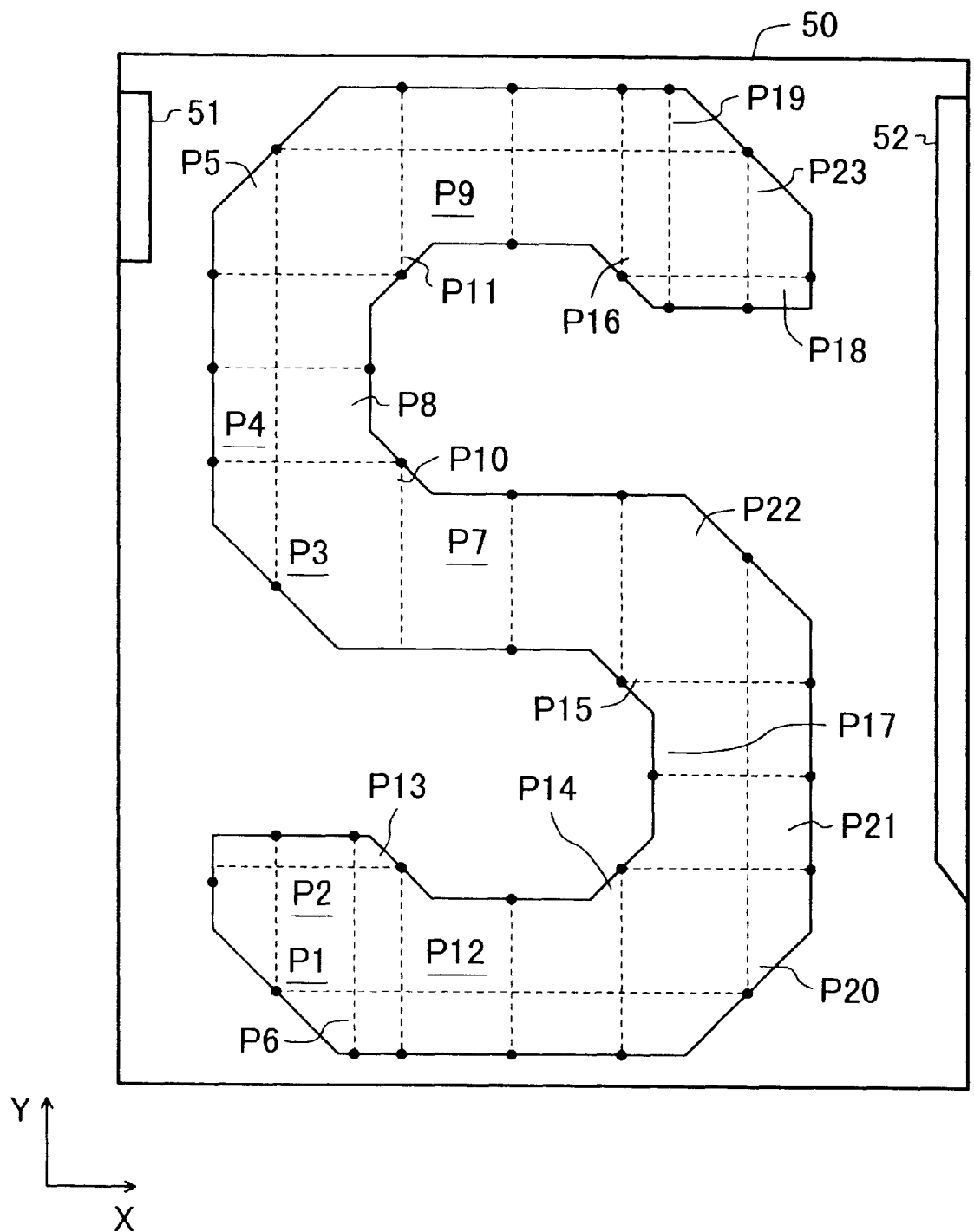
FIG. 11 is an illustration showing a calculation-grid candidate points which have finally been determined.

In such a manner, the calculation-grid candidate points as shown by dots in FIG. 11 are finally determined. Each calculation-grid candidate point coincides with the middle point of an AND part when one of non-contact parts of a side pair which are opposite with each other on the outline of an OR pattern is projected on the other side.

Note that a side which is opposite with the side P1-1 of FIG. 10 in a Y direction is the side P2-3.

(S47) For each of calculation-grid candidate points on upper and lower sides, a calculation grid is created in a predetermined length with each of the candidate points as its center extending along a Y direction and for each of calculation-grid candidate points on right and left sides, a calculation grid is created in a predetermined length with each of the candidate points as its center along an X direction.

Figure 14A:
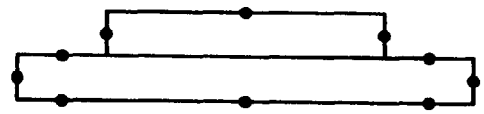
FIGS. 14(A) to 14(C) are respectively illustrations of arrangement of calculation-grid candidate points of other patterns.
Figure 14B:
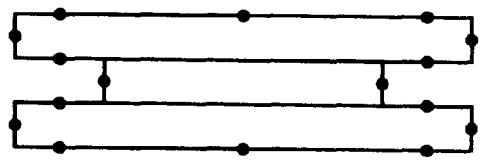
Figure 14C:
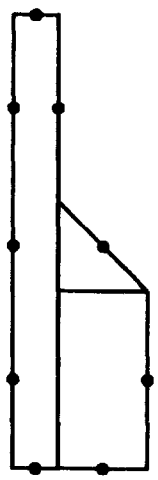
Figure 15A:
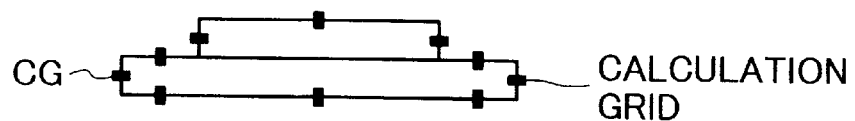
FIGS. 15(A) to 15(C) are respectively illustrations of arrangement, on a pattern, of a calculation grid created corresponding to calculation-grid candidate points of FIGS. 14(A) to 14(C)
Figure 15B:
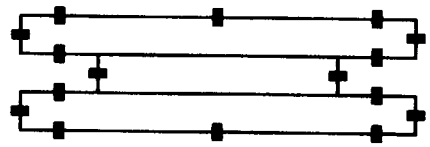
Figure 15C:
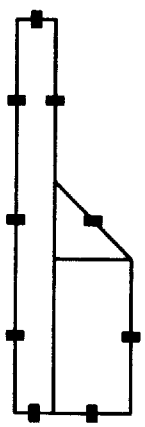

For example, for calculation-grid candidate points as shown in FIGS. 14(A), 14(B) and 14(C), calculation grids as shown in FIGS. 15(A), 15(B) and 15(C) are created.

(S48) Exposure simulation is performed only on each of the created calculation grids.

For example, a relative exposure intensity RE as shown in FIG. 18 is calculated and values of the relative exposure intensity RE between grids are interpolated with a straight line or a curved line, thereby determining coordinates of a point at which RE=1.

In calculation of a relative exposure intensity RE of a grid point GP in FIG. 18, exposure contributions to a calculation-grid candidate point CGPP from various points in all patterns 53, 54 and 55 which are included in a predetermined area with the calculation-grid candidate point CGPP as its center as indicated dotted lines are calculated by the following known equations:

$$RE=(E0/Qth)\int\int(\text{EXP}(-(r0/A)^2)+B\cdot\text{EXP}(-(r0/C)^2))$$
$$dXdY$$
$$+(E1/Qth)\int\int(\text{EXP}(-(r1/A)^2)+B\cdot\text{EXP}(-(r1/C)^2))dXdY+$$
$$(E2/Qth)\int\int(\text{EXP}(-(r2/A)^2)+B\cdot\text{EXP}(-(r2/C)^2))dXdY$$
$$(1)$$

where limits of the first to third definite integrals of the right terms of the above equation are defined by respective areas of the patterns 53 to 55, and the first and second terms of each of the integrals are respectively exposure contributions based on forward scattering and backward scattering. E0 to E2 are respectively the exposures which is set for the patterns 53 to 55 in the basic part of FIG. 6. The constants A, B and C are given numbers. The threshold Qth is the minimum energy value when a comparative large pattern is exposed and it can be developed. Qth is calculated with a constant Eth being given by the following equation:

$$Qth=Eth\int\int(\text{EXP}(-(r/A)^2)+B\cdot\text{EXP}(-(r/C)^2))dXdY$$

where limits of the definite integrals is the area of the exposed pattern.

(S49) For a pair of opposite calculation-grid candidate points (end points of a dotted line of FIG. 11), a drawing pattern width WE and an error ΔWE from a target value as shown in FIG. 18, for example, are calculated and stored in the data base.

By creating calculation grid points at respective representative points as mentioned above, sufficient information on estimated errors can be achieved in a short time on a wafer drawing pattern.

Further, because of the short time, exposure simulation can be performed all over the chip area.

Figure 16:
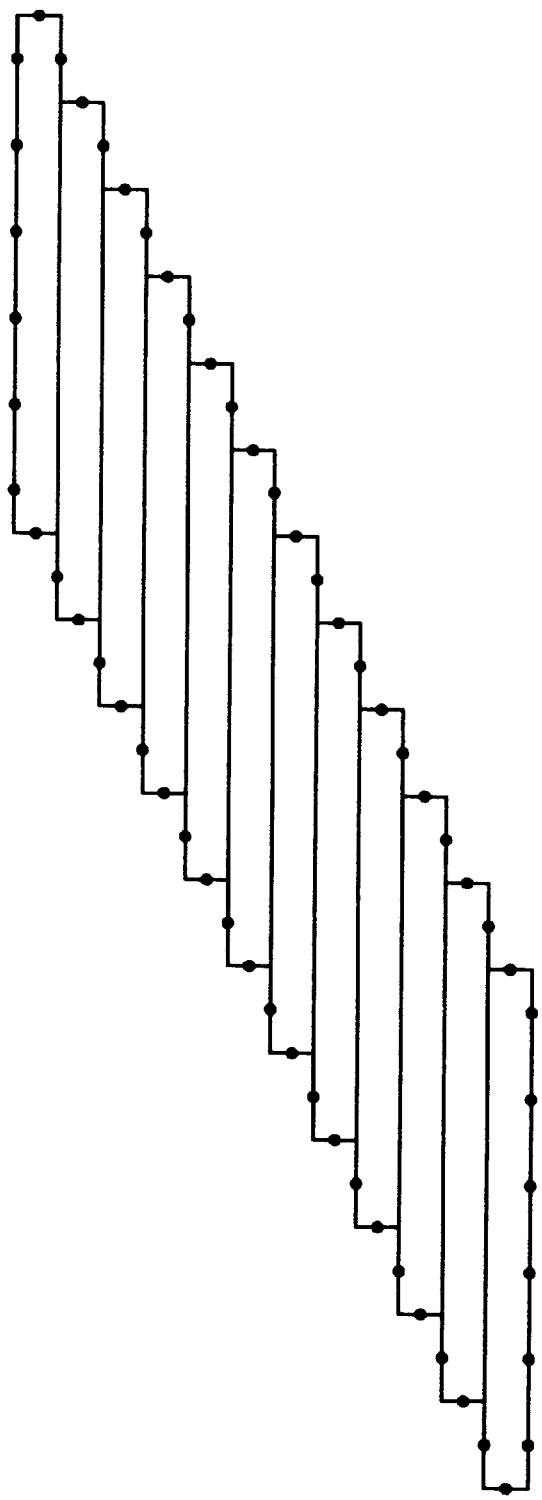
FIG. 16 is an illustration of arrangement, on a pattern, of calculation-grid candidate points for strip-like patterns.
Figure 17:
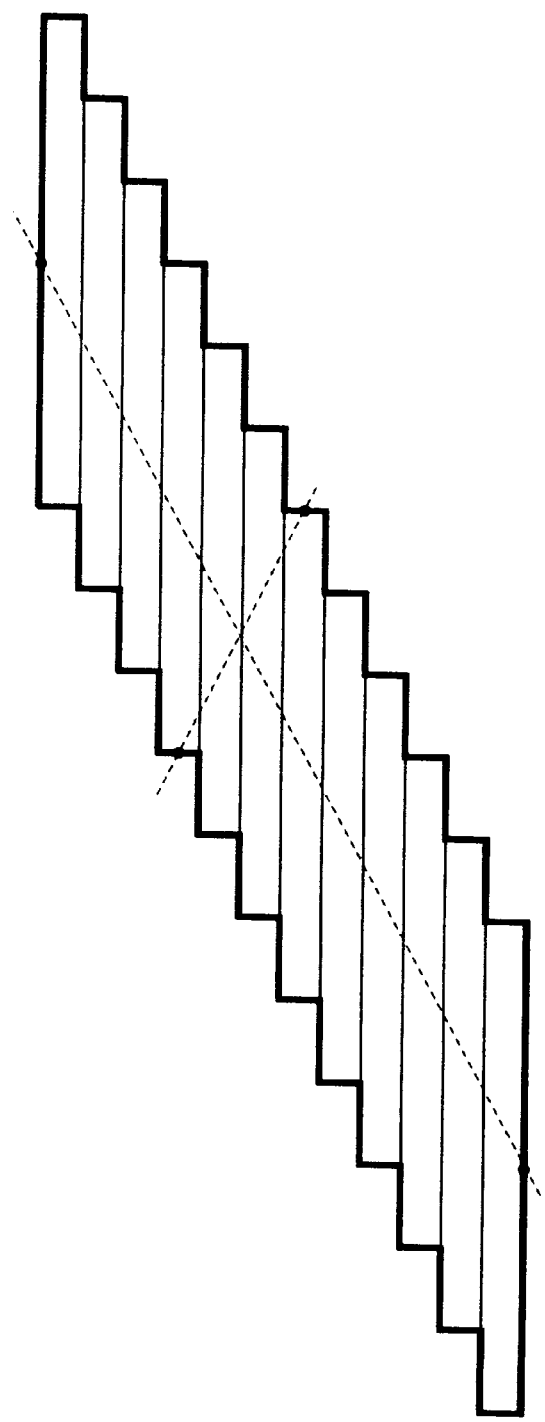
FIG. 17 is an illustration of a method of determining another calculation-grid candidate points for a strip-like pattern.

For a strip-like pattern which is composed of a group of adjacent strips with sequential downward shifts in a uniform manner across a side as shown in FIG. 16, a processing speed is a little slowed down since there are many grid candidate points. In order to reduce the number of grid candidate points in this case, when pattern decomposition is performed in step S02 of FIG. 1, a flag indicating that the pattern is a strip-like pattern is set. In the processing, if this flag is set, as shown in FIG. 17, a side of a stair like outline are regarded as one side and the middle points of the sides are regarded as new grid candidate points, and calculation grids may be created on each line which connects the grid candidate points on opposite sides.

2-2. Display of Exposure Simulation Result

Figures 20A, 20B:
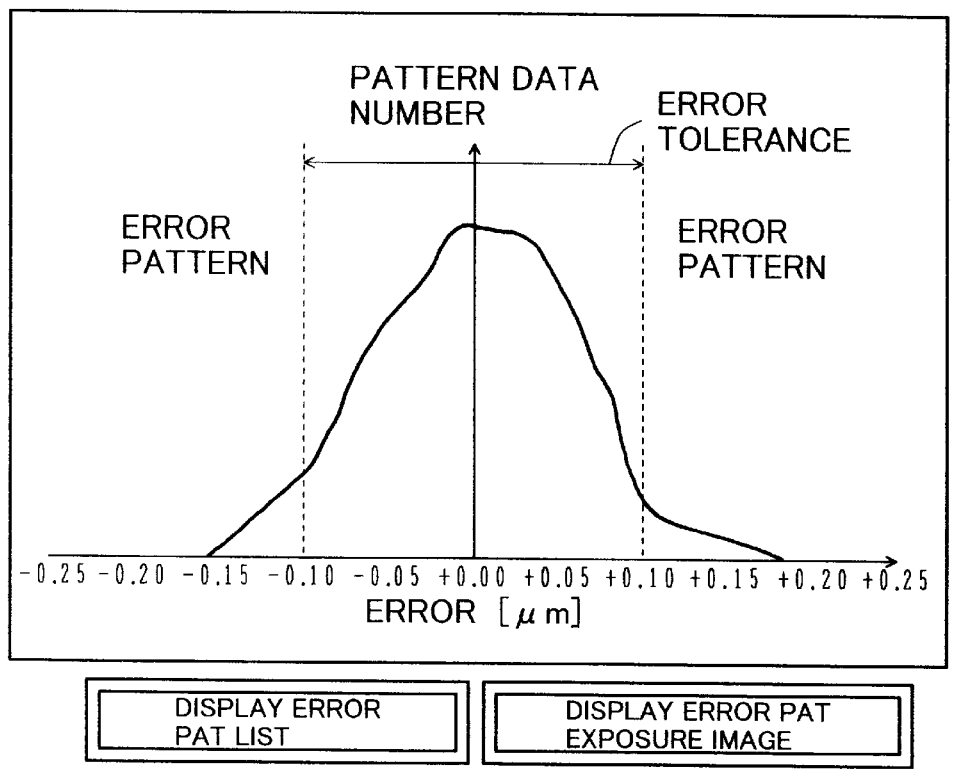
FIG. 20(A) is a histogram showing a pattern precision distribution obtained in exposure simulation, wherein the abscissa is assigned to an error of a predictive width from a target value.
FIG. 20(B) is an illustration showing a list of error patterns whose errors fall outside the tolerance range.
Figure 21B:
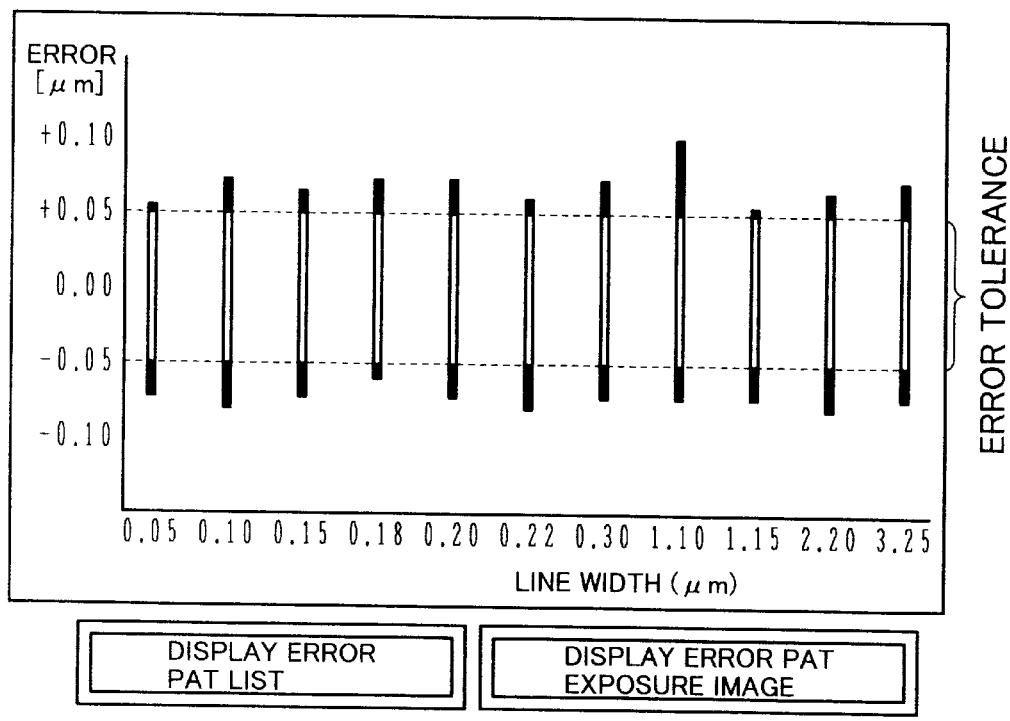
FIG. 21(B) is an illustration showing a list of error patterns which fall outside the tolerance range.

When exposure simulation is performed all over the chip or more than a predetermined area, by pressing the DISPLAY PRECISION DISTRIBUTION button 33 of FIG. 4, step S15 of FIG. 3 is processed and a display of FIG. 20(A) or FIG. 21(A) is presented according to selection of a display format.

The abscissa of the graph in FIG. 20(A) is assigned to an error (estimated error) of a pattern width and the ordinate is assigned to a frequency. A range within dotted lines is a tolerance of error.

With this graph, a rough idea on whether a wafer exposing pattern is acceptable can quickly be attained with ease.

By pressing the DISPLAY ERROR PATTERN LIST button, a list of errors outside the tolerance is displayed as shown in FIG. 20(B).

With this display, details of error patterns can quickly known with ease.

Figure 52:
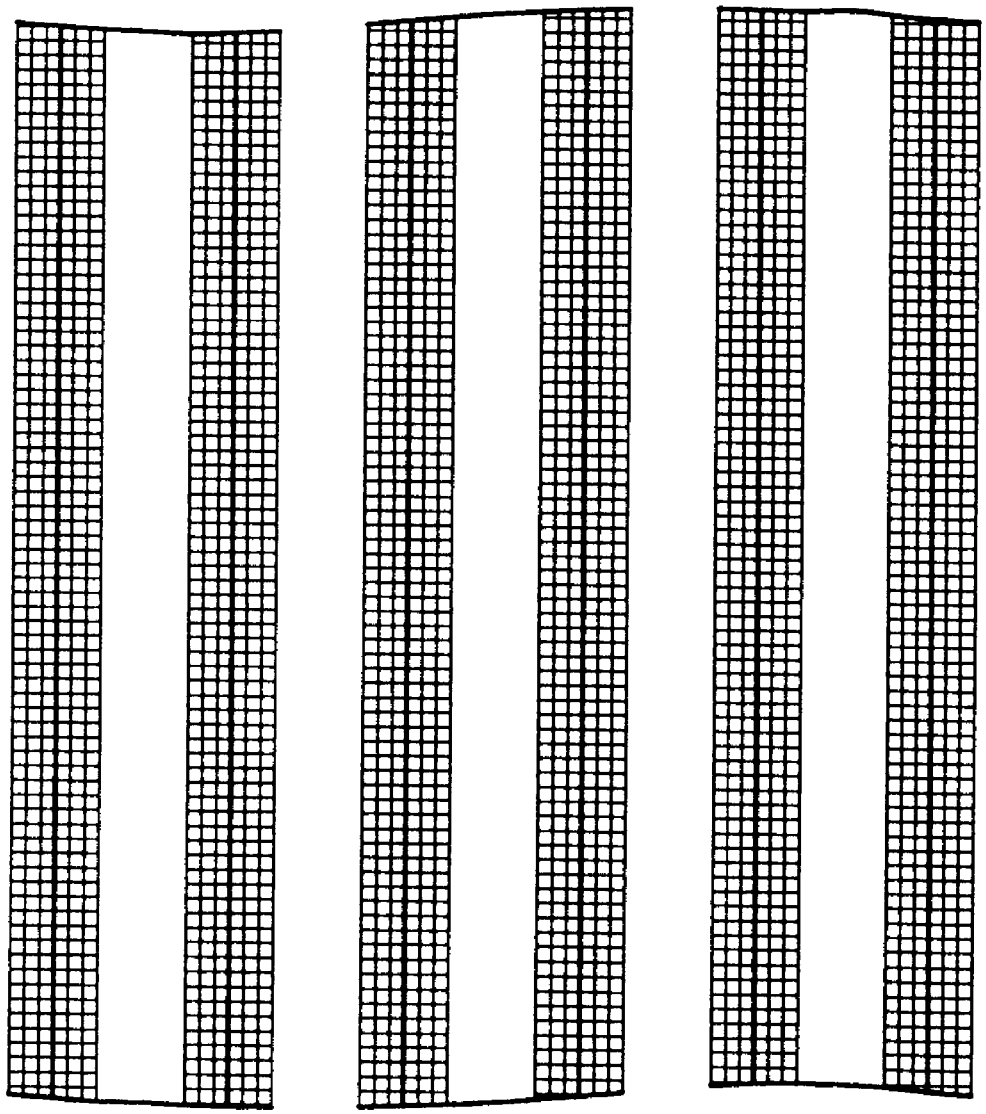
FIG. 52 is an illustration of arrangement of a prior art calculation grid for exposure simulation in a designated area.
Figure 53:
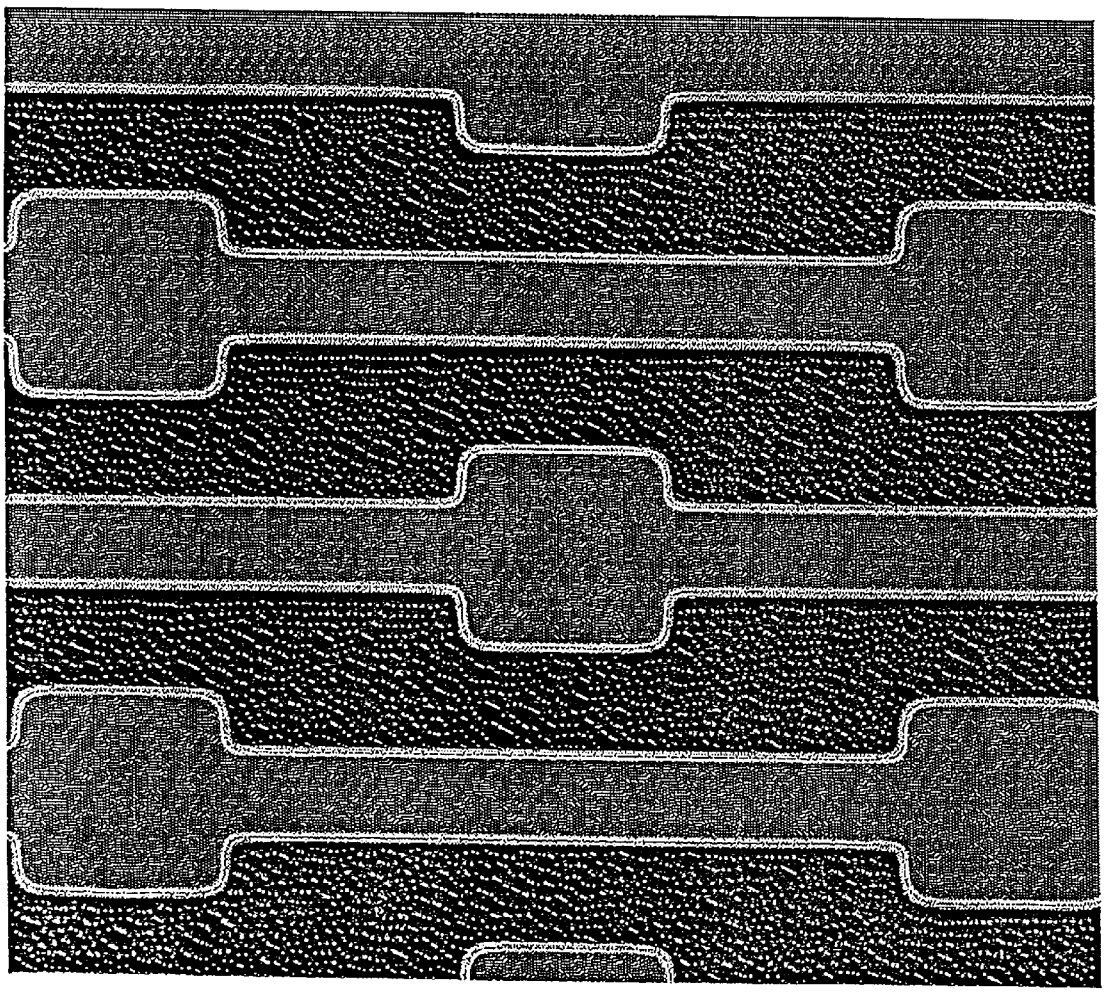
FIG. 53 is an exposure image showing a prior art exposure simulation result.
Figure 54:
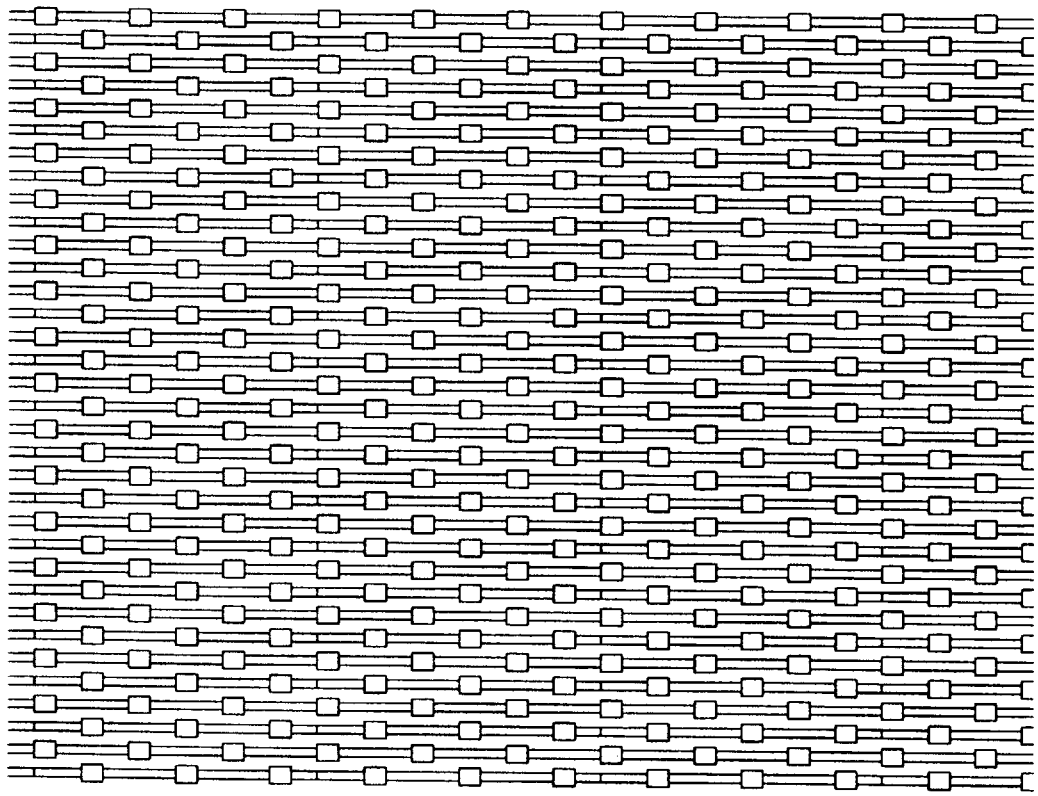
FIG. 54 is an illustration of a wafer-exposing pattern.
Figure 55:
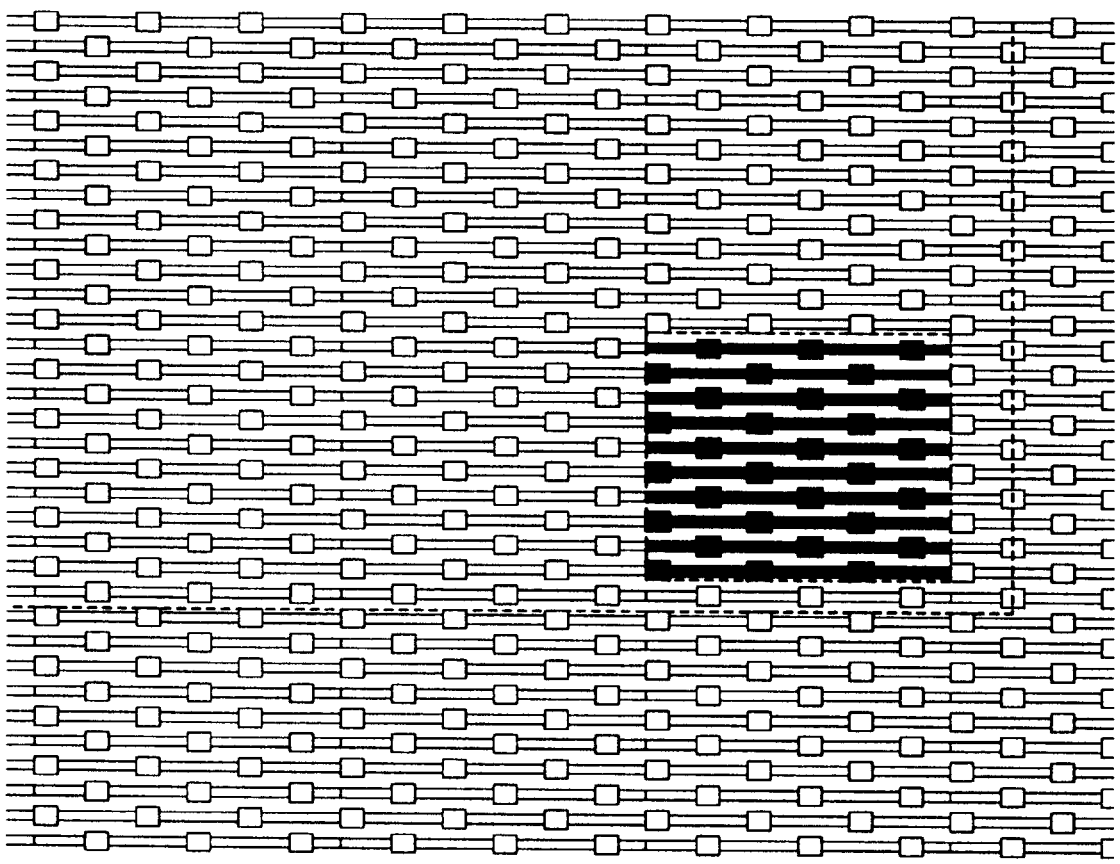
FIG. 55 is an illustration showing a prior art block pattern which is displayed in a different color when designating a point on a screen with a mouse on which the pat tern of FIG. 54 is displayed.

In the case where details of an error pattern are desired to be known without limiting to the above described representative points because of requirement for high precision of the pattern, a row in the list is selected, for example a mouse is pointed at the row and clicked thereon and the DISPLAY ERROR PATTERN EXPOSURE IMAGE button of FIG. 20(A) is pressed. With the operation, a calculation grid as shown in FIG. 52, as is prior art, is created in a predetermined area around the error pattern as its center and exposure simulation is performed, thereby displaying an exposure image as shown in FIG. 53.

With the additional exposure simulation, details of only an error pattern which is especially required for high precision can be achieved. When a line width dispersion-distribution display is selected, the maximum positive error and the maximum negative error of each line width are displayed in a bar graph as shown in FIG. 21(A). A range which is indicated by dotted lines is a tolerance.

With the operation, a rough idea is attained on whether or not a wafer-exposing pattern is acceptable for each line width with ease and quickness.

Processing when two buttons under the graph are pressed are same as the above described.

2-3. Exposure Data Modification Based on Exposure Simulation Result

Figure 22:
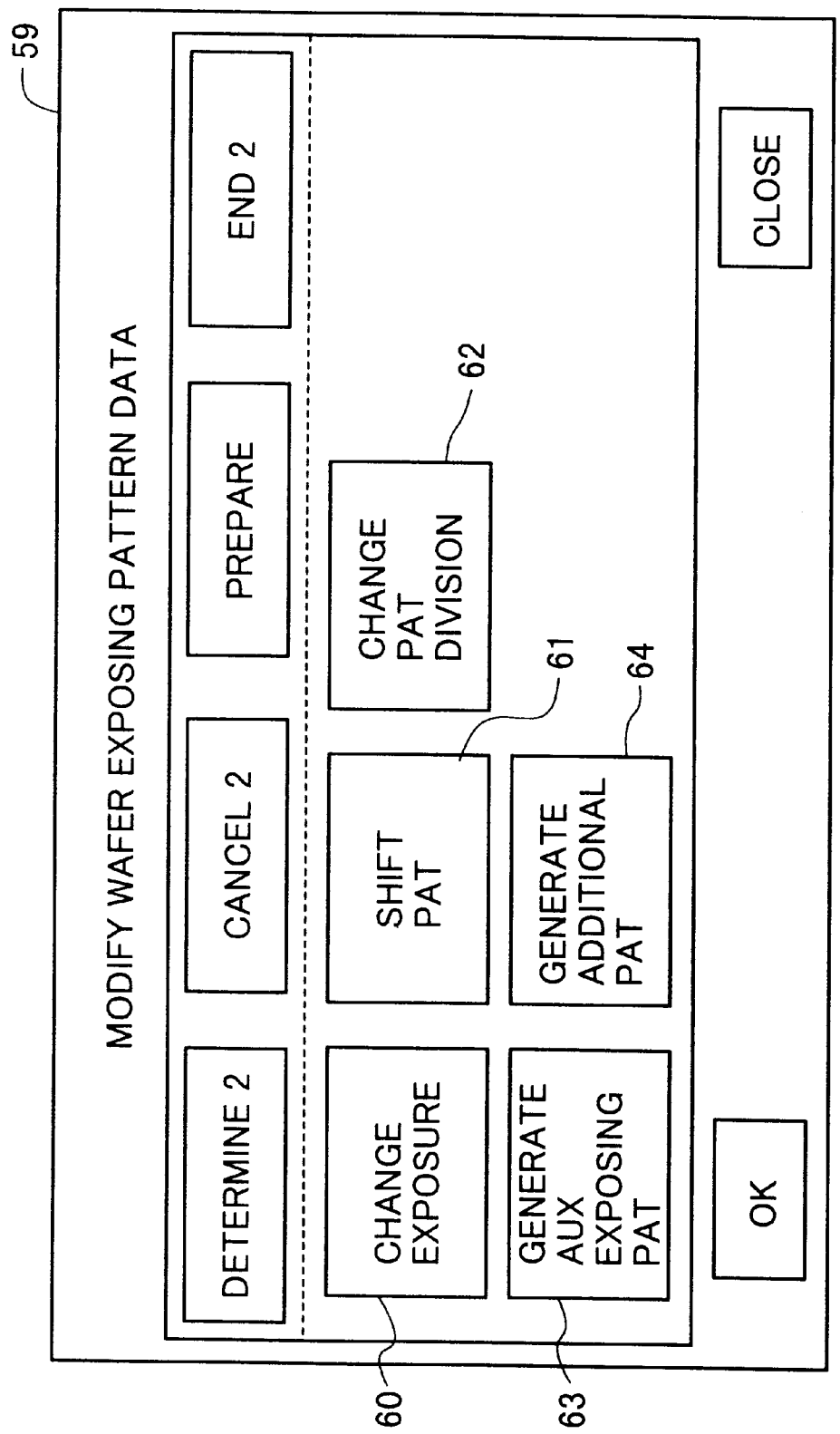
FIG. 22 is an illustration of a pattern modification dialog box, in which command buttons are arranged, displayed when pressing a MODIFY PATTERN DATA button in FIG. 4(B)

If an operator judges that exposure data should be modified by looking at a result of exposure simulation as mentioned above, the operator presses the MODIFY PATTERN DATA button 35 of FIG. 4. With the operation, processing in step S17 of FIG. 2 begins and a pattern modification dialog box 59 with arrangement of a command button train as shown in FIG. 22 is displayed on the screen.

A method of wafer exposing pattern data is selected by pressing the CHANGE EXPOSURE button 60, the SHIFT PATTERN button 61, the CHANGE PATTERN DIVISION button 62 and the GENERATE AUXILIARY EXPOSURE PATTERN button or the GENERATE ADDITIONAL PATTERN button 64. Then, the modifications will be briefly described. The modification methods themselves are publicly known.

(1) Change in Exposure

Figure 23:
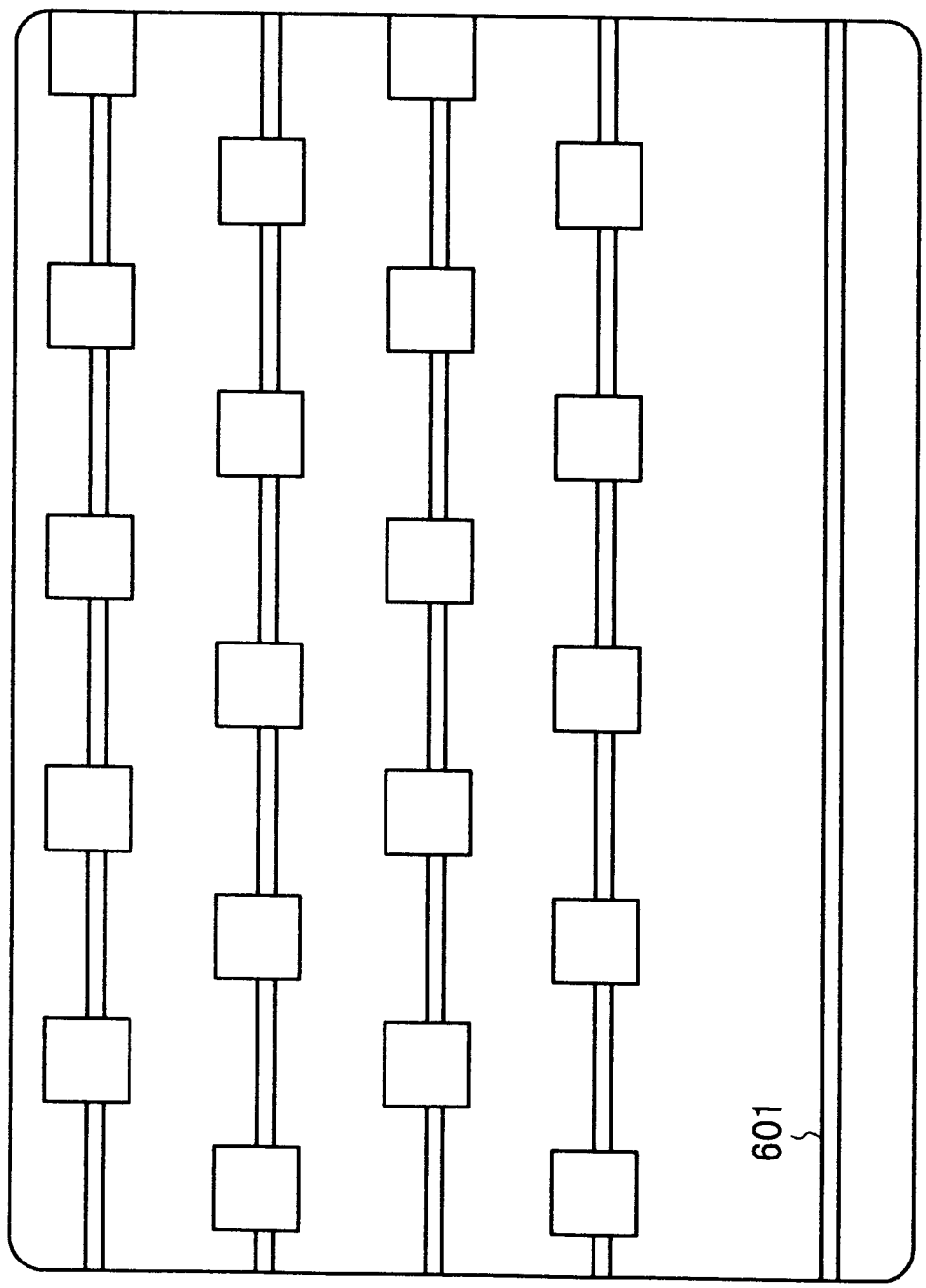
FIG. 23 is an illustration showing an example of object for pattern data modification by a change in exposure.

When a width of the interconnection pattern 601 is narrower than a target value since a fine interconnection pattern 601 is arranged spaced away from a repetition pattern as shown in FIG. 23, an exposure in the basic part of FIG. 6 is increased. On the contrary, when the interconnection pattern is thick since the pattern is located excessively close to the repetition pattern, an expolsure is reduced.

(2) Pattern Shift

Figure 24A:
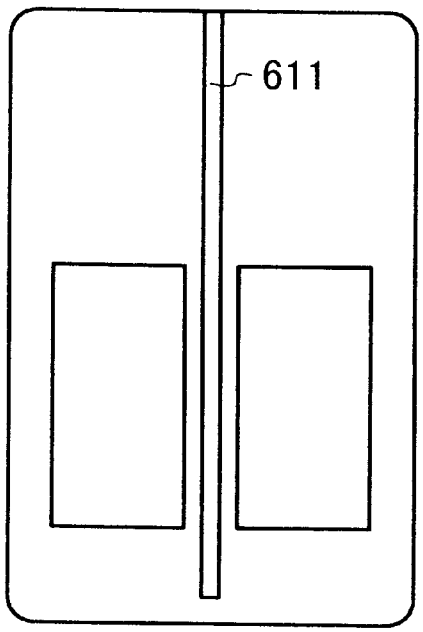
FIG. 24(A) is an illustration showing an example of object for pattern data modification by pattern shift.
Figure 24B:
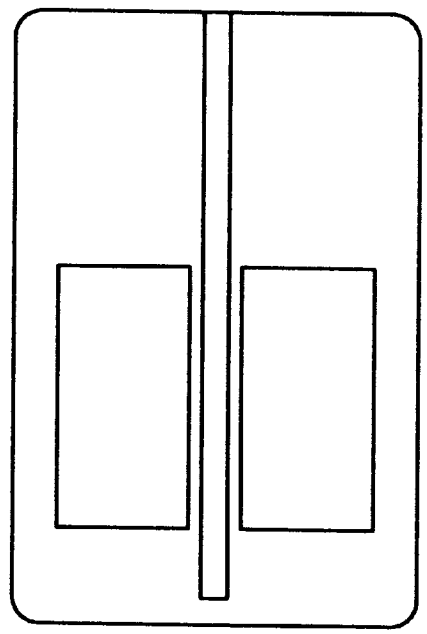
FIGS. 24(B) and 24(C) are illustrations showing shifted patterns of the object.
Figure 24C:
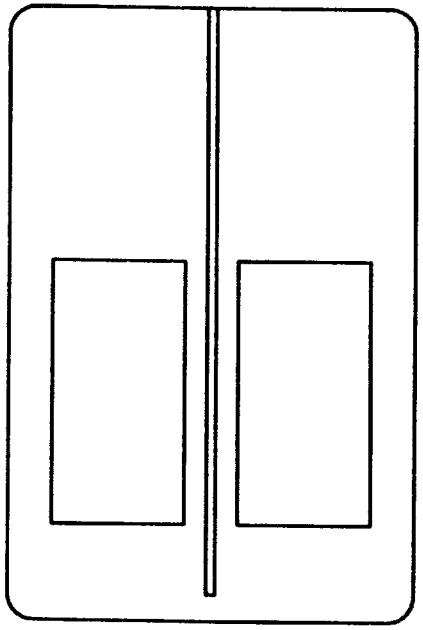

When there are areas with a high pattern area density and a low pattern area density in the vicinity of the interconnection pattern 611, if the interconnection pattern 611 is required to be thicker since the area with a low pattern area density is excessively narrower, the pattern width W in the basic part of FIG. 6 is increased so that the interconnection pattern 611 is increased in width as shown in FIG. 24(B). On the contrary, if the interconnection pattern 611 is required to be narrower since the area with high area density is excessively thicker, the pattern width W is reduced as shown in FIG. 24(C).

(3) Auxiliary Exposure

Figure 25A:
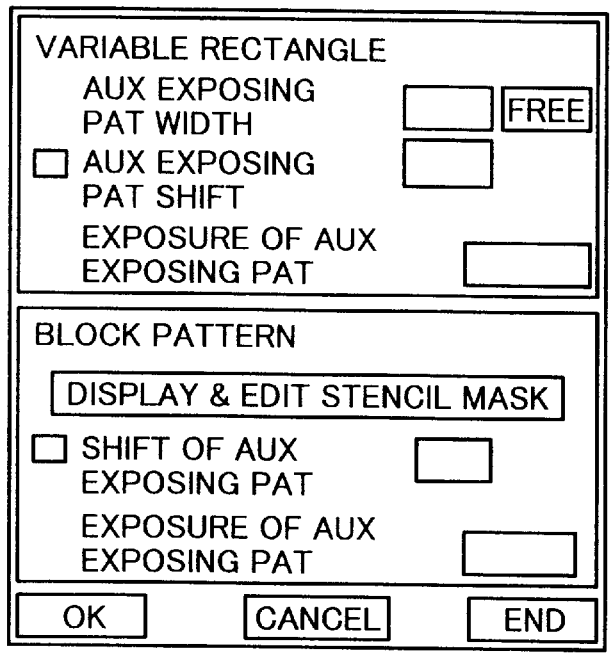
FIG. 25(A) is a dialog box which is displayed when pressing the GENERATE AUXILIARY EXPOSURE PATTERN button in FIG. 22(A)

When the GENERATE AUXILIARY EXPOSURE PATTERN button 63 in FIG. 22 is pressed, a dialog box as shown in FIG. 25(A) is displayed.

Auxiliary exposure is to make a to-be-modified pattern thicker by creating an auxiliary exposing pattern for an area with a low pattern area density and superposing the pattern on the to-be-modified. An auxiliary exposing pattern is of a variable-shaping type or a block type. A rectangular auxiliary exposing pattern is determined by a position, a size and an exposure thereof.

Figure 25B:
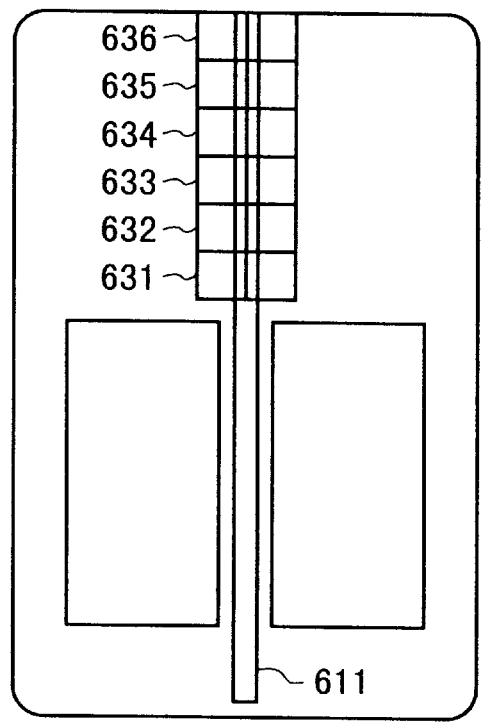
FIG. 25(B) is an illustration of a pattern showing pattern data modification by auxiliary exposing pattern generation.

For example, when only a part with a low pattern area density of the interconnection pattern 611 of FIG. 24(A) is desired to be thicker, as shown in FIG. 25(B), rectangular auxiliary exposing patterns 631 to 636 are superposed on the part and thereby the object is achieved.

Figure 26A:
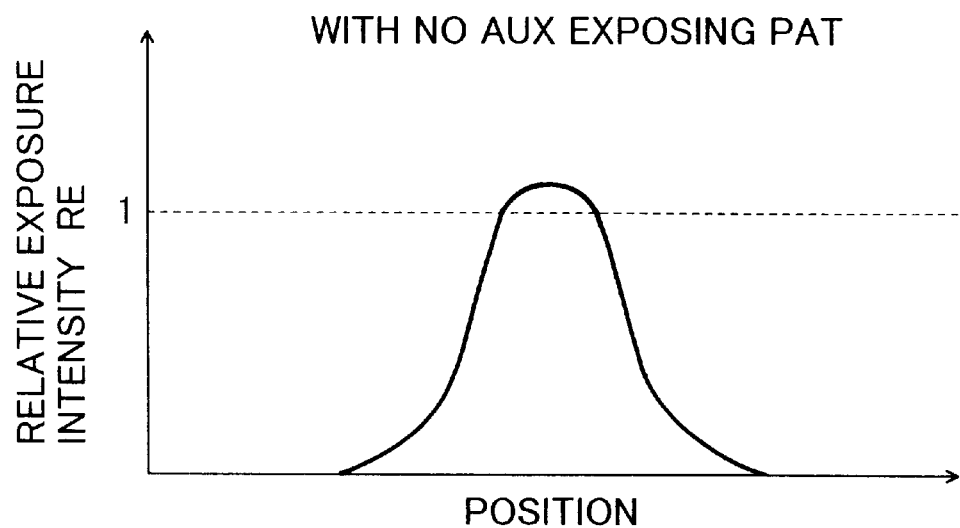
FIGS. 26(A) and 26(B) are graphs respectively showing relative exposure intensity distributions on a line traversing a pattern before and after the auxiliary exposure.
Figure 26B:
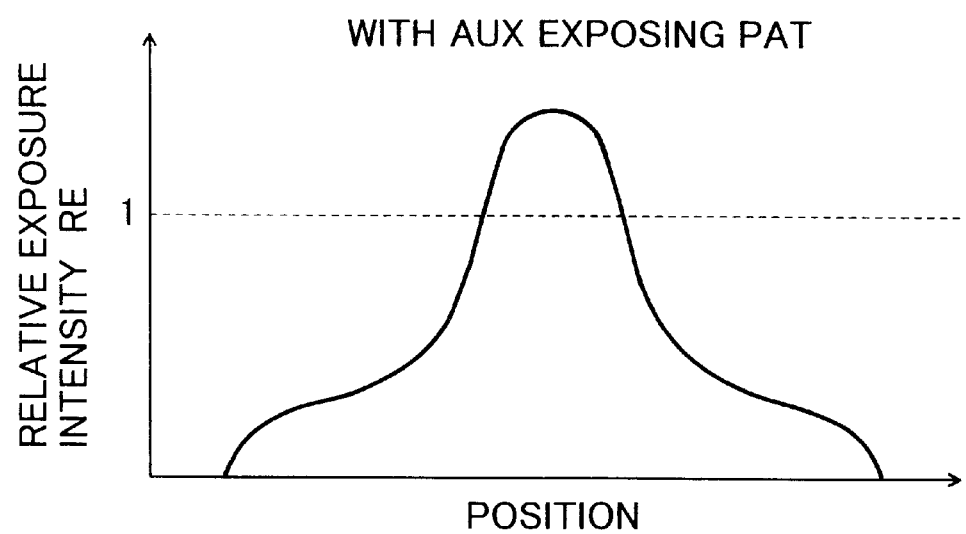
Figure 27:
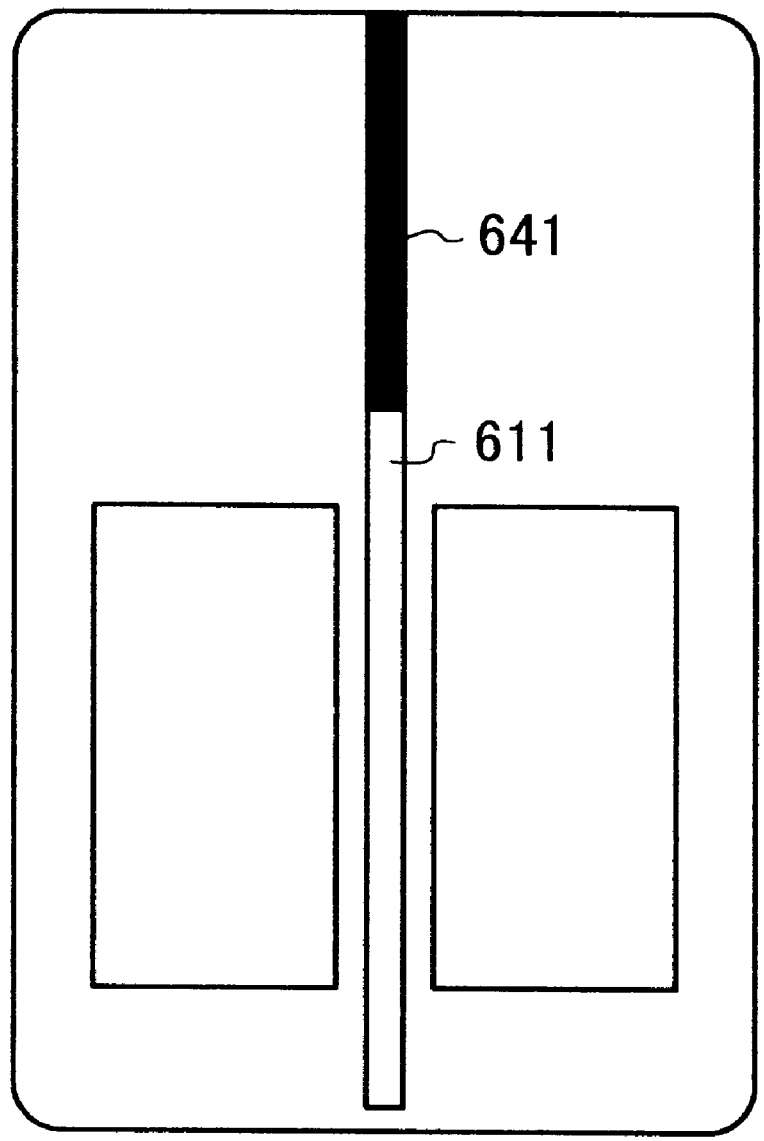
FIG. 27 is an illustration of a pattern showing pattern data modification by additional pattern generation.

FIGS. 26(A) and 26(B) respectively are graphs each showing a relative exposure intensity distribution on a line which traverses the pattern before and after application of the auxiliary exposure.

When auxiliary exposure is performed with a block pattern, a stencil mask is displayed by pressing the DISPLAY & EDIT STENCIL MASK button in FIG. 25(A) and a manual input apparatus 11 of FIG. 2 is operated to prepare an auxiliary exposing pattern in a empty block. After preparation of the pattern, if the position of the pattern is required to be displaced, a shift is written in a block auxiliary exposing pattern shift input box of FIG. 25(A).

(4) Additional Pattern

In order to increase connection precision at a boundary between fields or subfields which are of deflector scanning ranges, an additional pattern is created and is superposed on a pattern in a boundary portion between fields or subfields to make the pattern thicker. For example, an additional pattern 641 is created on a part with a low pattern area density of the interconnection pattern 611 in the boundary portion for pattern superposition to make the pattern part thicker, thereby improving the connection precision.

(5) Change in Pattern Division

A way of dividing a pattern is changed while the shape of an OR pattern is kept same.

Figure 28A:
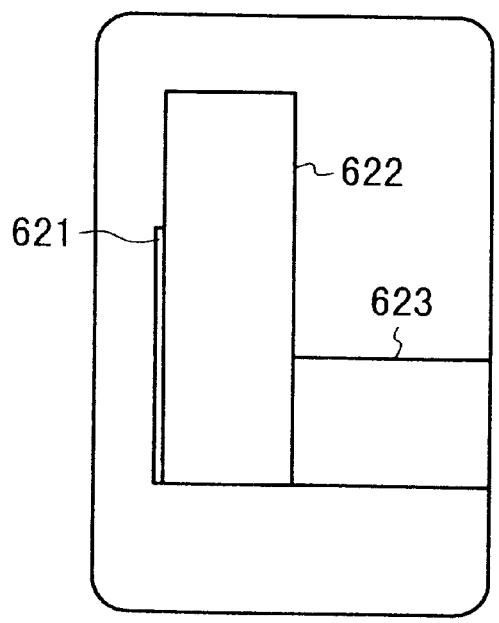
FIGS. 28(A) and 28(B) are illustrations of patterns respectively before and after a change in pattern division.
Figure 28B:
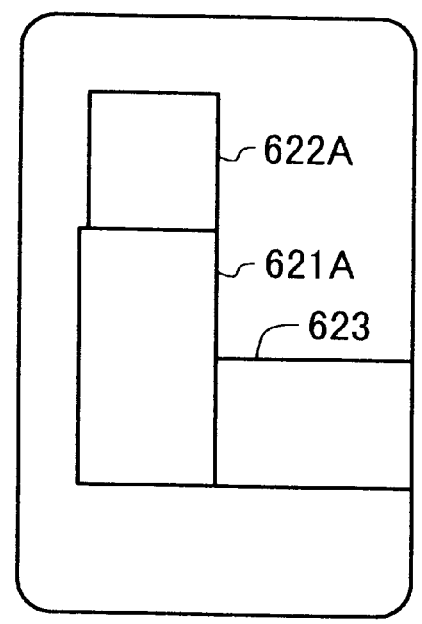

When a small width pattern and a large width pattern is in contact to each other, for example, a pattern 621 with a width of 5 nm and a pattern 622 with a width of 5 $\mu$m are in contact to each other as shown in FIG. 28(A), the pattern 621 is excessively thicker by a proximity effect. In this case, by changing pattern division from a combination of the pattern 621 and 622 to a combination of patterns 621A and 622A as shown in FIG. 28(B), the pattern 621 with a small width is erased.

Figure 29A:
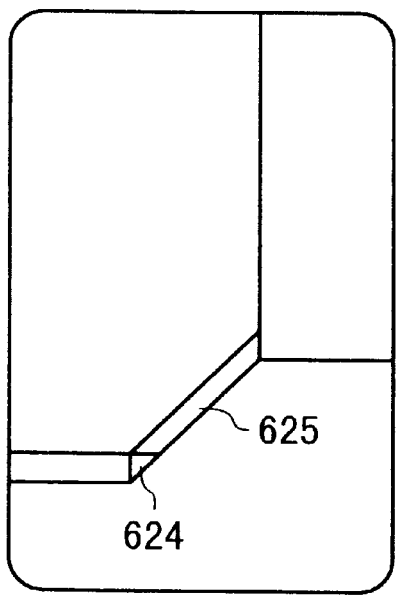
FIGS. 29(A) and 29(B) are illustrations of patterns respectively before and after another change in pattern division.
Figure 29B:
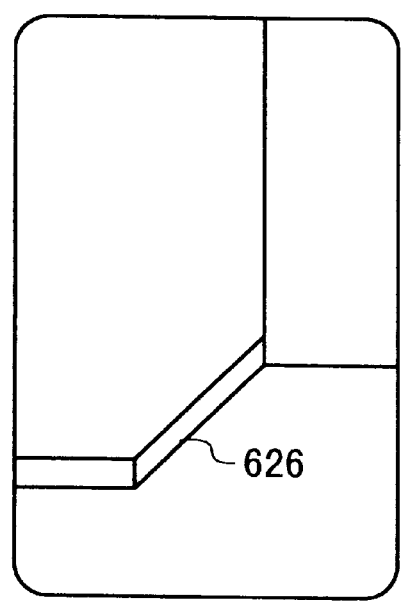

When a small pattern 624 is in contact to a pattern 625 as shown in FIG. 29(A) as another example, a combination of the patterns 624 and 625 is changed to a single pattern 626 as shown in FIG. 29(B). With the change in pattern division, excess in width of a drawing image of the pattern 624 can be reduced.

When a pattern on which the above described modification has been applied is as one in repetition arrangement, that is when there is available information in the pattern data on a repetition pitch in X and Y directions and the number of repetitions of the patterns, if the OK button in FIG. 22 is pressed, not only are patterns in repetition arrangement displayed on the screen, but there is displayed a dialog in which it is selected whether only a pattern which has been modified is modified, or all or part of patterns in repetition arrangement each same as the pattern which has been modified in the same subfield as that in which the modified pattern resides are modified and the dialog is responded.

When the same subfields each as the subfield in which the modified pattern resides are repeatedly arranged with patterns, that is when there is available information on repetition arrangement similar to the above described case, not only are subfields in repetition arrangement further displayed on the screen, but there is displayed a dialog in which it is selected whether modification is performed on all the subfields in repetition arrangement in a similar way to that of the response and the dialog is responded.

Such processing is similar in the case of modification of a block pattern on a stencil mask, which will later be described, and the processing is applied for collective modification with good efficiency.

There is a case where collective modification is better to be avoided according to the position of a pattern in repetition arrangement since the pattern area density in the position is different from the other areas.

2-4. Automatic Width Measurement

According to the method of FIG. 5, outlines of a drawing precision can be attained all over the chip or in a designated area in an effective manner with a small volume of calculation. However, the drawing pattern width of a designated area in which precision is especially required is not always measured. Further, there is a case where it is sufficient to achieve only the drawing pattern width of a specific area.

Figure 30:
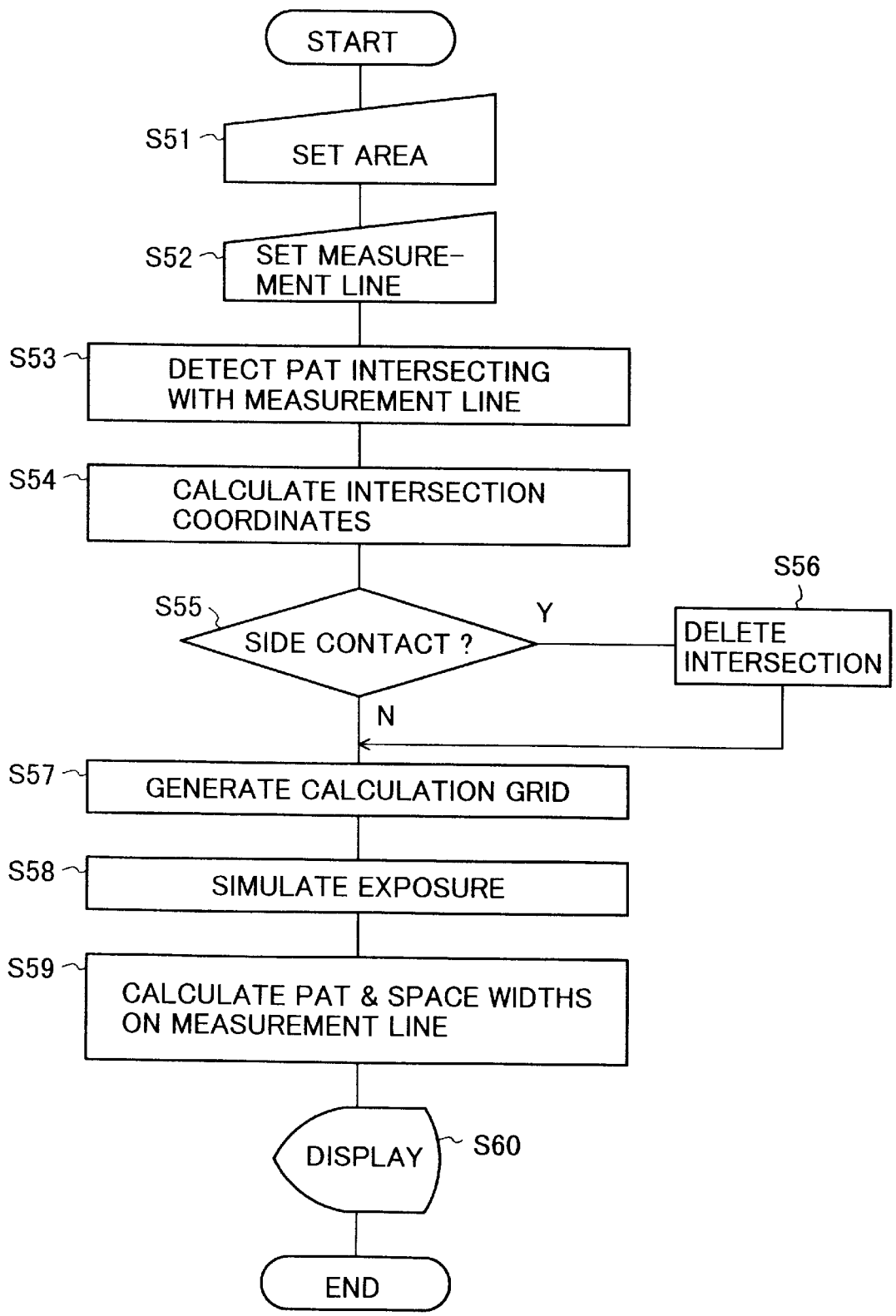
FIG. 30 is a flow chart showing a procedure of automatic width measurement.

FIG. 30 is a flow chart showing a procedure of an automatic width measurement which solves such a problem and meets such a requirement. While the method is applicable to a block pattern as well, a case where the method is applied to a wafer-exposing pattern will be described below.

(S51) A region is set which includes an area in which a pattern width and a space width between patterns in a wafer exposing pattern on the screen is desired to be achieved.

Figure 31:
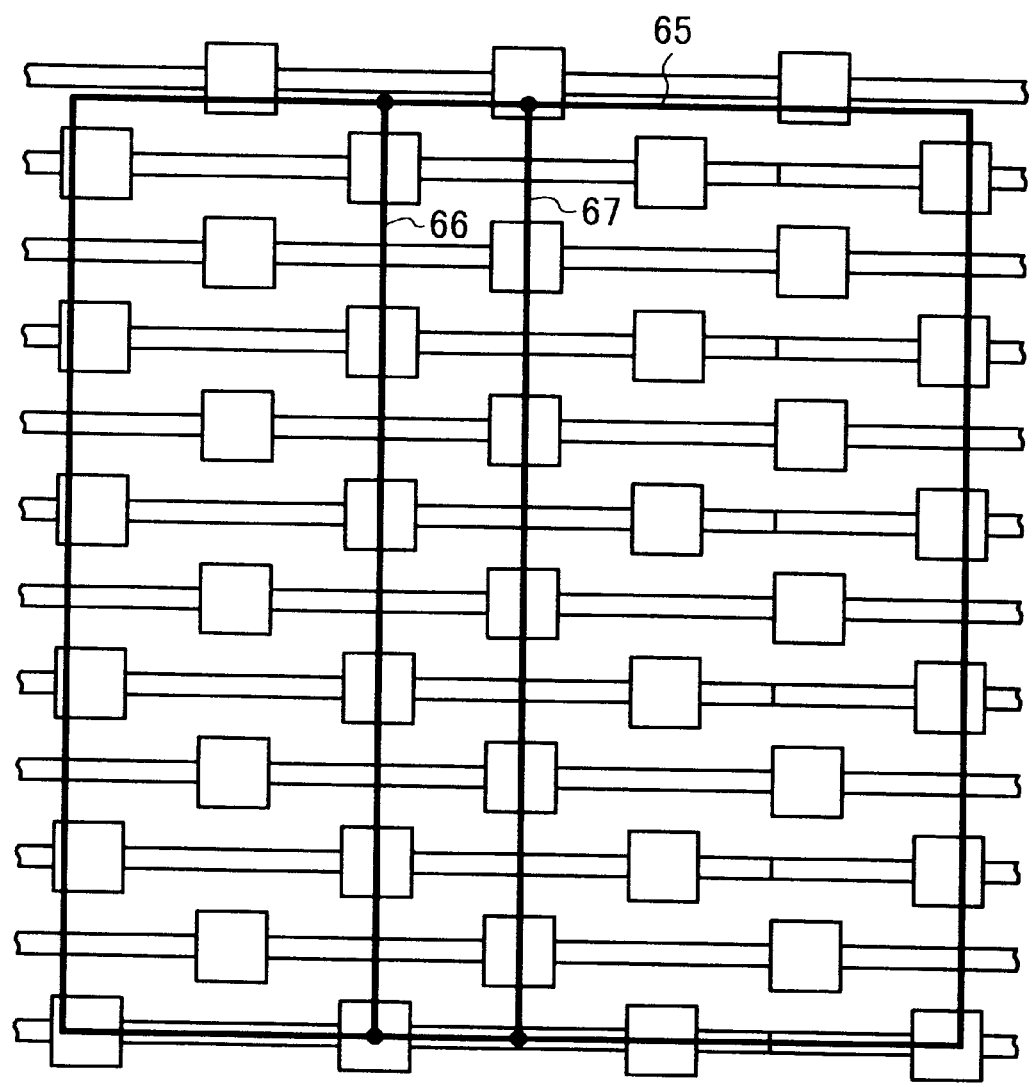
FIG. 31 is an illustration of steps S51 and S52 of FIG. 30.

For example, a pair of opposite vertices is designated and a frame 65 is set as shown in FIG. 31.

(S52) Then, a measurement line which passes through the area in question is set in the region.

For example, width measurement lines 66 and 67 shown in FIG. 31 are set by designating two points. The measurement lines may obliquely set. Further, an end point thereof is not necessarily required to reside on the frame 65. When a measurement line is set so that the line outwardly extends beyond the outline of the frame 65, an intersection between the measurement line and the frame 65 is used as an end.

(S53) Data of a pattern which intersects with the measurement line is searched out.

(S54) Coordinates of the intersection between the measurement line and the pattern are calculated.

Figure 34:
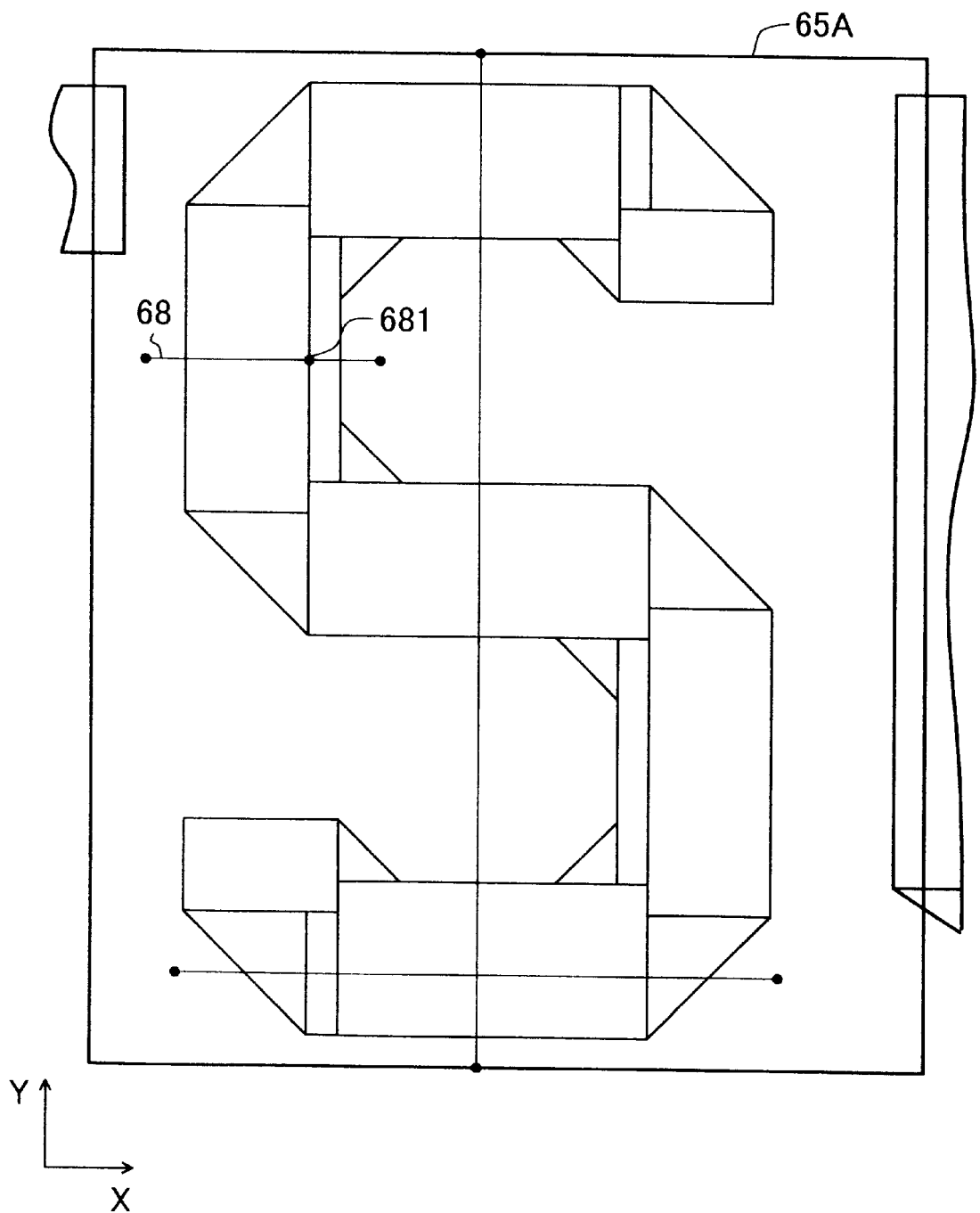
FIG. 34 is an illustration of steps S55 and S56 of FIG. 30.

(S55, S56) When more than two sides of patterns are available in one intersection area, since an intersection is not corresponds to an edge of a drawing pattern, the intersection is deleted. For example, in FIG. 34, an intersection 681 on a width measurement line 68 which is drawn in a frame 65A is deleted.

(S57) A calculation grid which is laid out along the measurement line as mentioned above is generated with an intersection which is left not deleted as its center.

(S58) A relative exposure intensity RE at each of grid points on the calculation grid is calculated as mentioned above. In this case, in order to avoid precision of a relative exposure intensity calculation in the inner peripheral area of the frame 65 from being reduced, a relative exposure intensity is calculated in consideration of exposure contribution from not only patterns in the frame 65 but patterns in a predetermined area outside the frame 65, for example patterns in the area whose outermost edge of 20 μm outside the frame 65.

(S59) The width WE of a drawing pattern and the space width between patterns as shown in FIG. 18 are calculated.

(S60) A calculation result is displayed on the screen.

Figure 32:
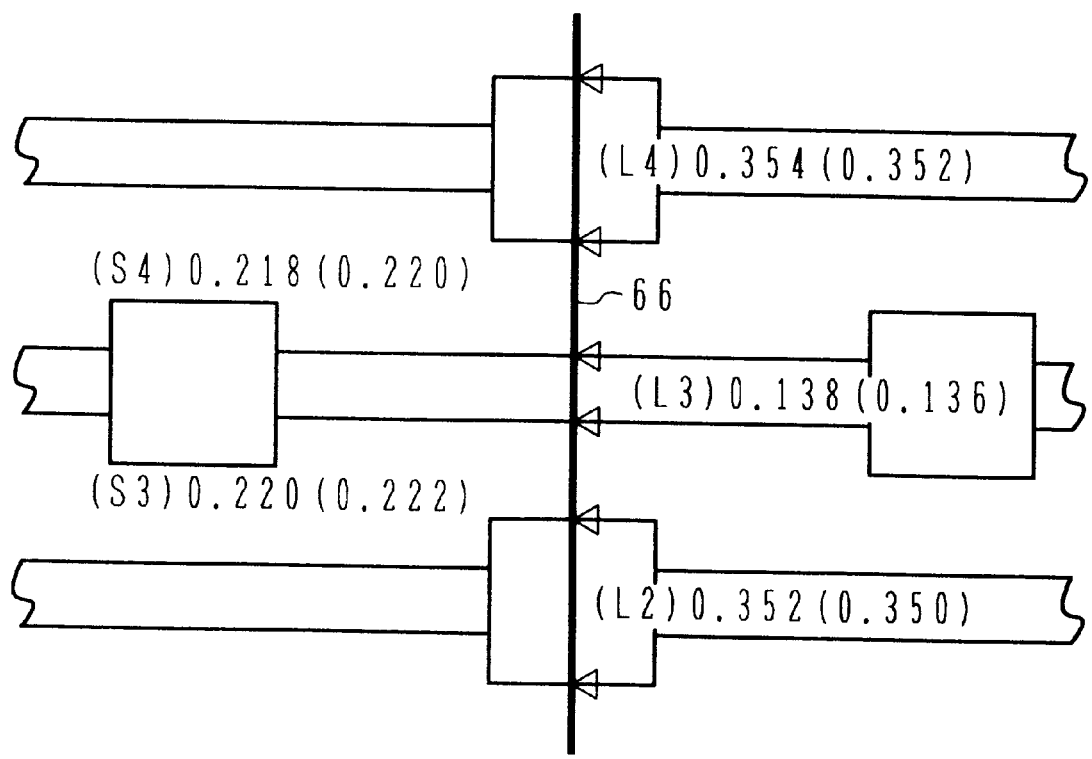
FIG. 32 is a partially enlarged illustration of step S60 of FIG. 30.
Figure 33:
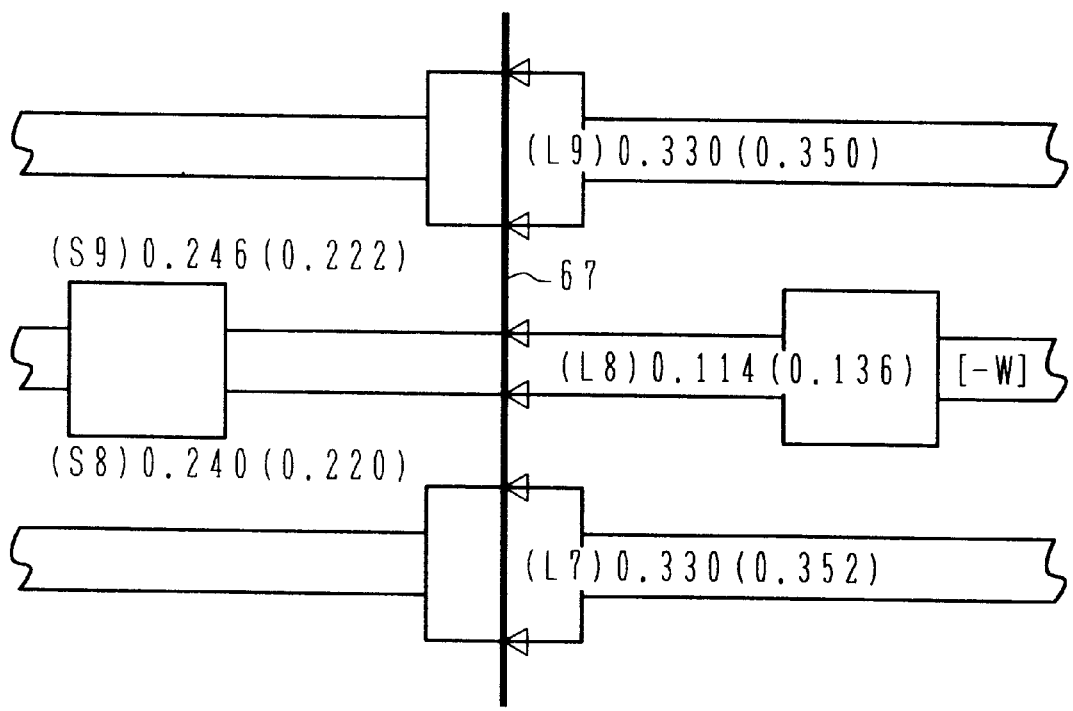
FIG. 33 is a partially enlarged illustration of step S60 of FIG. 30.

FIGS. 32 and 33 are partially enlarged illustrations showing examples of measurement result display. In the illustrations, lines L2 to L4 and L7 to L9 show the widths of drawing patterns and S3, S4, S8 and S9 show space widths. Further numerical values in or outside parentheses respectively show a target value and a measurement value (predictive value) by simulation. The unit of the numerical value is μm. [−W] indicates that a measurement value obtained by simulation falls outside tolerance limits in the negative direction. When a measurement value falls outside tolerance limits in the positive direction, the value is indicated as [+W].

Note that it is allowed to automatically set a measurement region based on a measurement line while omitting steps S51 and S52.

2-5. Area Density

Proximity effect correction in step S03 of FIG. 1 is performed in an approximate manner so that the proximity effect correction is more correctly effected when a pattern area density is closer to a predetermined value in the vicinity of the average thereof in order to perform the proximity effect correction efficiently while contracting a calculation time. Hence, there arises a more necessity for correcting a pattern in an area where a pattern area density is largely remote from the predetermined value.

When a pattern area density is higher than the predetermined value, an exposure is reduced, while when a pattern area density is lower than the predetermined value, a proximity effect correction in step S03 is modified by generating an auxiliary exposing pattern.

A pattern area density is important information for finding out an area where such a modification is required.

Figure 35:
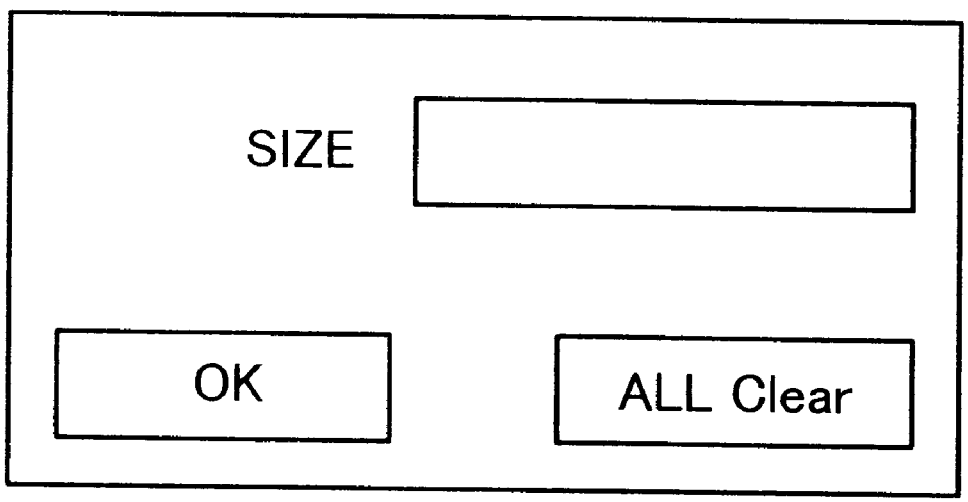
FIG. 35 is an illustration showing a dialog box, which is displayed when pressing the DISPLAY AREA DENSITY button in FIG. 4(B), used for inputting a size of one side of a square which is an area density calculation unit.

When the DISPLAY AREA DENSITY button 30 in FIG. 4(B) is pressed, a dialog, as shown in FIG. 35, for inputting a side size of a square in one of its boxes is shown. In the input box, there is shown a previous value is displayed before the size is changed and when a previous value is not existent, a default value is displayed.

When a mouse is pointed at a wafer exposing pattern which is displayed on the screen and clicked on the pattern, an area density is calculated in an area around the position pointed at by the mouse as a center and information on a pattern area density as shown in FIG. 36 is displayed. At this point, in order that a numerical value can be read and a relation between a pattern and an area density thereof can easily be grasped, a pattern is displayed in a light color. The pattern display can be erased by a command button. A numerical value in a square shows, for example, a ratio of a pattern area to a square area of 5 μm×5 μm in %.

In order that a rough idea on values on a pattern area density can be grasped with ease, the minimum value, maximum value and average value of a pattern area density distribution which has been calculated are displayed on the screen.

By pressing a command button by an operator based on the display result, exposure simulation or automatic width measurement as mentioned above are performed and the above described pattern data modification as mentioned above is further repeated based on the result.

Then, display, inspection and modification of a block pattern on a stencil mask will be described.

3. Display, Inspection and Modification of Block Patterns on Stencil Mask

Figure 37:
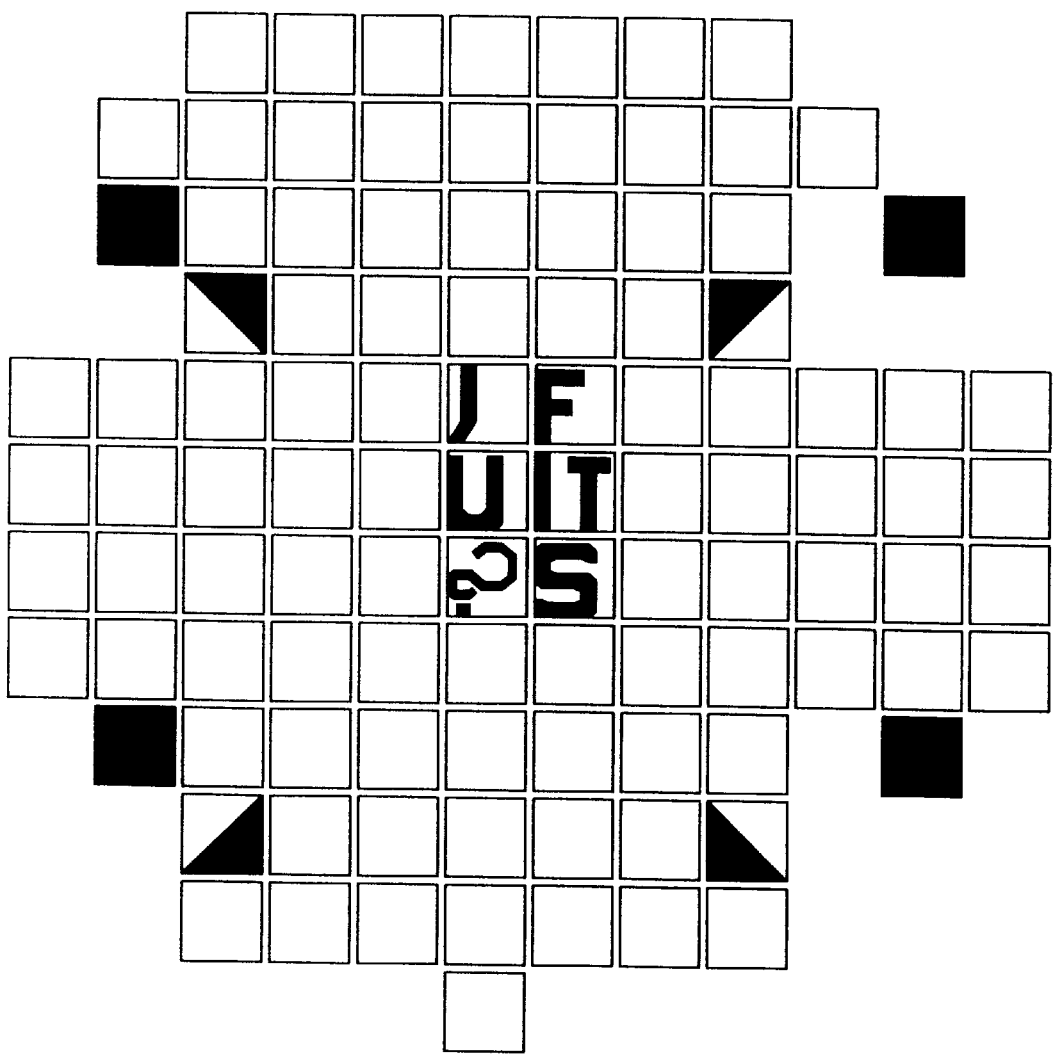
FIG. 37 is an illustration showing block patterns on a stencil mask.

In any of the following process, the CHANGEOVER DISPLAY button 21 is first operated and a display pattern, for example block patterns on a stencil mask as shown in FIG. 37, is presented on the screen as the result of a changeover operation. The block pattern is, for example, a pattern which is extracted in processing of step S01 of FIG. 01. An area which is shown in solid black in FIG. 37 indicates a through hole and a square indicates a block boundary.

3-1. Detection of Block Pattern in Wafer Exposure Pattern

A block pattern on a stencil mask displayed on the screen is pointed at by a mouse and clicked by the mouse thereon, thereby a block pattern is selected and a screen display is changed over to a wafer exposing pattern by the CHANGEOVER DISPLAY button 21. When the DETECT ON-CHIP BLOCK PATTERN ARRANGEMENT button 40 of FIG. 4(B) is then pressed, a selected block pattern which resides in the wafer exposing pattern is displayed in a different way other than the other block patterns, for example the selected block pattern is displayed in an on/off flashing way.

With this display, it is visually recognized where a block pattern is located in a wafer-exposing pattern with ease and quickness.

The DETECT ON-CHIP BLOCK PATTERN ARRANGEMENT button 40 is a hand-reset button and when the DETECT ON-CHIP BLOCK PATTERN ARRANGEMENT button 40 is again pressed, the on/off flashing display is terminated.

3-2. Detection of Blanked-out Pattern in Block Pattern

Figure 40:
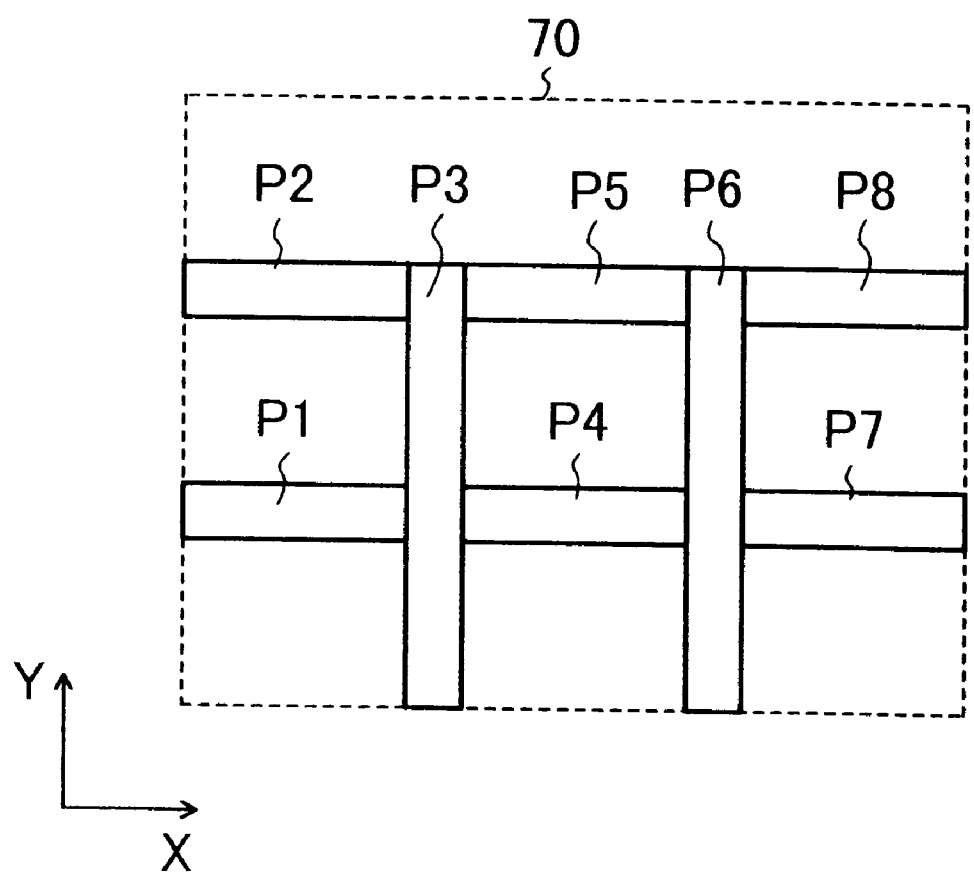
FIG. 40 is an illustration of an example of a block pattern to be subjected to processing of FIG. 39.

When a closed pattern as formed by basic patterns P3 to P6 is included in a block pattern as shown in FIG. 40, since a charged particle beam shield inside the closed pattern falls off, a desired block pattern cannot be drawn. Therefore, such a pattern is required to be detected and modified.

Figure 38:
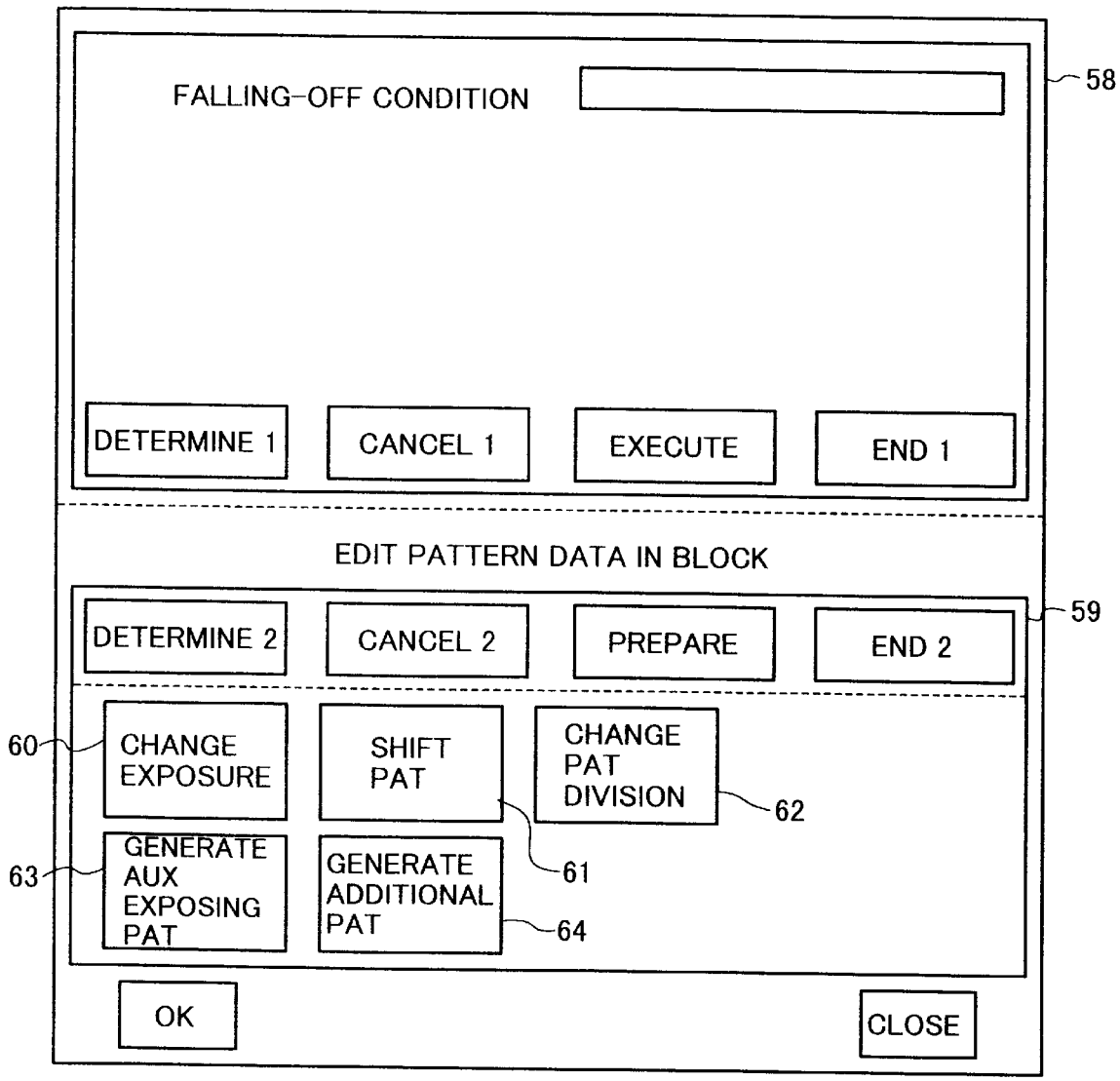
FIG. 38 is an illustration showing a dialog box which is displayed when pressing the DETECT/MODIFY BLANKED-OUT PATTERN button in FIG. 4(B)

When the DETECT/MODIFY BLANKED-OUT PATTERN button 44 in FIG. 4(B) is pressed, a dialog box 58 for detection and modification of a blanked-out pattern as shown in FIG. 38 is displayed. There is no need for inputting a condition in which the closed pattern falls off. When fine patterns the width of each of which is equal to or less than a width are excluded in blanked-out pattern detection processing, this is input as a condition of falling-off.

Figure 39:
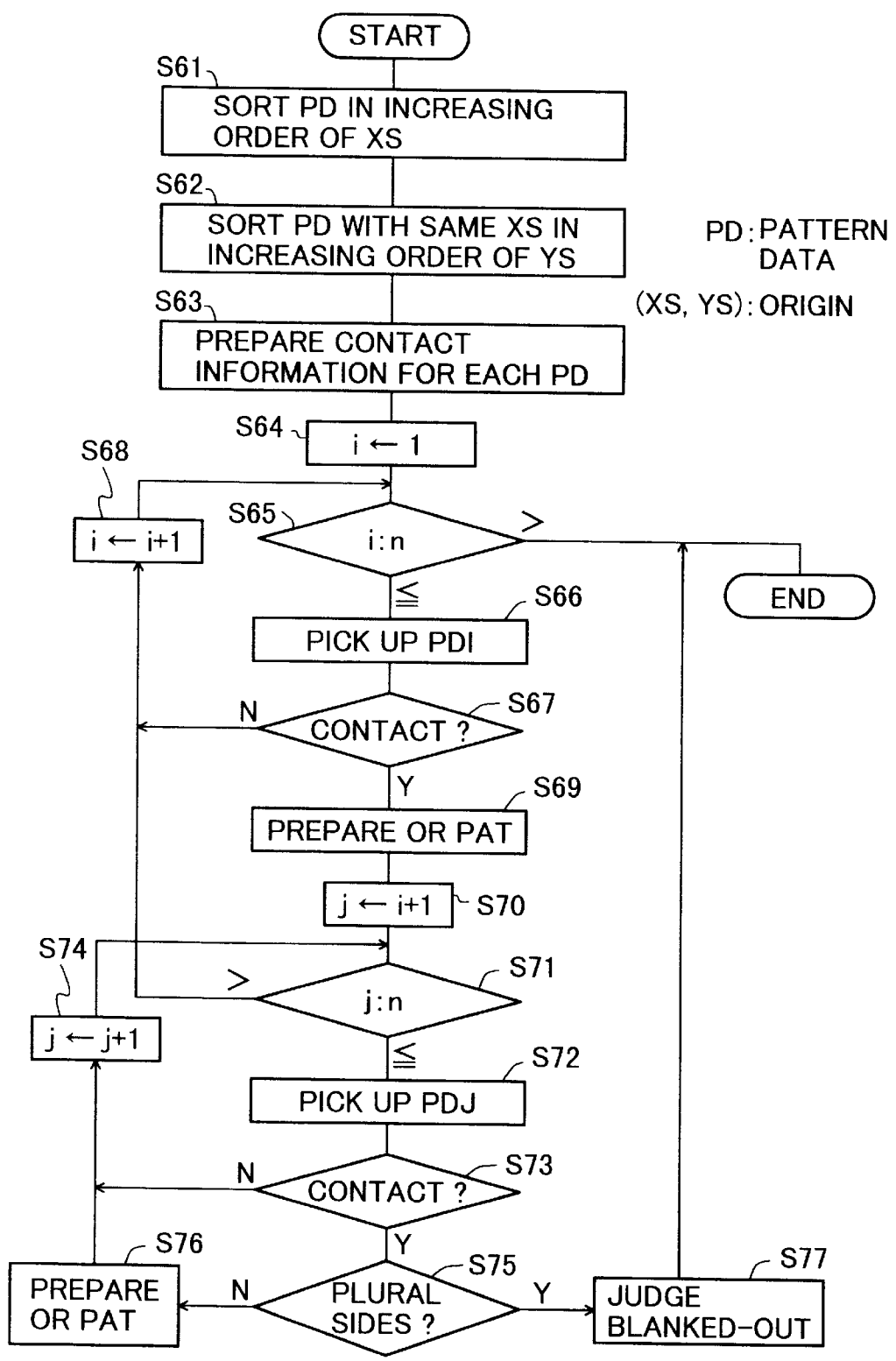
FIG. 39 is a flow chart showing a detection procedure for a blanked-out pattern in a block pattern.

When the EXECUTE button is pressed, detection processing of a blanked-out pattern in a block pattern shown in FIG. 39 is executed.

(S61) Basic pattern data in a block pattern are sorted in the increasing order of the coordinates XS of origins. The data of each basic pattern is organized as FIG. 6, which is mentioned above.

(S62) Basic pattern data with the same coordinate XS of origins are sorted in the increasing order of the coordinate YS.

By steps S31 and S32, basic patterns in a block pattern of FIG. 40 are sorted in the order of P1 to P8.

(S63) Contact information of each pattern data are prepared for the second extended part of FIG. 6.

(S64) An initial value 1 is assigned to a pattern identification variable i.

(S65) If i is equal to or less than the maximum value n, then program flow goes to step S66, or else the processing is terminated.

(S66) The i-th basic pattern data which has been sorted is fetched.

In the case of the block pattern 70 of FIG. 40, the pattern data of the pattern P1 is first fetched.

(S67) If any side of a fetched pattern is not in contact to a side of another pattern, then program flow goes to step S68, while if a side is in contact, program flow goes to step S69.

(S68) After i is incremented by 1, program flow returns to step S65.

(S69) An OR pattern of a pattern fetched in step S66 and a pattern which has been judged as being in contact in step S67 is created.

Figure 41A:
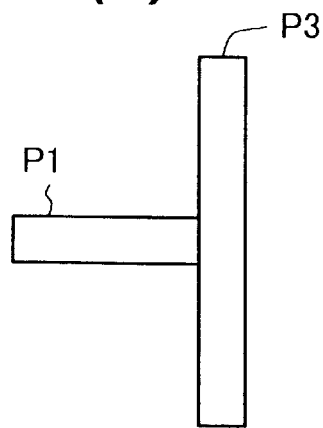
FIGS. 41(A) and 41(B) are respectively illustrations of steps S67 and S69 of FIG. 39.
Figure 41B:
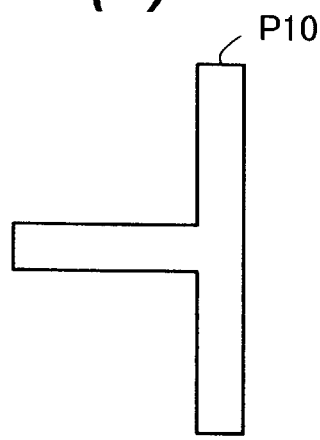
Figure 41C:
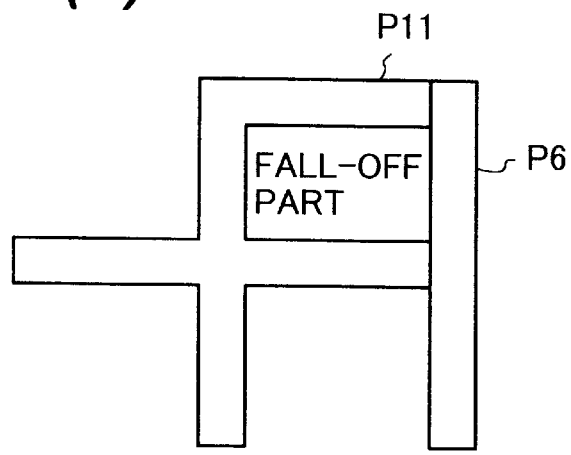
FIGS. 41(C) and 41(D) each are illustrations of steps S73, S75 and S77 of FIG. 39.
Figure 41D:
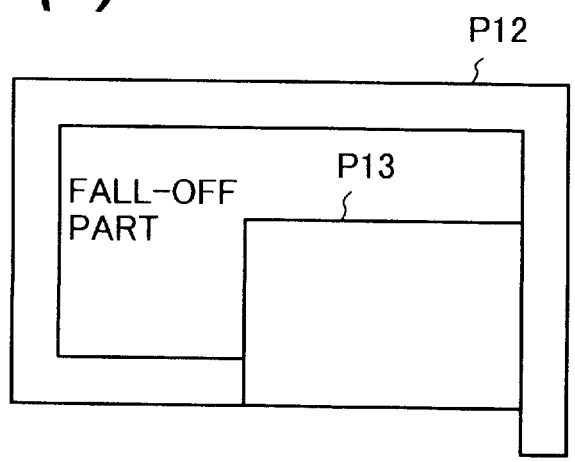

For example, when a pattern P3 is in contact to a pattern P1 as shown in FIG. 41(A), an OR pattern P10 as shown in FIG. 41(B) in which a contact side is deleted is created. An OR pattern data is a polygonal data composed of a set of coordinates of vertices.

(S70) An initial value (i+1) is assigned to a pattern identification variable j.

(S71) If j>n then program flow returns to step S68, or else program flow goes to step S72.

(S72) The j-th basic pattern data PDj is fetched.

(S73) It is judged whether a side of a fetched pattern is in contact to a side of the OR pattern of step 69. If not in contact, program flow goes to S75.

(S74) After j is incremented by 1, program flow returns to step S71.

(S75) If one side is in contact, then program flow goes to step S76 and if a plurality of sides are in contact, then program flow goes to step S77.

For example, if a plurality of sides of an OR pattern P11 are in contact to a side of a pattern P6 fetched in step S72 as shown in FIG. 41 (C), the pattern is a blanked-out pattern. Further, when a plurality of sides of an OR pattern P12 are in contact to different sides of a pattern P13 which is fetched in step S72 as shown in FIG. 41(D) as well, the pattern is a blanked-out pattern. Since the patterns are through holes, in any of both cases, the interiors of the loops fall off.

(S76) An OR pattern of the OR pattern of step S69 and the pattern fetched in step S72 is prepared, thereby updating the OR pattern of step S69. Then, program flow goes to step S74.

(S77) In order that an operator judges that an OR pattern is of a blanked-out type and modifies the pattern, the falling-off part of a block pattern which is in display on the screen is presented in a different way from the other parts, for example the falling-off part is presented in a red color, and a warning sound is simultaneously produced, then terminating the processing.

With such a comparatively simple processing, it can be recognized whether of not there is a blanked-out pattern in a block pattern before exposure.

3-3. Detection of Fine Pattern

Figure 42:
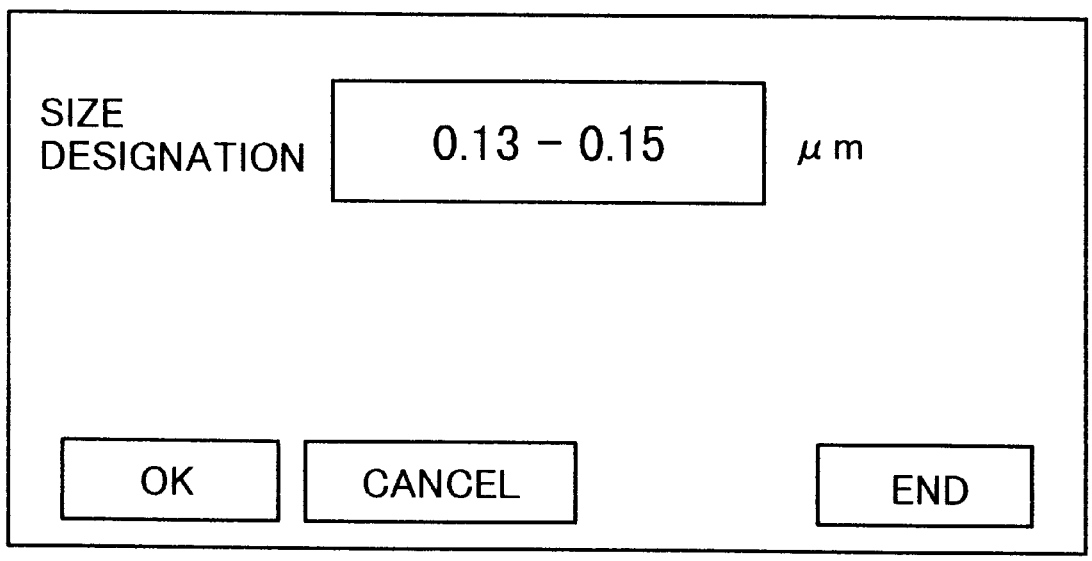
FIG. 42 is an illustration showing a dialog box which is displayed when pressing the DETECT FINE PATTERN button in FIG. 4(B)

When the DETECT FINE PATTERN button 41 is pressed, a fine pattern detection dialog box as shown in FIG. 42 is displayed. A size of a fine pattern to be detected is set in an input box. When for example, "0.13 to 0.15" is set and the OK button is pressed, a basic pattern with a width of 0.13 $\mu$m to 0.15 $\mu$m is searched out and a block pattern including the basic pattern is displayed on the screen in a different way from the other block patterns, for example in an on/off flashing way.

In the case of wafer exposing pattern display, basic patterns with a width in a set range is individually displayed in an on/off flashing way.

Based on the display result, a part where pattern division is changed is detected with ease.

When the CANCEL button is pressed, the set value is invalid and when the END button is pressed, the fine pattern data detection processing is terminated.

Incidentally, A fine pattern with a width equal to or less than a set value may be detected by inputting either 0 as the lower limit or only the upper limit.

3-4. Inspection of Coulomb Effect

Figure 43A:
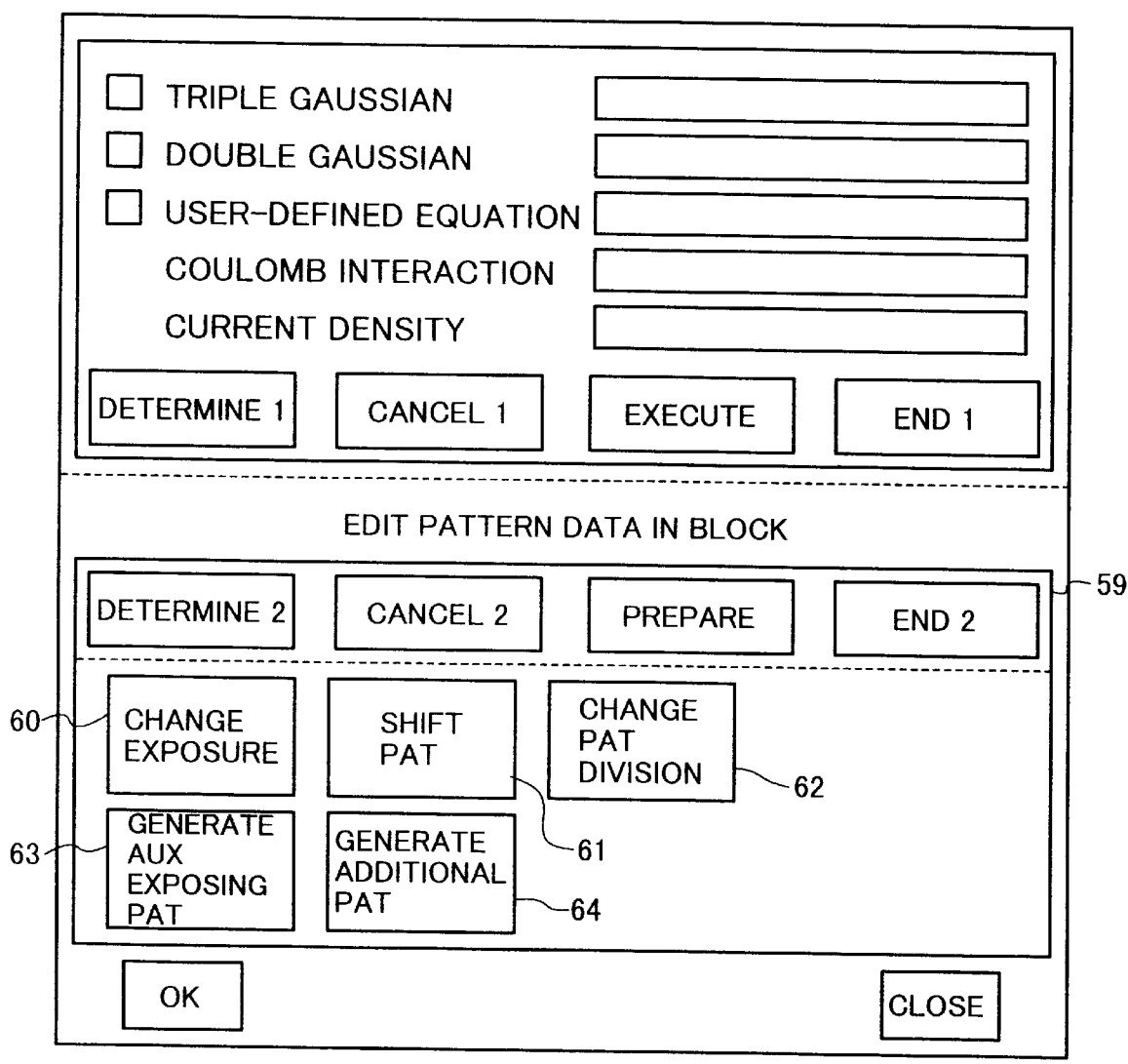
FIG. 43(A) is an illustration showing a dialog box which is displayed when pressing the INSPECT/MODIFY COULOMB EFFECT button in FIG. 4(B)

When the INSPECT/MODIFY COULOMB EFFECT button 42 is pressed, a coulomb effect inspection/modification dialog box as shown in FIG. 43(A) is displayed.

It is selected by option buttons in the left side of the dialog box which of a calculation equation using the triple Gaussian term, the above shown calculation equation (1) using the double Gaussian term and a user-defined equation is used in the coulomb effect inspection (exposure simulation). Then, a parameter included in a selected calculation equation and the value of the current density of a charged particle beam are set in an input box in the right side of the dialog box.

When the DETERMINE1 button is pressed, the setting becomes effective and written into the database. When the CANCEL1 button is pressed, the setting becomes invalid and is not written into the database. In the latter case, a default value is set.

The setting of exposure simulation conditions is also performed in exposure simulation on the wafer-exposing pattern in a similar way.

When the EXECUTE button is pressed, the processing of FIG. 5 is performed on each block pattern on a stencil mask, thereby calculating a pattern width predictive value and an error thereof. However, in regard to a calculation grid, this case is different from the case of a wafer-exposing pattern in that the calculation grid is created outwardly beyond a block frame.

An inspection result is displayed for each block pattern in an individual way. A block pattern even one part of which is judged to have a predictive value to fall outside a tolerance is displayed in a different way from the other block pattern, for example the block pattern is displayed with the interior in a red color.

An inspection result may be displayed as in FIGS. 20(A), 20(B) or 21(A).

Figure 43B:
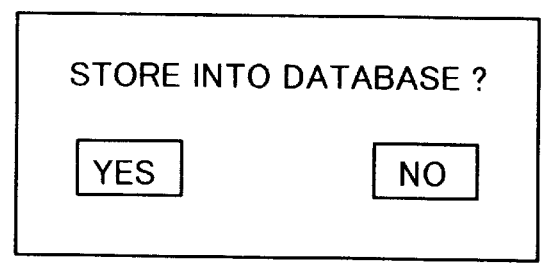
FIG. 43(B) is an illustration showing a dialog box which is displayed when pressing the END1 button in FIG. 43(A)

When the END1 button in FIG. 43(A) is pressed, the processing of inspection of a coulomb effect and display of theiresult are terminated and a dialog as shown in FIG. 43(B) on whether or not the result is stored in the data base is displayed. When the result is stored in the database, the YES button is pressed, while when the result is not stored, the NO button is pressed. When the YES button is pressed, the calculation result is used in calculation on wafer exposing simulation for the wafer exposing pattern as mentioned above for realization of a high speed calculation.

3-5. Pattern Data Modification Based on Inspection Result of Coulomb Effect

A pattern data modification dialog box 59 is same as that of FIG. 22. A similar processing to the above-described modification processing for a wafer-exposing pattern is performed on a block pattern. A modification method is determined by a pressed MODIFY button.

Then, a different point in processing other than that for the wafer-exposing pattern will be described.

When a mouse is pointed at a block pattern to be modified on a stencil mask and clicked on the pattern, only the block is displayed in an enlarged way, thereby making it possible to modify the block. This point is common with the following modification processing.

(1) Change in Exposure

Figure 44A:
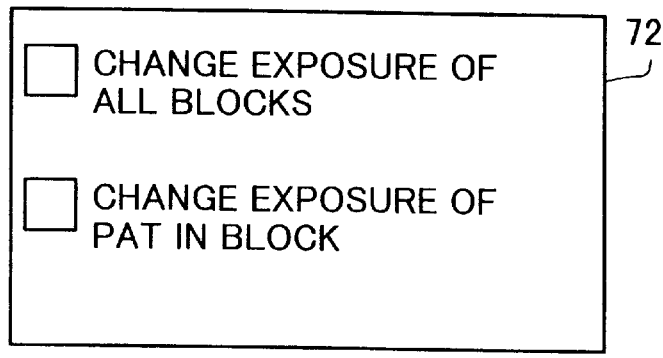
FIG. 44(A) is an illustration showing a dialog box which-lis displayed when pressing the CHANGE EXPOSURE button in FIG. 43(A)

When the CHANGE EXPOSURE button 60 in the pattern modification dialog box in FIG. 43(A) is pressed, an exposure change dialog box 72 of FIG. 44(A) is displayed.

Figure 44B:
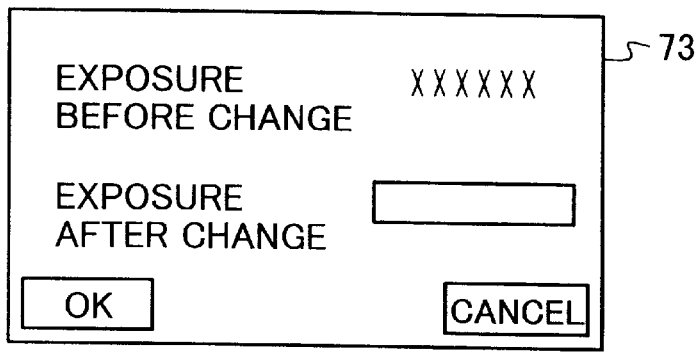
FIG. 44(B) is an illustration showing a dialog box which is displayed when pressing any button in FIG. 44(A)

When the CHANGE EXPOSURE OF ALL BLOCKS button is pressed, a change in exposure dialog box 73 of FIG. 44(B) is displayed. An exposure after the change is set in an input box and the OK button is pressed. With pressing the OK button, a set value in a memory is determined and the exposure change dialog box 73 is erased from the screen. Further, when the CANCEL button is pressed, the set value after the change disappears to be invalid and the exposure change dialog box 73 also vanishes from the screen.

Figure 44C:
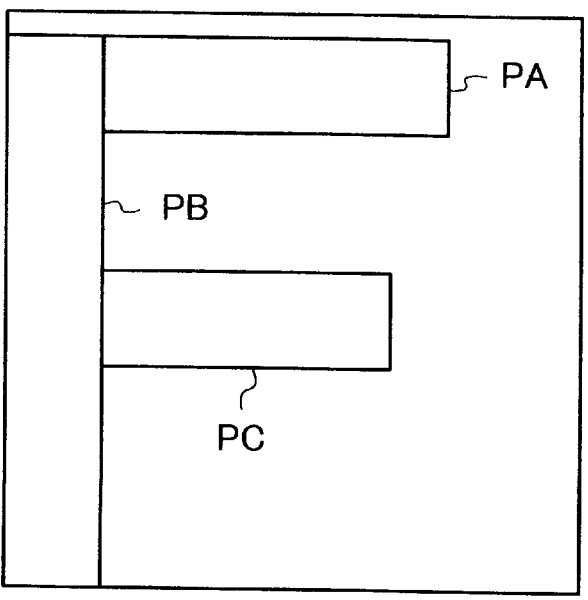
FIG. 44(C) is an illustration showing an example of a block pattern for modification.

When the CHANGE EXPOSURE OF PATTERN IN BLOCK button in the dialog box 72 is pressed and, for example, a mouse is pointed at a basic pattern PC in FIG. 44(C) and clicked on the pattern for selection, the pattern is presented in a different color (with a different color from the other patterns) and the exposure change dialog box 73 of FIG. 44(B) comes to appear onto the screen. Display of the selected pattern in a different color is same as for other patterns in the following cases. When an exposure is set in the input box and the OK button is pressed, a set value of the selected pattern in a memory is determined and the exposure change dialog box 73 disappears from the screen. When the CANCEL button is pressed, the set value vanishes and comes to be invalid, and the exposure change dialog box 73 disappears from the screen.

A wrong setting can be prevented from occurring by performing such operations on each basic pattern in a block pattern.

Since exposure of a block pattern is performed with one shot, amounts of exposure for respective basic patterns in a block pattern have no significance in an actual aspect of exposure. However, each exposure has a significance when exposure simulation is performed for inspections of a proximity effect and a coulomb effect of a block pattern and based on the results, a more preferred exposure for the whole of a block pattern can be determined.

When the DETERMINE2 button is pressed, a change in exposure is determined and written into the database.

When the CANCEL2 button is pressed, a change in exposure comes to be invalid and is not written in the database. When the PREPARE button is pressed, an exposure of the corresponding instances of block patterns which have been included in the wafer exposing pattern data is collectively changed. In this case, when a plurality of exposures are existent in one block pattern, the exposure for a basic pattern with the minimum width in the block pattern is regarded as an exposure for the block pattern. While the exposure of a stencil mask data is not used in actual exposure, the mask has its exposure for an efficient collective change in exposure.

Further, exposing pattern data before and after the change can also be retained in the data base by storing the exposing pattern data with a file name attached thereto.

When the END2 button is pressed, the exposure change processing is terminated.

In the following modification processing, since processing after the DETERMINE2 button, the CANCEL2 button, the PREPARE2 button and the END button are pressed are same as the above described processing, descriptions on the processing will be omitted. Returning back to FIG. 38, the processing of FIG. 38 is same as that.

(2) Pattern Shift

Figure 45A:
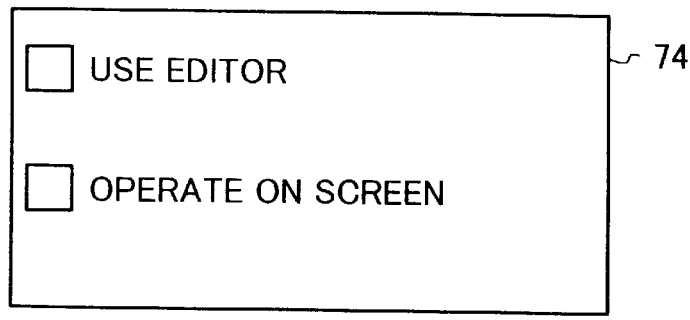
FIG. 45(A) is an illustration showing a dialog which is displayed when pressing the SHIFT PATTERN button in FIG. 43(A)
Figure 45B:
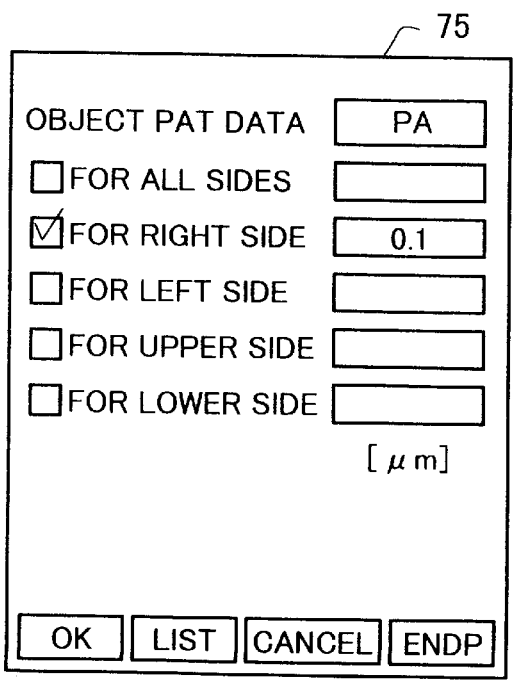
FIG. 45(B) is an illustration showing a dialog box which is displayed when pressing the USE EDITOR button in FIG. 45(A)
Figure 45C:
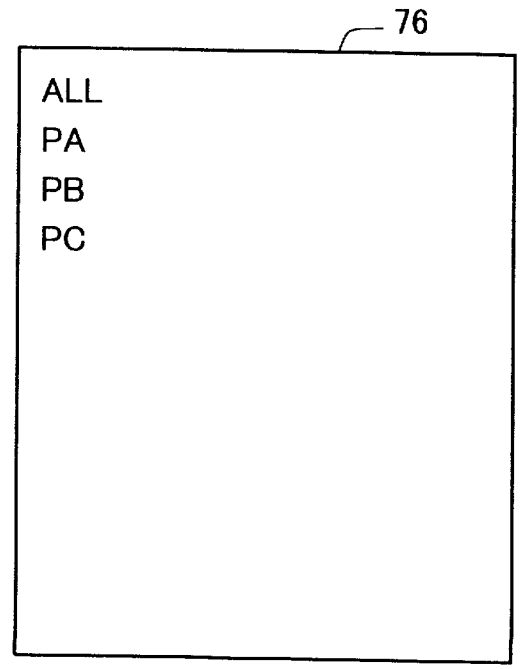
FIG. 45(C) is an illustration showing a dialog which is displayed when pressing the LIST button in FIG. 45(B)

When the SHIFT PATTERN button 61 in the pattern modification dialog box 59 of FIG. 43(A) is pressed, an edition dialog box 74 of FIG. 45(A) is displayed. When a shift value is set while using a simplified editor, the USE EDITOR button is pressed, thereby displaying a pattern shift dialog box 75 of FIG. 45(B). When the LIST button is pressed, a LIST dialog box 76 of FIG. 45(C) is displayed. ALL and a pattern arrangement number in a block pattern, for example PA, PB and PC, are written in the dialog box 76. PA, PB and PC are patterns in FIG. 44(C). When ALL is selected, all the basic patterns of a block pattern are displayed in a different color and a to-be-shifted pattern data in the pattern shift dialog box 75 is displayed as ALL. Further, when PA is selected in a LIST dialog box 76, only the pattern PA in a block pattern is displayed in a different color and a to-be-shifted pattern in the pattern shift dialog box 75 is displayed as PA.

When all the sides of a selected pattern is applied with shifting, a check box captioned with "for All Sides" is marked and a shift is set in the input box. The same operations applies to the check boxes of "for Right Side", "for Left Side", "for Upper Side" and "for Lower Side". When the OK button in the pattern shift dialog box 75 is pressed, the setting contents in a memory comes to be effective, while when the CANCEL button is pressed, the setting contents returns to an initial value, and further when the END button is pressed, the modification by the editor is terminated.

When a basic pattern in a block pattern is directly modified, the OPERATION ON SCREEN button is pressed. With the pressing, operation on the screen can be performed and a side of a basic pattern is shifted by a mouse.

(3) Additional Pattern

When the GENERATE ADDITIONAL PATTERN button 64 in the pattern modification dialog box of FIG. 43(A) is pressed, an additional pattern generation dialog box of FIG. 46 is displayed. Then, set values are written into input boxes for the width and length of an additional rectangular pattern. By pressing the FREE button instead of the setting, an additional pattern can be drawn on a block pattern by operating a mouse. When the additional pattern has been drawn, the width and length are determined. When the ADDITIONAL PATTERN SHIFT button is pressed, and a shift is set in the input box, the additional pattern is displaced from the current position by the set value. Then, an exposure for the additional pattern is set in the input box. Processing performed when the OK button, the CANCEL button and the END button are pressed are same as the above described.

(4) Change in Pattern Division

Figure 47A:
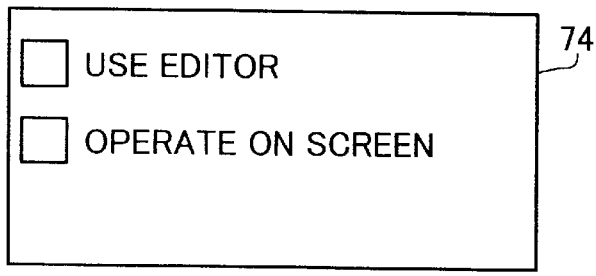
FIG. 47(A) is an illustration showing a dialog box which is displayed when pressing the CHANGE PATTERN DIVISION button in FIG. 43(A)
Figure 47B:
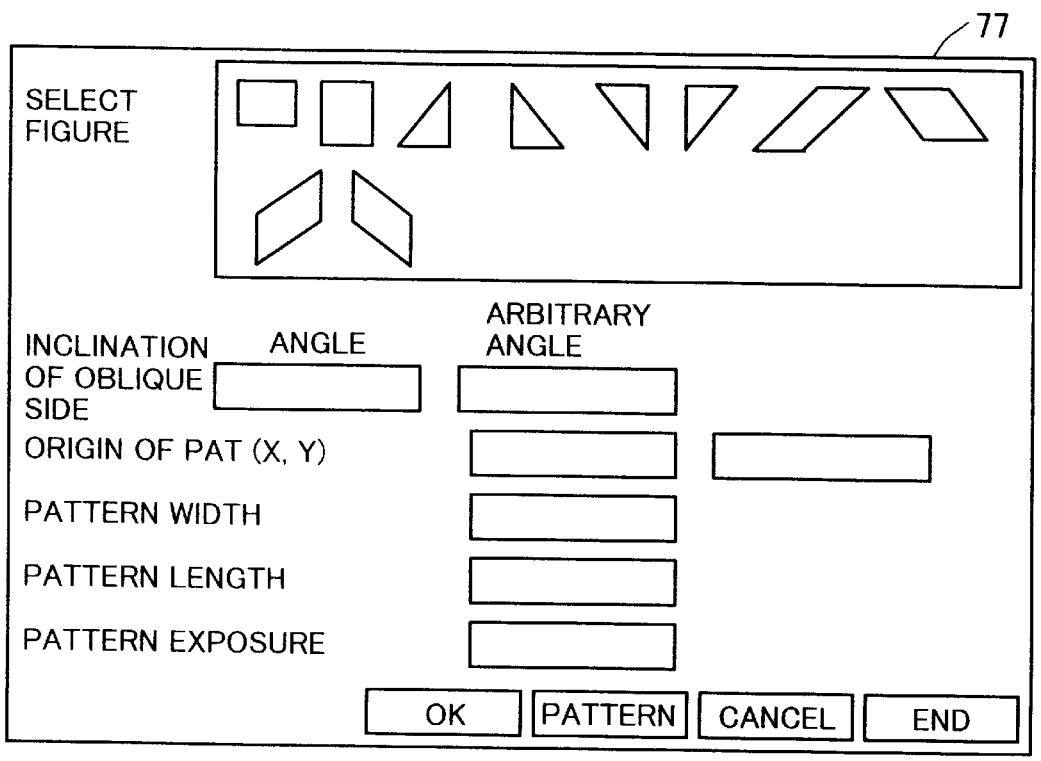
FIG. 47(B) is an illustration showing a dialog box which is displayed when pressing the USE EDITOR button in FIG. 47(A)

When the CHANGE PATTERN DIVISION button 62 in the pattern modification dialog box 59 of FIG. 43(A) is pressed, an edition dialog box 74 of FIG. 47(A) which is same as FIG. 45(A) is displayed. When a change in pattern division is pertormea with u se of a simplified editor, the USE EDITOR button is pressed, thereby displaying a pattern division change dialog box 77 of FIG. 77(B).

When the PATTERN button in the dialog box 77 is pressed, and a mouse is pointed at a basic pattern in a block pattern on the screen and clicked on the basic pattern, information on the basic pattern is displayed. Based on the information, the mouse is pointed at a pattern in the Figure Selection box in the dialog box 77 and clicked on the pattern in order to select a pattern for substitution for the basic pattern. When a pattern with an oblique side is selected, the inclination is set into the input box. A size, an origin and an exposure are set with respect of the selected pattern in the same way.

For example, in the case of FIG. 28(A), the width of the pattern 621 is changed and the origin and length of the pattern 622 are changed so as to be like those of FIG. 28(B). In the same way, in the case of FIG. 29(A), the shape of the pattern 625 is changed so as to be like those of FIG. 29(B) while the size of t he pattern 624 is changed to be 0.

When the OK button is pressed, the setting in a memory comes to be effective, while, when the CANCEL button is pressed, the setting comes to be invalid.

Such pattern substitution processing is repeatedly applied to other basic patterns in the block pattern.

A change in pattern division also includes to change one basic pattern into a plurality of smaller patterns. With such a change, an area of through holes is reduced and a coulomb effect is decreased. Processing after pressing the OPERATION ON SCREEN button in the edition dialog box 74 is same as that of FIG. 45(A).

3-6. Inspection of Through Hole Area

Figure 48:
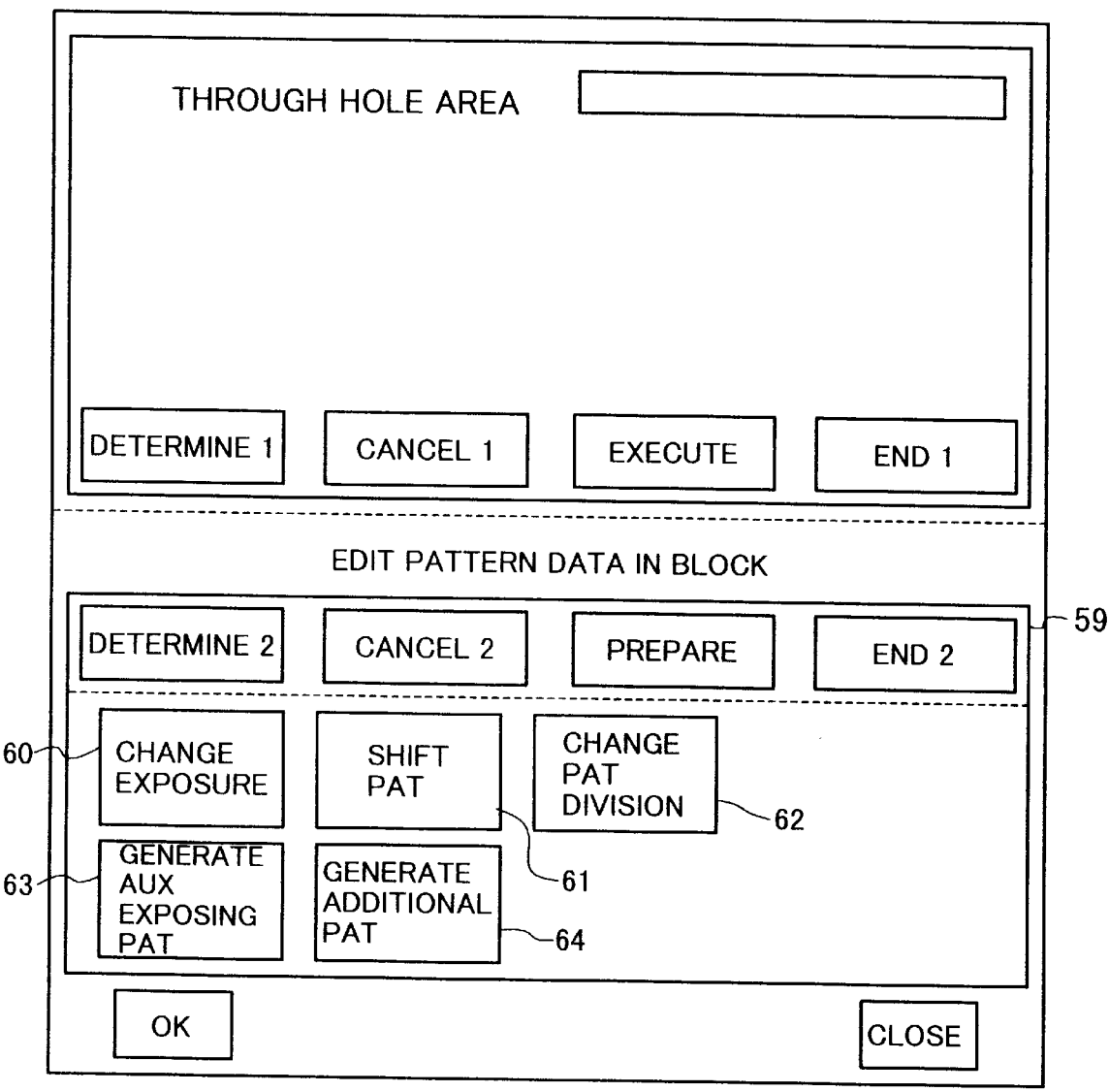
FIG. 48 is an illustration showing a dialog which is displayed when pressing the INSPECT/MODIFY THROUGH HOLE AREA button in FIG. 4(B)

When the INSPECT/MODIFY THROUGH HOLE AREA button 43 of FIG. 4(B) is pressed, a through hole area inspection/modification dialog box as shown in FIG. 48 is displayed.

When a through hole area is excessively large, a coulomb effect and a proximity effect come to be problematic. When the through hole area set in the input box and the DETERMINE1 button is pressed, the set value is determined, while the CANCEL1 button is pressed, the set value is canceled and a default value is set. When the EXECUTE button is pressed, a block pattern which has a through hole area equal to or more than a set value is detected among all the block patterns on a stencil mask and a detected block pattern is displayed in a different color, for example in a solid red color.

With such operations, parts to be corrected for a coulomb effect and a proximity effect are detected with ease.

Pattern data modification based on the inspection result is same as in the case of the item 3-5.

3-7. Inspection of Proximity Effect

Figure 49:
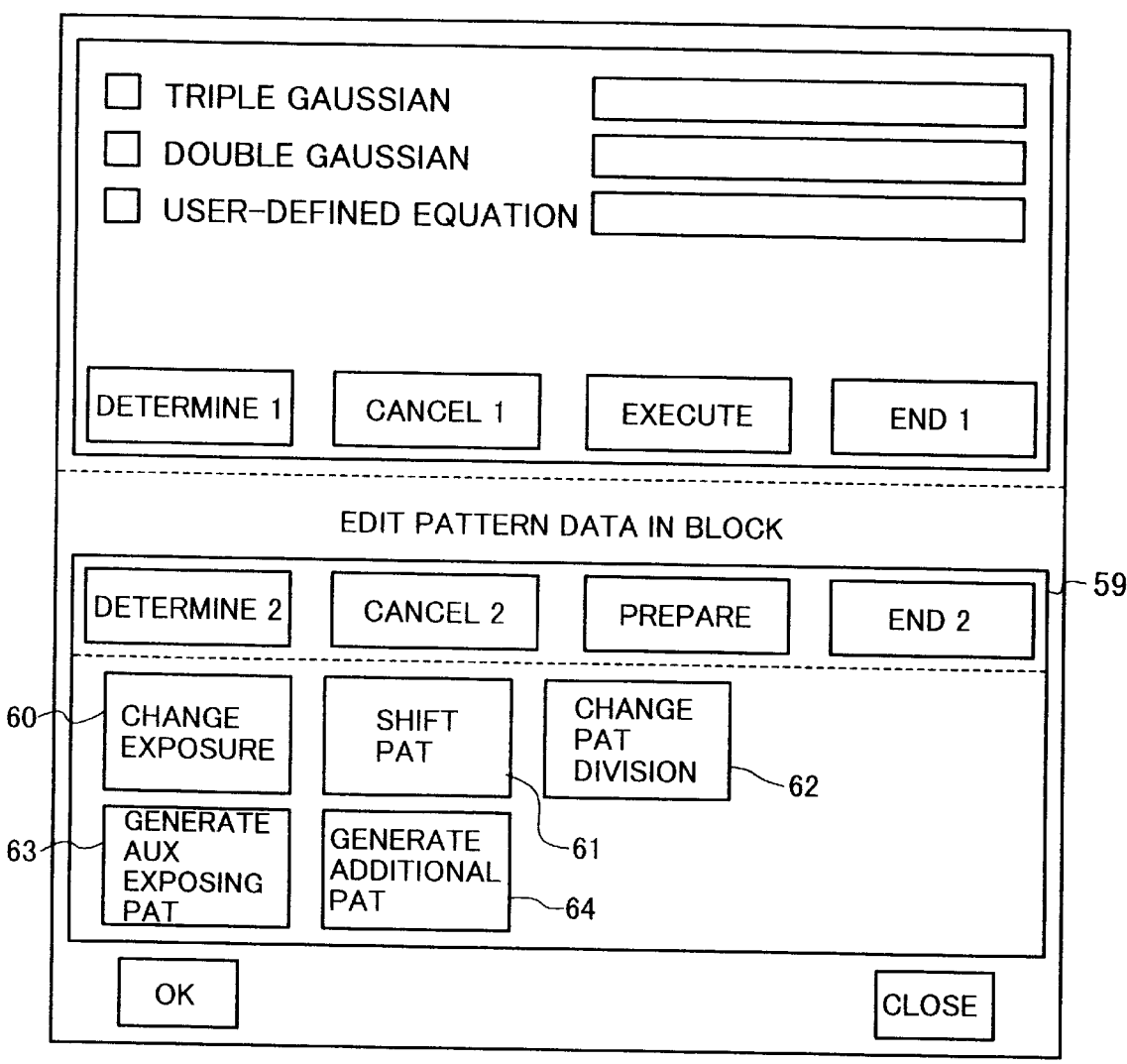
FIG. 49 is an illustration showing a dialog which is displayed when pressing the INSPECT/MODIFY PROXIMITY EFFECT button in FIG. 4(B)

When the INSPECT/MODIFY PROXIMITY EFFECT Button 45 is pressed, a proximity effect inspection dialog box as shown in FIG. 49 is displayed. FIG. 49 is same as FIG. 43(A) with the exception that no setting of a parameter of a coulomb interaction and a current density is effected.

3-8. Pattern Data Modification Based on Inspection Result of Proximity Effect

Modification processing is same as in the item 3-5.

4. Layout Change of Block Pattern on Stencil Mask

When exposure is performed with a block pattern on a stencil mask, a charged particle beam is deflected by a deflector to select a block pattern through which the charged particle beam is transmitted and the beam is turned back by the deflector. For this reason, as a block pattern is located closer to the center of a stencil mask, a drawing precision gets higher. Accordingly, a block pattern with a high drawing precision requirement is needed to be located in the neighborhood of the center of the stencil mask. Further, when a block pattern with high frequency in use is located in the neighborhood of the center of the stencil mask, drawing precision is improved on average.

Figure 50A:
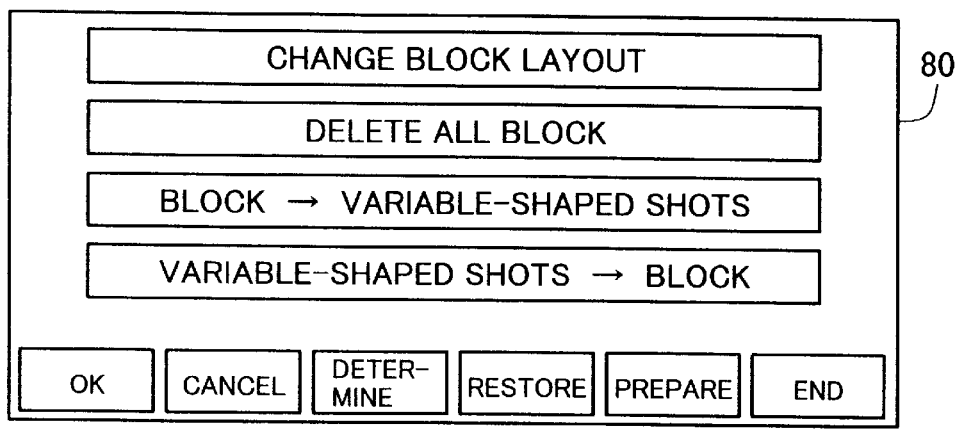
FIG. 50(A) is an illustration showing a dialog box which is displayed when pressing the BLOCK PATTERN LAYOUT button in FIG. 4(A)

In order that a layout of block patterns on a stencil mask is changed, a display image is changed over to a stencil mask by the CHANGEOVER DISPLAY button 21 of FIG. 4(A). When the BLOCK PATTERN LAYOUT button 23 is pressed, a block layout dialog box 80 of FIG. 50(A) is displayed. Functions selected by the dialog box 80 are the following 4 functions:

(1) Layout change of block patterns on a stencil mask (2) Deletion of all block patterns on a stencil mask and transformation of each block pattern into a variable-shaped pattern group (3) Deletion of some block patterns on a stencil mask and transformation of each block pattern into a variable-shaped pattern group (4) Transformation of variable-shaped pattern groups into block patterns and their arrangement on a stencil mask The functions thereof will be described below.

(1) Layout change of block patterns on a stencil mask (1a) The CHANGE BLOCK LAYOUT button in a block pattern layout dialog box 80 is pressed.

Figure 50B:
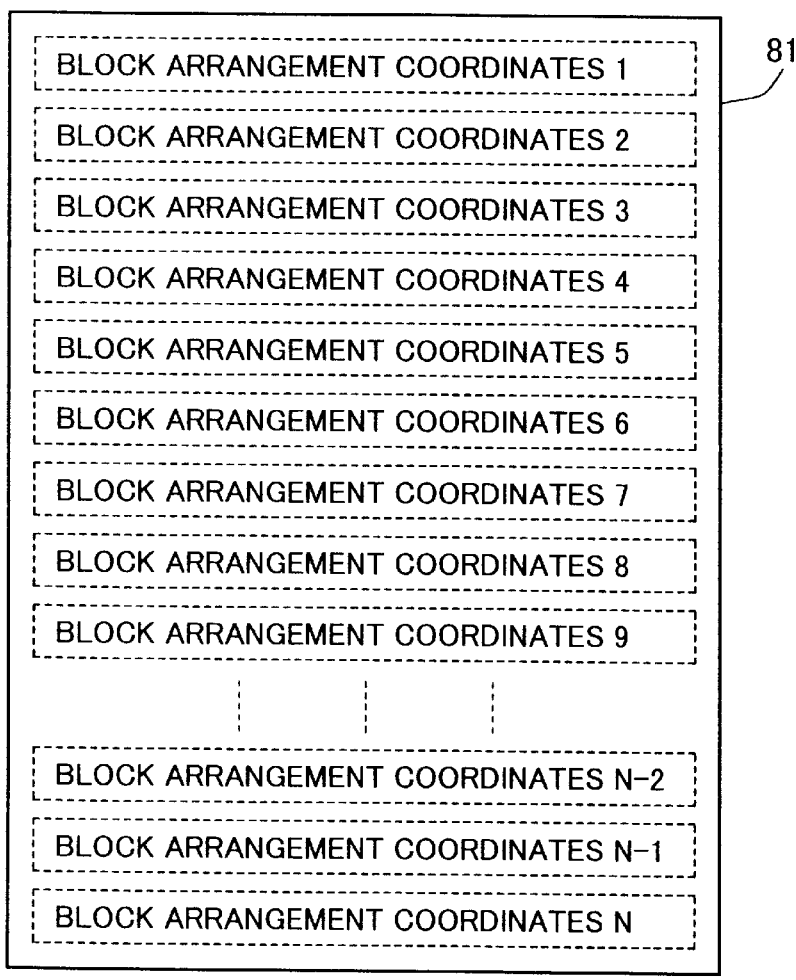
FIG. 50(B) is an illustration showing a dialog box which is displayed when pressing the CHANGE BLOCK LAYOUT button in FIG. 50(A)

(1b) In response to the button pressing, a block pattern list 81 of FIG. 50(B) is displayed.

(1c) When block arrangement coordinates (or an arrangement position identification code) in the block pattern list 81 is selected by a mouse, the corresponding block pattern is displayed in a different color on the stencil mask, for example the pattern is displayed in an on/off flashing way or in a changed color. When the pattern is in display with a different color, the block pattern is in a state of being movable.

(1d) When a block pattern which is desired to be moved on the stencil mask is selected by the mouse, the selected block pattern and a block pattern in different color are swapped between both and at the same time block arrangement coordinates in the pattern list are also swapped between both.

(1e) When the CANCEL button in the dialog box 80 is pressed, arrangement information of a block pattern changed on a memory is deleted and a state before the change is restored.

(1f) If there is no further change, the OK button in the dialog box 80 is pressed, while there is a further change, processing flow returns to (1c).

(1g) Processing from the (1c) to (1f) is repeated to change a block pattern layout on the stencil mask and thereafter, when the DETERMINE button is pressed, a changed block pattern layout pattern data is added to the data base while the original block pattern layout data are retained.

(1h) When the PREPARE button is pressed, a new wafer exposing pattern data, whose block arrangement coordinates in the wafer exposing pattern data are changed, is prepared and the new data is added to the data base while the original wafer exposing pattern data are retained.

(1i) In order to restore all the related states to the original states, the RESTORE button is pressed. When the RESTORE button is pressed, the newly prepared exposing pattern data is deleted from the data base and the block pattern arrangement on the stencil in which the original block pattern layout data are used is restored.

With such processing, an experienced designer can easily change the layout of a block pattern in consideration of both of drawing precision and throughput.

When the END button is pressed, the layout change processing on a stencil mask is terminated and the block pattern list 81 and the layout dialog box 80 vanish away from the screen.

(2) Deletion of all block patterns on a stencil mask and transformation of each block pattern into a variable-shaped pattern group (2a) The DELETE ALL BLOCK button in the block pattern layout dialog box 80 is pressed.

(2b) With the pressing of the button, all the block patterns on a stencil mask are deleted. The deletion is performed on a memory and the block pattern data on the data base are retained without any deletion.

(2c) When the CANCEL button in the dialog box 80 is pressed, the deletion on the memory is canceled and a state before the deletion is restored.

(2d) When the OK button in the dialog box 80 is pressed, all the deletion comes to be effective in the memory and when the DETERMINE button is further pressed, data of the stencil mask from which all the block patterns are deleted are additionally stored into the data base, while the original stencil mask data are retained.

(2e) When the PREPARE button is pressed, a new wafer exposing pattern data all of whose block patterns are transformed into groups of variable-shaped patterns while the original wafer exposing pattern data are retained.

(2f) In order to restore all of states before the change, the RESTORE button is pressed. When the RESTORE button is pressed, a newly added, prepared exposure data are deleted from the data base and the original stencil mask is restored, by using the original exposure data.

(2g) When the END button is pressed, the block pattern deletion processing is terminated and the block list 81 and the dialog box 80 are erased from the screen.

(3) Deletion of some block patterns on a stencil mask and transformation of each block pattern into a variable-shaped pattern group (3a) The BLOCK→VARIABLE-SHAPED SHOTS button in the block pattern layout dialog box 80 is pressed.

(3b) With the pressing the button, the block pattern list 81 is displayed.

(3c) When a block pattern which is desired to be deleted on a stencil mask is selected by a mouse, the selected block pattern and block arrangement information in the block pattern list are deleted. The deletion is performed in a memory and block pattern data on the data base are retained.

(3d) When the CANCEL button in the dialog box 80 is pressed, the deletion on the memory is canceled and a state before the deletion is restored.

(3e) If there is no further deletion, the OK button in the dialog box 80 is pressed. On the other hand, if there is further deletion, processing flow returns to the item (3c).

(3f) Processing from the items of (3c) to (3e) is repeated to delete block patterns on the stencil mask. When the DETERMINE button is pressed, another block pattern is placed in a site where a block pattern has been deleted on the stencil mask in order to arrange the block pattern in a site as close to the center of the stencil mark as possible. Further, data of the stencil mask which has been affected by the deletion are additionally stored in the data base while the original data of the stencil mask is retained.

(3g) When the PREPARE button is pressed, a new wafer exposing data whose block pattern is changed into a group of variable-shaped patterns by the deletion are prepared while the original wafer exposing pattern data are retained.

(3h) In order to restore all of states before the change, the RESTORE button is pressed. When the RESTORE button is pressed, a newly added, prepared exposure data are deleted from the data base and the original stencil mask is restored, by using the original exposure data.

With such processing, an experienced designer can easily secure a space for arranging another block pattern on the stencil mask in consideration of both of drawing precision and throughput.

(3i) When the END button is pressed, the block pattern deletion processing is terminated and the block list 81 and the dialog box 80 disappear from the screen.

(4) Transformation of variable-shaped pattern groups into block patterns and their arrangement on a stencil mask (4a) The VARIABLE-SHAPED SHOTS→BLOCK button in the block pattern layout dialog box 80 is pressed.

Figures 51A, 51B:
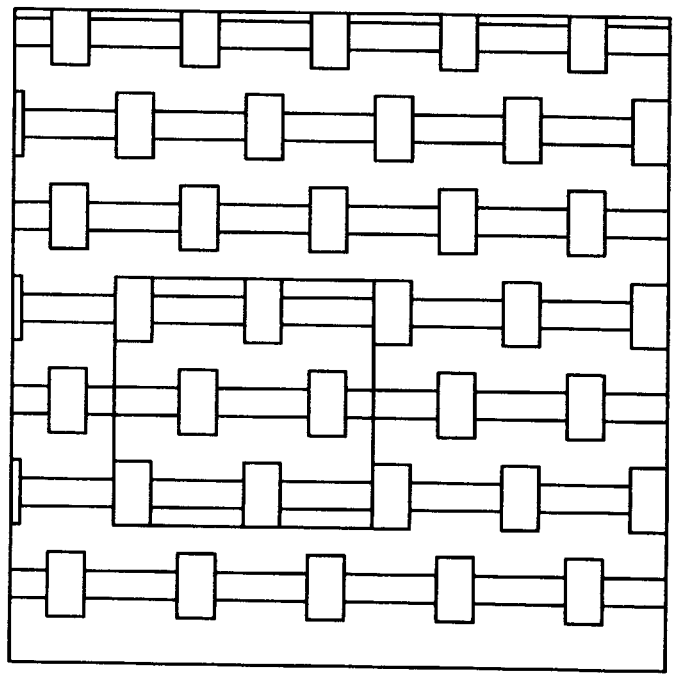
FIG. 51(A) is an illustration showing a dialog box which is displayed when pressing the VARIABLE-SHAPED SHOTS→BLOCK button in FIG. 50(A)
FIG. 51(B) is an illustration of a pattern which is displayed in blocking process in variable-shaped patterns.

(4b) With pressing the button, a variable-shaped pattern group blocking dialog box 82 of FIG. 51(A) is displayed and a stencil mask display on the screen is automatically changed over to a wafer exposing pattern.

(4c) A group of variable-shaping patters which has been transformed to a block pattern on a wafer exposing pattern, for example as in FIG. 51(B), is enclosed by a frame by operating a mouse.

(4d) When the OK1 button in the variable-shaped pattern group blocking dialog box 82 is pressed, blocking information is stored on a memory and when the CANCEL1 button is pressed, the frame for the selected pattern group disappears.

(4e) When the DETERMINE1 button is pressed after processing from the items (4c) to (4d) is repeated in necessary number, variable-shaped pattern data which are to be transformed into a block are stored into the data base.

(4f) When the PREPARE1 button is pressed, a block pattern which is formed on a stencil mask is prepared by using the stored variable-shaped pattern data. Further, the block pattern list 81 of FIG. 50(B) is displayed and an empty block arrangement coordinate storage section is also displayed. When there is no empty storage section, a block pattern cannot be prepared.

(4g) When the END1 button is pressed, a wafer exposing pattern display is automatically changed over to a stencil mask display and a stencil mask on which a new block pattern is formed is displayed. When a change in layout is performed, the above described layout change processing is performed after the following procedure is completed.

(4h) "Only Selected Area", "Selection of Same Shape in X Direction (performing one-dimensional matrix arrangement)", "Selection of Same Shape in Y Direction (performing one-dimensional matrix arrangement)" or "Selection of Same Shape in X and Y Directions (performing two-dimensional matrix arrangement)" is selected by pressing option button in the dialog box 82 of blocking variable-shaped pattern group. Thereafter, when the OK2 button is pressed, information which is necessary for performing process of changing a wafer exposing pattern data into a block pattern data is prepared on a memory according to a selection on the option buttons. When the CANCEL2 button is pressed, the information is deleted.

(4i) When the DETERMINE2 button is pressed, the information is added to the data which has been stored into the database in the item (4e).

(4j) When the PREPARE2 button is pressed, the data and the additional information are read out on a memory from the data base, the corresponding variable-shaped pattern data groups which are expanded in a wafer exposing pattern data are retrieved and the retrieved data groups are rewritten into the instances of block pattern data, whereby a new wafer exposing pattern data is prepared. The original wafer exposing pattern data are retained since there is a possibility of being used at a later chance.

With such processing, an experience designer can easily perform additional arrangement of new block patterns on a stencil mask in consideration of drawing precision and throughput.

(4k) When the END2 button is pressed, the variable-shaped pattern group blocking dialog box 82 disappear from the screen. When the original exposure data is desired to be restored, the RESTORE button in the dialog box 80 is pressed.

Although preferred embodiments of the present invention has been described, it is to be understood that the invention is not limited thereto and that various changes and modifications may be made without departing from the spirit and scope of the invention.

What is claimed is:

1. A method of inspecting object exposing pattern decomposed into basic patterns, displaying a result of the inspection, and modifying said exposure pattern based on said displayed result of said inspection, said inspecting comprising:

creating a first calculation candidate point between end points of a first non-contact part of a side of one of said basic patterns, said non-contact part being defined as not in contact to a side of any of said basic patterns;

creating a second calculation candidate point between end points of a second non-contact part of an opposite side with said first non-contact part, said second calculation candidate point corresponding to said first calculation candidate point;

creating a plurality of calculation points on a straight line passing through said first and second calculation candidate points, said calculation points being located in each traversing part of said first and second non-contact parts;

calculating an exposure intensity at each calculation point;

obtaining a predictive value of a drawing pattern width based on the calculation result; and calculating an error of said predictive value from a target value as said inspection result, wherein said first calculation candidate point is created at a middle point of an AND part when said second non-contact part is projected on said first non-contact part, and wherein said second calculation candidate point is created at a middle point of an AND part when said first non-contact part is projected on said second non-contact part.

2. The method according to claim 1, wherein a calculation candidate point which exists on a side along which two of said basic patterns are in contact to each other is deleted.

3. A method of inspecting object exposing pattern decomposed into basic patterns, displaying a result of the inspection, and modifying said exposure pattern based on said displayed result of said inspection, said inspecting comprising:

creating a first calculation candidate point between end points of a first non-contact part of a side of one of said basic patterns, said non-contact part being defined as not in contact to a side of any of said basic patterns;

creating a second calculation candidate point between end points of a second non-contact part of an opposite side with said first non-contact part, said second calculation candidate point corresponding to said first calculation candidate point;

creating a plurality of calculation points on a straight line passing through said first and second calculation candidate points, said calculation points being located in each traversing part of said first and second non-contact parts;

calculating an exposure intensity at each calculation point;

obtaining a predictive value of a drawing pattern width based on the calculation result; and calculating an error of said predictive value from a target value as said inspection result, wherein, in a case where a group of rectangular patterns with the same shape and size are arranged side by side in one direction with a shift by a distance between adjacent patterns like a flight of stairs, said group of rectangular patterns are regarded as one pattern constructed from a pair of opposite straight sides and a pair of opposite stair sides, and wherein said first and second calculation candidate points are created at intersections of a first straight line, which passes through the middle points of opposite imaginary straight sides corresponding to said opposite stair sides, and said opposite stair sides.

4. A method of inspecting object exposing pattern decomposed into basic patterns, displaying a result of the inspection, and modifying said exposure pattern based on said displayed result of said inspection, said inspecting comprising:

performing exposure simulation to calculate an exposure intensity distribution in a traversing part along a line which traverses said exposing pattern; and obtaining an error of a predictive drawing pattern width from a target value on said traversing line, wherein said result to be displayed includes a histogram of said errors, and wherein said result to be displayed further includes an error pattern list having a position, a width and a size precision of the exposing pattern whose error falls outside a tolerance.

5. The method according to claim 4, wherein said displaying comprising the steps of:

performing exposure simulation near an exposing pattern edge, in response to selection of an exposure pattern in said error pattern list; and displaying an exposure image in which an exposure intensity distribution is presented in identification colors.

6. A method of inspecting object exposing pattern decomposed into basic patterns, displaying a result of the inspection, and modifying said exposure pattern based on said displayed result of said inspection, said inspecting comprising:

performing exposure simulation to calculate an exposure intensity distribution in a traversing part along a line which traverses said exposing pattern; and obtaining an error of a predictive drawing pattern width from a target value on said traversing line, wherein said result to be displayed includes a graph showing an error range for each of said drawing pattern widths, and wherein said result to be displayed further includes an error pattern list having a position, a width and a size precision of the exposing pattern whose error falls outside a tolerance.

7. A method of inspecting object exposing pattern decomposed into basic patterns, displaying a result of the inspection, and modifying said exposure pattern based on said displayed result of said inspection, said inspecting comprising the steps of:

setting a line traversing an exposing pattern displayed on a screen;

performing exposure simulation to calculate an exposure intensity distribution in an edge part of said exposing pattern along said line; and obtaining an error of a predictive value of a drawing pattern width from a target value on said line, wherein said result, to be displayed in a corresponding manner to said pattern on said screen, includes said predictive value and said target value or said error.

8. The method according to claim 7, wherein an operator designates an area on said screen, said pattern edge part on said line is restricted within said designated area, and said exposure intensity distribution is calculated in consideration of exposure contributions from exposing patterns in said designated area and a predetermined area outside said designated area.

9. The method according to claim 8, wherein when said error falls outside a tolerance, said error is displayed on said screen.

10. A method of inspecting object exposing pattern decomposed into basic patterns, displaying a result of the inspection, and modifying said exposure pattern based on said displayed result of said inspection, said inspecting comprising:

dividing a screen on which an exposing pattern is displayed into a plurality of unit areas; and displaying a pattern area density in each unit area on said screen, wherein said pattern area density is displayed in numerical value with % as unit.

11. A method of inspecting object exposing pattern decomposed into basic patterns, displaying a result of the inspection, and modifying said exposure pattern based on said displayed result of said inspection, said inspecting comprising:

dividing a screen on which an exposing pattern is displayed into a plurality of unit areas; and displaying a pattern area density in each unit area on said screen, wherein said inspecting further comprising before said dividing, designating a point on said screen, and determining an area around said point as a center, wherein said area is divided into said unit areas in said dividing.

12. A method of inspecting object exposing pattern decomposed into basic patterns, displaying a result of the inspection, and modifying said exposure pattern based on said displayed result of said inspection, said inspecting comprising:

dividing a screen on which an exposing pattern is displayed into a plurality of unit areas; and displaying a pattern area density in each unit area on said screen, wherein, according to selection by an operator, a distribution of said pattern area density is displayed in a superposing manner on said pattern or only said distribution is displayed.

13. A method of inspecting object exposing pattern decomposed into basic patterns, displaying a result of the inspection, and modifying said exposure pattern based on said displayed result of said inspection, said inspecting comprising:

performing exposure simulation to calculate an exposure intensity distribution in a traversing part along a line which traverses said exposing pattern; and obtaining an error of a predictive drawing pattern width from a target value on said traversing line, wherein said result to be displayed includes a histogram of said errors, and said modifying said exposure pattern comprises, selected by an operator, changing an exposure of a selected basic pattern, shifting a selected basic pattern, changing a way of division of a selected exposing pattern into basic patterns without changing a shape of the exposing pattern, creating an auxiliary exposing pattern with an exposure less than a threshold and superposing said auxiliary exposing pattern on a selected basic pattern to be modified, or creating an additional pattern with an exposure more than a threshold and superposing said additional pattern on selected basic patter to be modified.

14. A method according to claim 13, wherein said modifying further comprises the steps of:

inquiring of an operator, if a modified pattern has repetition arrangement information, about whether or not the same modification as said pattern modification is performed on patterns in said repetition arrangement other than said modified pattern; and performing process according to response of said inquiry.

15. A method of inspecting object exposing pattern or block patterns, said object exposing pattern including instances of said block patterns, said object exposing pattern being decomposed into basic patterns, said block patterns being arranged on a stencil mask, each block pattern being created by transforming a group of basic patterns into a block, displaying patterns or a result of the inspection, and modifying said exposure pattern or said block pattern based on said displayed result of said inspection, said displaying comprising the step of:

displaying, in response to selection of a block pattern on said stencil mask on a screen by an operator, instances of said selected block pattern in said object exposing pattern in a different way from other patterns.

16. A method of inspecting object exposing pattern or block patterns, said object exposing pattern including instances of said block patterns, said object exposing pattern being decomposed into basic patterns, said block patterns being arranged on a stencil mask, each block pattern being created by transforming a group of basic patterns into a block, displaying patterns or a result of the inspection, and modifying said exposure pattern or said block pattern based on said displayed result of said inspection, wherein said inspection performs checking whether or not a blanked-out pattern is existent in a block pattern on said stencil mask, and said inspection comprises the steps of:

preparing an OR pattern of basic patterns sides of which are in contact to each other; and judging that said blanked-out pattern is existent when a plurality of sides of said OR pattern are in contact to a side of another basic pattern.

17. A method of inspecting object exposing pattern or block patterns, said object exposing pattern including instances of said block patterns, said object exposing pattern being decomposed into basic patterns, said block patterns being arranged on a stencil mask, each block pattern being created by transforming a group of basic patterns into a block, displaying patterns or a result of the inspection, and modifying said exposure pattern or said block pattern based on said displayed result of said inspection, wherein said modifying comprises:

selecting, manually, one block pattern on said stencil mask;

selecting, manually, a basic pattern constituting said selected block pattern; and inputting, manually, modification data for said selected basic pattern, wherein said modification is pattern shift, and wherein said modification data includes shift amount of a designated side or all sides of said selected basic pattern.

18. A method of inspecting object exposing pattern or block patterns, said object exposing pattern including instances of said block patterns, said object exposing pattern being decomposed into basic patterns, said block patterns being arranged on a stencil mask, each block pattern being created by transforming a group of basic patterns into a block, displaying patterns or a result of the inspection, and modifying said exposure pattern or said block pattern based on said displayed result of said inspection, wherein said modifying comprises:

selecting, manually, one block pattern on said stencil mask;

selecting, manually, a basic pattern constituting said selected block pattern; and inputting, manually, modification data for said selected basic pattern, wherein said modification is creation of an additional pattern which is superposed on said selected basic pattern, and wherein said modification data includes a size of said additional pattern and an exposure thereof.

19. A method of inspecting object exposing pattern or block patterns, said object exposing pattern including instances of said block patterns, said object exposing pattern being decomposed into basic patterns, said block patterns being arranged on a stencil mask, each block pattern being created by transforming a group of basic patterns into a block, displaying patterns or a result of the inspection, and modifying said exposure pattern or said block pattern based on said displayed result of said inspection, wherein said inspection comprises the steps of:

inputting a set value by an operator; and detecting a block pattern with a through hole area more than said set value on said stencil mask, wherein said displaying displays said detected block pattern in a different way form the other block patterns.

20. A method of inspecting object exposing pattern or block patterns, said object exposing pattern including instances of said block patterns, said object exposing pattern being decomposed into basic patterns, said block patterns being arranged on a stencil mask, each block pattern being created by transforming a group of basic patterns into a block, displaying patterns or a result of the inspection, and modifying said exposure pattern or said block pattern based on said displayed result of said inspection, wherein said modification comprises the steps of:

interchanging block patterns on said stencil according to operation of an operator; and interchanging arrangement coordinates of instances, in said object exposing pattern, of the interchanged block patterns in correspondence to said interchanging.

21. A method of inspecting object exposing pattern or block patterns, said object exposing pattern including instances of said block patterns, said object exposing pattern being decomposed into basic patterns, said block patterns being arranged on a stencil mask, each block pattern being created by transforming a group of basic patterns into a block, displaying patterns or a result of the inspection, and modifying said exposure pattern or said block pattern based on said displayed result of said inspection, wherein said modification comprises the steps of:

deleting one of said block patterns on said stencil mask according to operation of an operator; and substituting a group of variable-shaped patterns for an instance of the deleted block pattern in said object exposing pattern.

22. A method of inspecting object exposing pattern or block patterns, said object exposing pattern including instances of said block patterns, said object exposing pattern being decomposed into basic patterns, said block patterns being arranged on a stencil mask, each block pattern being created by transforming a group of basic patterns into a block, displaying patterns or a result of the inspection, and modifying said exposure pattern or said block pattern based on said displayed result of said inspection, wherein said modification comprises the steps of:

transforming a group of variable-shaped patterns in said object exposing pattern into a block pattern according to operation of an operator; and adding the transformed block pattern onto said stencil mask.

* * * * *